US012563799B2

(12) United States Patent
Park et al.

(10) Patent No.: US 12,563,799 B2
(45) Date of Patent: Feb. 24, 2026

(54) MULTI-PATTERN SEMICONDUCTOR DEVICE AND METHOD FOR FABRICATING SAME

(71) Applicant: SAMSUNG ELECTRONICS CO., LTD., Suwon-si (KR)

(72) Inventors: Gi Gwan Park, Suwon-si (KR); Jung Gun You, Suwon-si (KR); Sun Jung Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 359 days.

(21) Appl. No.: 18/188,399

(22) Filed: Mar. 22, 2023

(65) Prior Publication Data

US 2024/0038841 A1 Feb. 1, 2024

(30) Foreign Application Priority Data

Aug. 1, 2022 (KR) ........................ 10-2022-0095497

(51) Int. Cl.
| | |
|---|---|
| *H10D 30/00* | (2025.01) |
| *H10D 30/43* | (2025.01) |
| *H10D 30/67* | (2025.01) |
| *H10D 62/10* | (2025.01) |

(52) U.S. Cl.
CPC .......... *H10D 62/121* (2025.01); *H10D 30/43* (2025.01); *H10D 30/6729* (2025.01); *H10D 30/6735* (2025.01)

(58) Field of Classification Search
CPC ......... H01L 23/53266; H01L 23/53257; H01L 23/5226; H01L 23/485; H10D 30/6735; H10D 30/501; H10D 62/121
See application file for complete search history.

(56) References Cited

U.S. PATENT DOCUMENTS

| | | |
|---|---|---|
| 2020/0243844 A1 | 7/2020 | Jang |
| 2020/0350215 A1* | 11/2020 | Zhang .................... H10D 62/40 |
| 2022/0052157 A1 | 2/2022 | Chang et al. |

(Continued)

FOREIGN PATENT DOCUMENTS

KR 10-2022-0053879 A 5/2022

OTHER PUBLICATIONS

European Search Report dated Dec. 8, 2023 for Application Serial No. EP 23 176 855.7.

(Continued)

*Primary Examiner* — Reema Patel

(74) *Attorney, Agent, or Firm* — MORGAN, LEWIS & BOCKIUS LLP

(57) ABSTRACT

There is provided a semiconductor device capable of capable of improving element performance and reliability. A semiconductor device includes a lower conductive pattern disposed on a substrate, an upper conductive pattern disposed on the lower conductive pattern, and a first plug pattern disposed between the lower conductive pattern and the upper conductive pattern and connected to the lower conductive pattern and the upper conductive pattern. The first plug pattern includes a first barrier pattern that defines a first plug recess and a first plug metal pattern that fills the first plug recess, and the first plug metal pattern includes a first molybdenum pattern and a first tungsten pattern disposed on the first molybdenum pattern.

16 Claims, 66 Drawing Sheets

(56)         References Cited

U.S. PATENT DOCUMENTS

| 2022/0069100 A1 | 3/2022 | Hwang et al. |
| 2022/0069129 A1 | 3/2022 | Kim et al. |
| 2022/0069134 A1 | 3/2022 | Kim et al. |
| 2022/0102192 A1 | 3/2022 | Su et al. |
| 2022/0102521 A1 | 3/2022 | Dewey et al. |
| 2022/0122994 A1 | 4/2022 | Kim et al. |
| 2022/0130970 A1 | 4/2022 | Kang et al. |

OTHER PUBLICATIONS

European Office Action dated Dec. 20, 2023 for Application Serial No. EP 23 176 855.7.

1st Office Action issued Nov. 24, 2025 in corresponding Korean Patent Application No. 10-2022-0095497.

* cited by examiner

MULTI-PATTERN SEMICONDUCTOR DEVICE AND METHOD FOR FABRICATING SAME

CROSS-REFERENCE TO RELATED APPLICATION

This application claims priority under 35 U.S.C. 119 from Korean Patent Application No. 10-2022-0095497, filed on Aug. 1, 2022 in the Korean Intellectual Property Office, the contents of which are herein incorporated by reference in their entirety.

TECHNICAL FIELD

Embodiments of the present disclosure are directed to a semiconductor device and a method for fabricating the same.

DISCUSSION OF THE RELATED ART

As one of scaling techniques for increasing the density of semiconductor devices, a multi-gate transistor has been proposed, in which a fin- or nanowire-shaped multi-channel active pattern (or silicon body) is formed on a substrate and a gate is formed on the surface of the multi-channel active pattern.

Since a multi-gate transistor uses a three-dimensional (3D) channel, scaling of the multi-gate transistor can be easily achieved. Further, current control capability can be improved without increasing the gate length of the multi-gate transistor. In addition, a short channel effect (SCE) in which the potential of a channel region is affected by a drain voltage can be effectively suppressed.

However, as a pitch (size) of the semiconductor device decreases, there is a need to decrease capacitance and secure electrical stability between contacts in the semiconductor device.

SUMMARY

Embodiments of the present disclosure provide a semiconductor device with improved element performance and reliability.

Embodiments of the present disclosure also provide a method for fabricating a semiconductor device that increases element performance and reliability.

According to an embodiment of the present disclosure, there is provided a semiconductor device that includes a lower conductive pattern disposed on a substrate, an upper conductive pattern disposed on the lower conductive pattern, and a first plug pattern disposed between the lower conductive pattern and the upper conductive pattern and that is connected to the lower conductive pattern and the upper conductive pattern. The first plug pattern includes a first barrier pattern that defines a first plug recess and a first plug metal pattern that fills the first plug recess, and the first plug metal pattern includes a first molybdenum pattern and a first tungsten pattern disposed on the first molybdenum pattern.

According to another embodiment of the present disclosure, there is provided a semiconductor device that includes a gate structure that includes a gate electrode and a gate capping pattern disposed on an active pattern, where the gate capping pattern is disposed on the gate electrode, a source/drain pattern disposed on at least one side of the gate structure, and a source/drain contact connected to the source/drain pattern and disposed on the source/drain pattern and having a first height. The source/drain contact includes a first molybdenum pattern and a first tungsten pattern disposed on the first molybdenum pattern, and a second height from a lowermost portion of the first molybdenum pattern to a lowermost portion of the first tungsten pattern is greater than or equal to ⅓ of the first height.

According to another embodiment of the present disclosure, there is provided a semiconductor device that includes an active pattern that includes a lower pattern and a sheet pattern disposed on the lower pattern, a gate structure that includes a gate electrode and a gate capping pattern disposed on the active pattern, where the gate electrode surrounds the sheet pattern and the gate capping pattern is disposed on the gate electrode, a source/drain pattern disposed on at least one side of the gate structure, a source/drain contact connected to the source/drain pattern and disposed on the source/drain pattern, and a gate contact that penetrates the gate capping pattern and is connected to the gate electrode. The source/drain contact includes a first molybdenum pattern and a first tungsten pattern disposed on the first molybdenum pattern, and a lowermost portion of the first tungsten pattern is higher than an upper surface of the gate electrode.

According to another embodiment of the present disclosure, there is provided a semiconductor device that includes a gate structure that includes a gate electrode and a gate capping pattern disposed on an active pattern, where the gate capping pattern is disposed on the gate electrode, a source/drain pattern disposed on at least one side of the gate structure, a source/drain contact connected to the source/drain pattern and disposed on the source/drain pattern, a first via plug connected to the source/drain contact and disposed on the source/drain contact, and a first wiring line disposed on the first via plug. the first via plug includes a molybdenum pattern, and a tungsten pattern disposed on the molybdenum pattern, and a height from a lowermost portion of the molybdenum pattern to a lowermost portion of the tungsten pattern is less than or equal to ½ of a height of the first via plug.

According to another embodiment of the present disclosure, there is provided a semiconductor device that includes a lower conductive pattern disposed on a substrate, an upper conductive pattern disposed on the lower conductive pattern, and a molybdenum plug pattern disposed in an interlayer insulating layer that is disposed on the substrate, where the molybdenum plug pattern is connected to the lower conductive pattern and the upper conductive pattern. A sidewall of the molybdenum plug pattern is in contact with the interlayer insulating layer, an upper surface of the molybdenum plug pattern is in contact with the upper conductive pattern, and an upper surface of the molybdenum plug pattern includes a first concave region, a second concave region, and a convex region disposed between the first concave region and the second concave region.

According to another embodiment of the present disclosure, there is provided a method for fabricating a semiconductor device. The method includes forming a lower conductive pattern on a substrate, forming an interlayer insulating layer that includes a plug hole on the lower conductive pattern, where the plug hole exposes the lower conductive pattern, forming a molybdenum layer along a sidewall and a bottom surface of the plug hole and an upper surface of the interlayer insulating layer, forming a first tungsten layer on the molybdenum layer using a first deposition method, where the first tungsten layer fills the plug hole, forming a second tungsten layer on the first tungsten layer using a second deposition method that differs from the first deposition method, and forming a plug pattern by removing the molybdenum layer, the first tungsten layer, and the second tungsten layer from the upper surface of the interlayer insulating layer.

According to another embodiment of the present disclosure, there is provided a method for fabricating a semiconductor device. The method includes forming a lower conductive pattern on a substrate, forming an interlayer insulating layer that includes a plug hole on the lower conductive pattern, where the plug hole exposes the lower conductive pattern, forming a molybdenum layer in contact with the interlayer insulating layer and that entirely fills the plug hole, forming a tungsten layer along an upper surface of the interlayer insulating layer and an upper surface of the molybdenum layer using a physical vapor deposition (PVD) method, and removing a part of the molybdenum layer and the tungsten layer using a chemical mechanical polishing method to form a molybdenum plug pattern.

BRIEF DESCRIPTION OF THE DRAWINGS

FIG. 2 is a cross-sectional view taken along line A-A of FIG. 1.

FIGS. 21 and 22 illustrate a semiconductor device according to some embodiments.

FIGS. 30 and 31 illustrate a semiconductor device according to some embodiments.

FIG. 32 is a diagram illustrating a semiconductor device according to some embodiments;

FIGS. 33 and 34 illustrate a semiconductor device according to some embodiments.

FIGS. 35 to 38 illustrate a semiconductor device according to some embodiments.

FIGS. 41 and 42 illustrate a semiconductor device according to some embodiments.

FIGS. 47 and 48 illustrating a semiconductor device according to some embodiments.

DETAILED DESCRIPTION

The drawings of a semiconductor device according to some embodiments illustrate, for example, a fin-shaped transistor (FinFET) that includes a channel region of a fin-shaped pattern, a transistor that includes a nanowire or a nanosheet, and a multi-bridge channel field effect transistor (MBCFET™), but embodiments of the present disclosure are not necessarily limited thereto. A semiconductor device according to some embodiments may include a tunneling field effect transistor (TFET) or a three-dimensional (3D) transistor. A semiconductor device according to some embodiments may also include a planar transistor. In addition, embodiments of the present disclosure can be applied to transistors based on two-dimensional materials (2D material based FETs) and heterostructures thereof.

Further, a semiconductor device according to some embodiments may include a bipolar junction transistor, a lateral double diffusion MOS (LDMOS) transistor, etc.

A semiconductor device according to some embodiments will be described with reference to FIGS. 1 to 5B.

Figure 1:
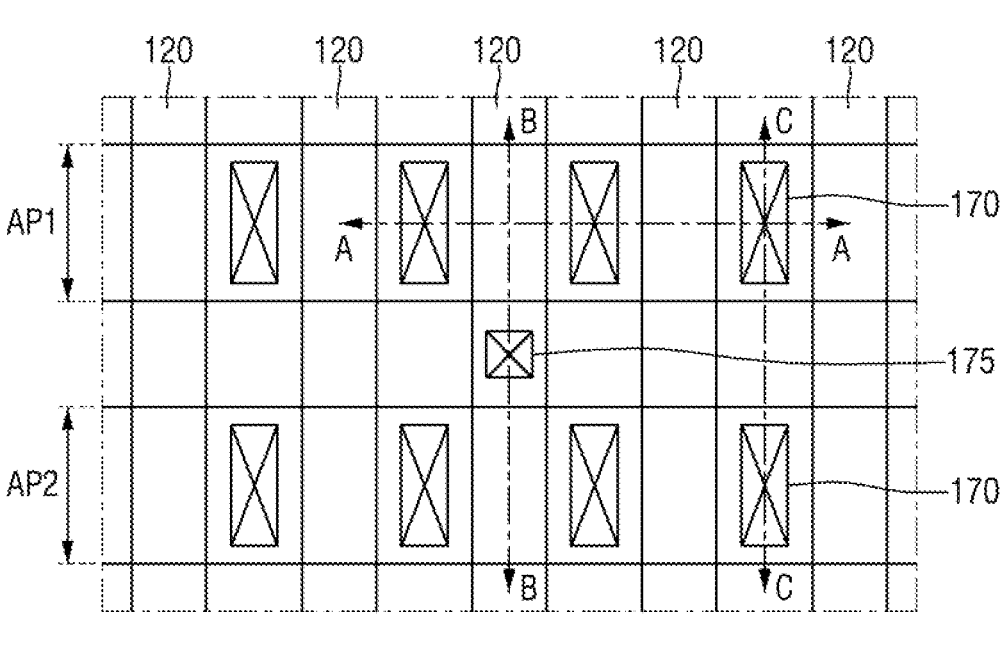
FIG. 1 is a layout diagram of a semiconductor device according to some embodiments.
Figure 1:
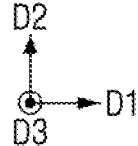
Figure 2:
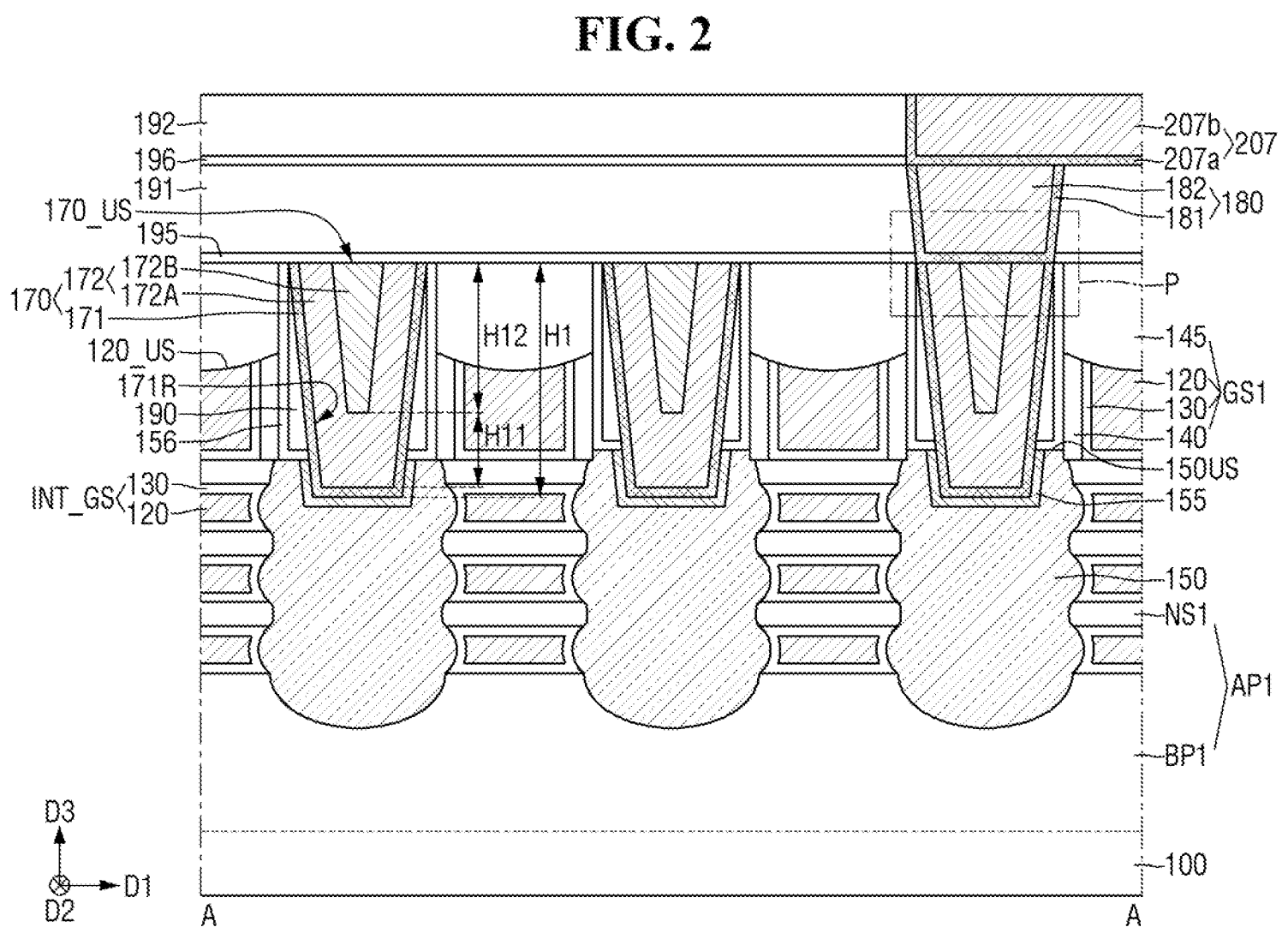
Figure 3:
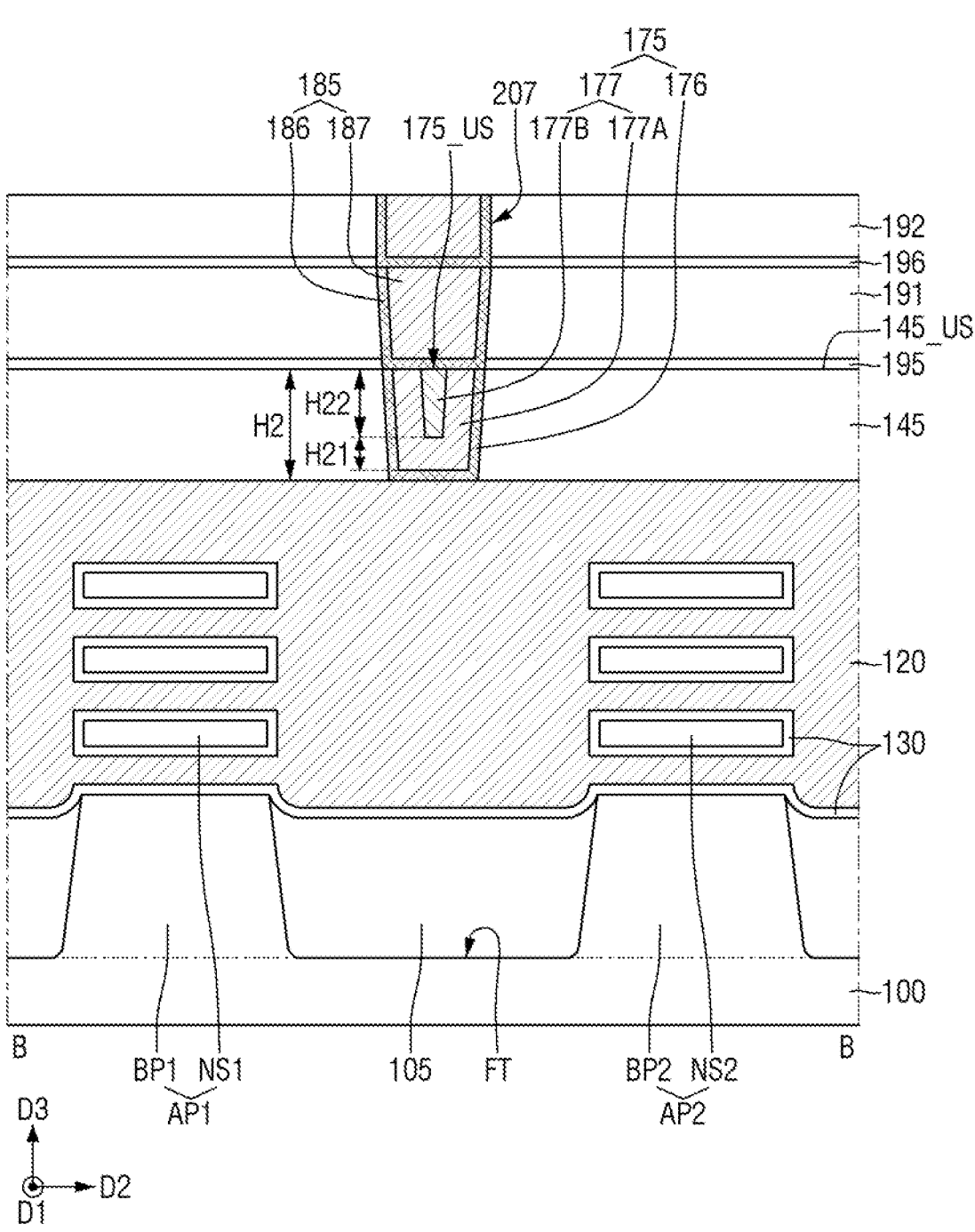
FIG. 3 is a cross-sectional view taken along line B-B of FIG. 1.
Figure 4:
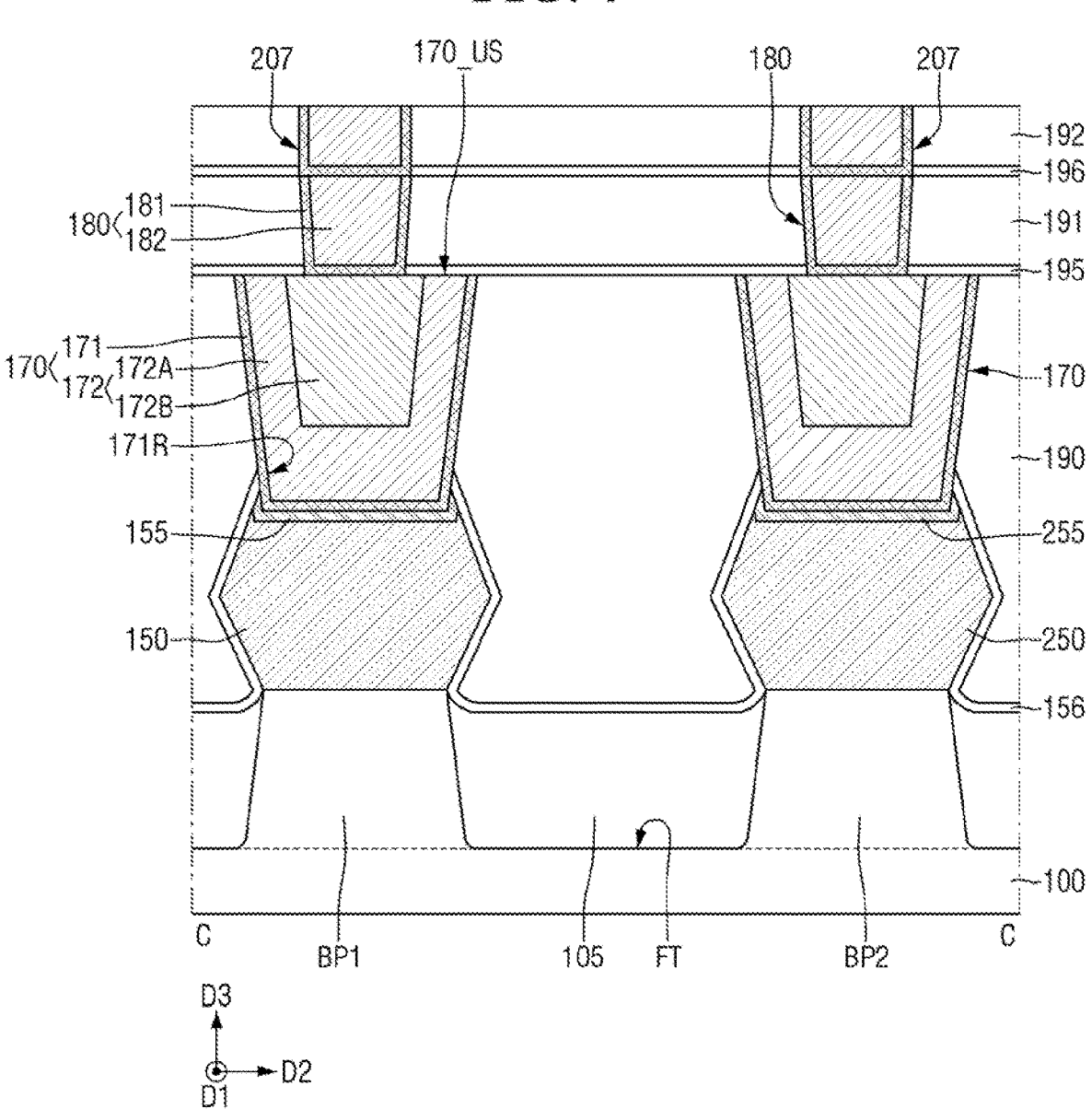
FIG. 4 is a cross-sectional view taken along line C-C of FIG. 1.
Figure 5A:
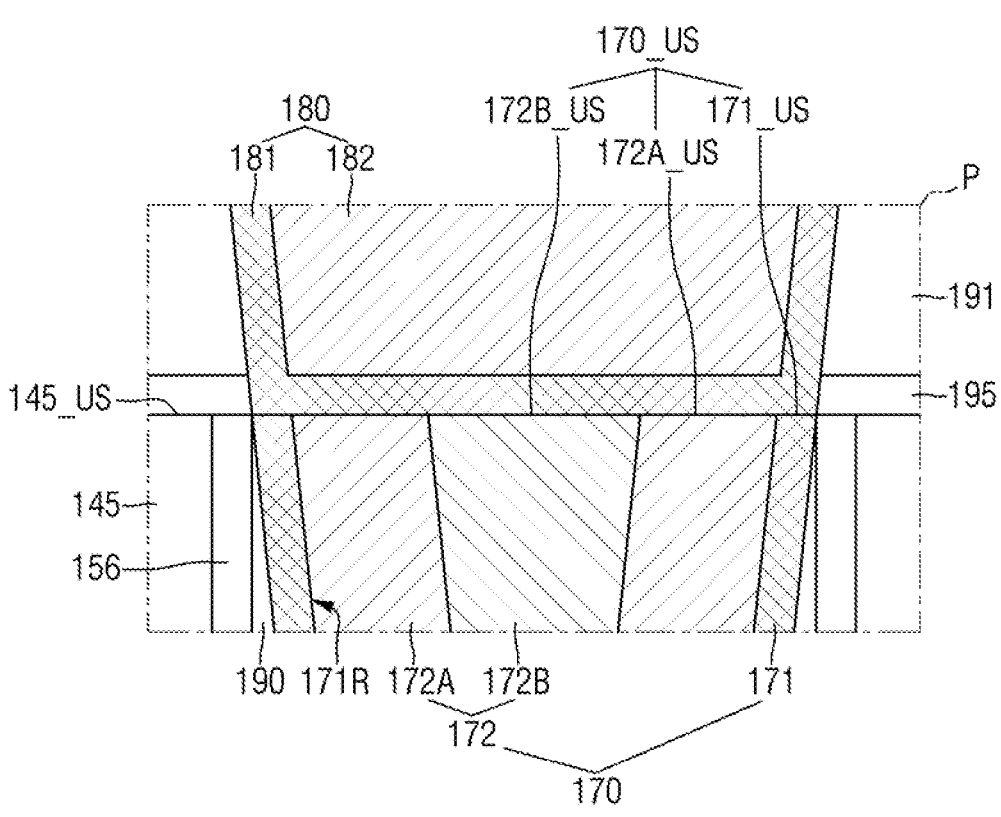
FIGS. 5A and 5B are enlarged views of part P of FIG. 2.
Figure 5B:
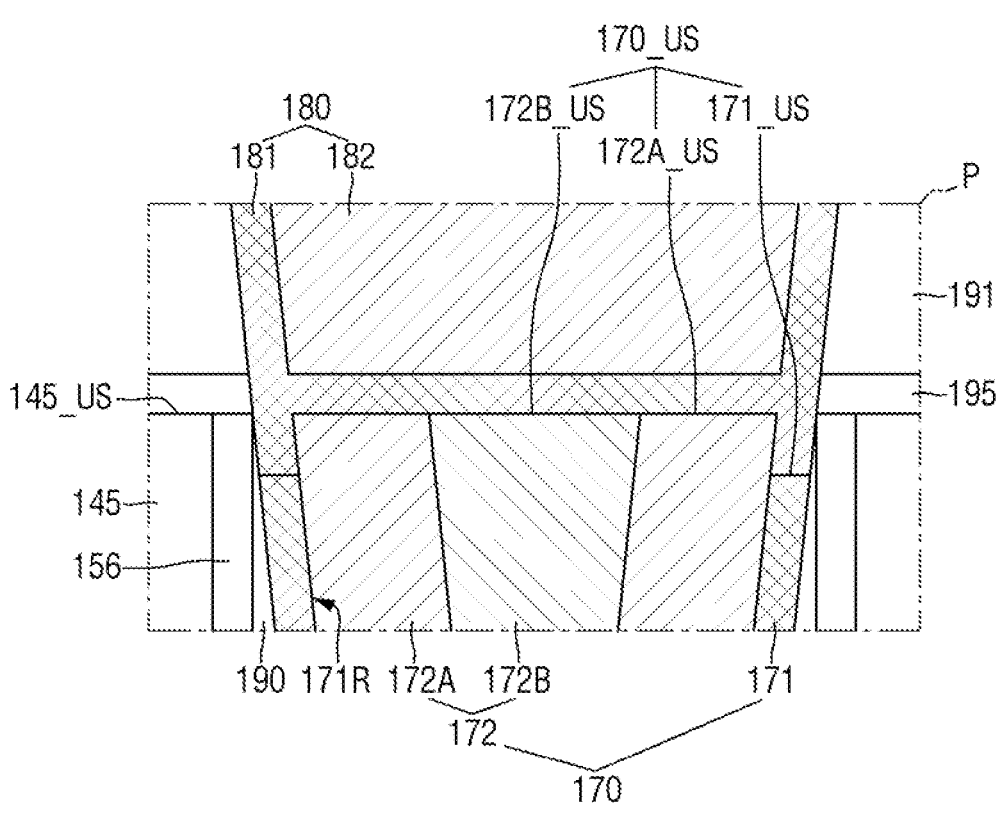

FIG. 1 is a layout diagram of a semiconductor device according to some embodiments. FIG. 2 is a cross-sectional view taken along line A-A of FIG. 1. FIG. 3 is a cross-sectional view taken along line B-B of FIG. 1. FIG. 4 is a cross-sectional view taken along line C-C of FIG. 1. FIGS. 5A and 5B are enlarged views of part P of FIG. 2.

For simplicity of description, a source/drain via plug 180, a gate via plug 185, and a first wiring line 207 are not illustrated in FIG. 1. In addition, although FIG. 1 illustrates that a gate contact 175 is disposed on one of a plurality of first gate electrodes 120, this is for illustrative purposes only, and embodiments of the present disclosure are not necessarily limited thereto.

Referring to FIGS. 1 to 5B, a semiconductor device according to some embodiments includes a first active pattern AP1, a second active pattern AP2, at least one first gate electrode 120, a source/drain contact 170, the gate contact 175, the source/drain via plug 180, the gate via plug 185, and the first wiring line 207.

The substrate 100 may be a bulk silicon or silicon-on-insulator (SOI) substrate. Alternatively, the substrate 100 may be a silicon substrate, or may include other materials, such as silicon germanium, silicon germanium on insulator (SGOI), indium antimonide, a lead tellurium compound, indium arsenide, indium phosphide, gallium arsenide, or gallium antimonide, but is not necessarily limited thereto.

The first active pattern AP1 and the second active pattern AP2 are disposed on the substrate 100. Each of the first active pattern AP1 and the second active pattern AP2 is elongated in a first direction D1. The first active pattern AP1 and the second active pattern AP2 are spaced apart in a second direction D2. For example, the first direction D1 is a direction that crosses the second direction D2.

For example, one of the first active pattern AP1 and the second active pattern AP2 is a PMOS forming region, and the other one is an NMOS forming region. For another example, the first active pattern AP1 and the second active pattern AP2 are disposed in a NMOS formation region. For another example, the first active pattern AP1 and the second active pattern AP2 are disposed in a PMOS formation region.

For example, the first active pattern AP1 and the second active pattern AP2 are disposed in a logic region. For another example, the first active pattern AP1 and the second active pattern AP2 are disposed in a SRAM region. For another example, the first active pattern AP1 and the second active pattern AP2 are disposed in an I/O region.

Each of the first active pattern AP1 and the second active pattern AP2 is, for example, a multi-channel active pattern. The first active pattern AP1 includes a first lower pattern BP1 and a plurality of first sheet patterns NS1. The second active pattern AP2 includes a second lower pattern BP2 and a plurality of second sheet patterns NS2.

The first lower pattern BP1 and the second lower pattern BP2 each protrudes from the substrate 100. The first lower pattern BP1 and the second lower pattern BP2 each extends in the first direction D1.

The first lower pattern BP1 is spaced apart from the second lower pattern BP2 in the second direction D2. The first lower pattern BP1 and the second lower pattern BP2 are separated by a fin trench FT that extends in the first direction D1.

The plurality of first sheet patterns NS1 are disposed on the upper surface of the first lower pattern BP1. The plurality of first sheet patterns NS1 are spaced apart from the first lower pattern BP1 in a third direction D3. The first sheet patterns NS1 are spaced apart from each other in the third direction D3. The third direction D3 intersects the first direction D1 and the second direction D2. For example, the third direction D3 is a thickness direction of the substrate 100.

The plurality of second sheet patterns NS2 are disposed on the upper surface of the second lower pattern BP2. The plurality of second sheet patterns NS2 are spaced apart from the second lower pattern BP2 in the third direction D3. The second sheet patterns NS2 are spaced apart from each other in the third direction D3.

Although three first sheet patterns NS1 and three second sheet patterns NS2 are shown to be arranged in the third direction D3, this is for simplicity of description and embodiments of the present disclosure are not necessarily limited thereto.

Each of the first lower pattern BP1 and the second lower pattern BP2 can be formed by etching a portion of the substrate 100, or includes an epitaxial layer grown from the substrate 100. Each of the first lower pattern BP1 and the second lower pattern BP2 includes silicon or germanium, which is an elemental semiconductor material. The first lower pattern BP1 and the second lower pattern BP2 may include a compound semiconductor, such as a group IV-IV compound semiconductor or a group III-V compound semiconductor.

The group IV-IV compound semiconductor may be a binary compound or a ternary compound that includes at least two of carbon (C), silicon (Si), germanium (Ge) or tin (Sn), or the above-mentioned compound doped with a group IV element.

The group III-V compound semiconductor may be, for example, a binary compound, a ternary compound or a quaternary compound formed by combining at least one of aluminum (Al), gallium (Ga) or indium (In), which are group III elements, with one of phosphorus (P), arsenic (As) or antimony (Sb), which are group V elements.

Each of the first sheet pattern NS1 and the second sheet pattern NS2 includes one of silicon or germanium as an elemental semiconductor material, a group IV-IV compound semiconductor, and/or a group III-V compound semiconductor. The first sheet pattern NS1 may include the same material as the first lower pattern BP1, or may include a different material from the first lower pattern BP1. Likewise, the second sheet pattern NS2 may include the same material as the second lower pattern BP2, or may include a different material from the second lower pattern BP2.

In a semiconductor device according to some embodiments, the first lower pattern BP1 and the second lower pattern BP2 are silicon lower patterns that include silicon, and the first sheet pattern NS1 and the second sheet pattern NS2 are silicon sheet patterns that include silicon.

For example, the width of the first sheet pattern NS1 in the second direction D2 may increase or decrease in proportion to the width of the first lower pattern BP1 in the second direction D2. For example, although FIG. 3 illustrates that the widths in the second direction D2 of the stacked first sheet patterns NS1 are the same, this is for simplicity of description, and embodiments of the present disclosure are not necessarily limited thereto. For example, the width in the second direction D2 of the stacked first sheet patterns NS1 decreases with increasing distance from the first lower pattern BP1.

A field insulating layer 105 is formed on the substrate 100. The field insulating layer 105 fills at least a portion of the fin trench FT.

The field insulating layer 105 is disposed on the sidewall of the first lower pattern BP1 and the sidewall of the second lower pattern BP2. The field insulating layer 105 is not disposed on the upper surface of the first lower pattern BP1 or the upper surface of the second lower pattern BP2.

For example, the field insulating layer 105 covers the entire sidewall of the first lower pattern BP1. For another example, the field insulating layer 105 covers a part of the sidewall of the first lower pattern BP1 and/or a part of the sidewall of the second lower pattern BP2. For example, considering the first lower pattern BP1, a part of the first lower pattern BP1 protrudes in the third direction D3 above the upper surface of the field insulating layer 105.

Each of the first sheet patterns NS1 and each of the second sheet patterns NS2 are disposed higher than the upper surface of the field insulating layer 105. The field insulating layer 105 includes, for example, at least one of an oxide layer, a nitride layer, an oxynitride layer, or a combination layer thereof. Although the figures illustrate the field insulating layer 105 as being a single layer, this is for simplicity of description, and embodiments of the present disclosure are not necessarily limited thereto.

At least one gate structure GS1 is disposed on the substrate 100. For example, at least one gate structure GS1 is disposed on the field insulating layer 105. The gate structure GS1 extends in the second direction D2. Adjacent gate structures GS1 are spaced apart in the first direction D1. The gate structure GS1 is disposed on the first active pattern AP1 and the second active pattern AP2. The gate structure GS1 intersects the first active pattern AP1 and the second active pattern AP2.

Although the figures show that the gate structure GS1 is disposed over the first active pattern AP1 and the second active pattern AP2, this is for convenience of description, and embodiments are not necessarily limited thereto. For example, the gate structure GS1 may be separated into two parts and disposed on the first active pattern AP1 and the second active pattern AP2.

The gate structure GS1 intersects the first lower pattern BP1 and the second lower pattern BP2. The gate structure GS1 surrounds the first sheet pattern NS1 and the second sheet pattern NS2. gate structure GS1 includes the first gate electrode 120, a first gate insulating layer 130, a first gate spacer 140, and a gate capping pattern 145.

The gate structure GS1 includes an inner gate structure INT_GS disposed between the first sheet patterns NS1 adjacent in the third direction D3 and between the first lower pattern BP1 and the first sheet pattern NS1. The inner gate structure INT_GS includes a first gate electrode 120 and a first gate insulating layer 130 disposed between adjacent first sheet patterns NS1 and between the first lower pattern BP1 and the first sheet pattern NS1. In addition, the inner gate structure INT_GS is disposed between second sheet patterns NS2 adjacent in the third direction D3 and between the second lower pattern BP2 and the second sheet pattern NS2.

The first gate electrode 120 is disposed on the first lower pattern BP1 and the second lower pattern BP2. The first gate electrode 120 intersects the first lower pattern BP1 and the second lower pattern BP2. The first gate electrode 120 surrounds the first sheet pattern NS1. The first gate electrode 120 surrounds the second sheet pattern NS2.

An upper surface 120_US of the first gate electrode has a concave curved surface recessed toward the upper surface of the first active pattern AP1, but is not necessarily limited thereto. For example, the upper surface 120_US of the first gate electrode may be a flat plane. For example, the upper surface of the first active pattern AP1 may be the upper surface of the uppermost first sheet pattern NS1.

The first gate electrode 120 includes at least one of a metal, a metal alloy, a conductive metal nitride, a metal silicide, a doped semiconductor material, a conductive metal carbonitride, a conductive metal carbide, a conductive metal oxide, or a conductive metal oxynitride. The first gate electrode 120 includes, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlCN), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Jr), osmium (Os), silver (Ag), gold (Au), zinc (Zn), vanadium (V) or a combination thereof. The conductive metal oxide and the conductive metal oxynitride may include a form in which the above-mentioned material is oxidized, but are not necessarily limited thereto.

The first gate electrodes 120 are disposed on both sides of a first source/drain pattern 150 to be described below. The gate structures GS1 are disposed on both sides of the first source/drain pattern 150 in the first direction D1.

For example, the first gate electrodes 120 disposed on both sides of the first source/drain pattern 150 are normal gate electrodes used as gates of transistors. For another example, the first gate electrode 120 disposed on one side of the first source/drain pattern 150 is a gate of a transistor, whereas the first gate electrode 120 disposed on the other side of the first source/drain pattern 150 is a dummy gate electrode.

In addition, the first gate electrodes 120 are disposed on both sides of a second source/drain pattern 250 to be described below. The gate structures GS1 are disposed on both sides of the second source/drain pattern 250 in the first direction D1.

The first gate insulating layer 130 extends along the upper surface of the field insulating layer 105, the upper surface of the first lower pattern BP1, and the upper surface of the second lower pattern BP2. The first gate insulating layer 130 surrounds the first sheet pattern NS1. The first gate insulating layer 130 surrounds the second sheet pattern NS2. The first gate insulating layer 130 is disposed along the circumference of the first sheet pattern NS1 and the circumference of the second sheet pattern NS2. The first gate electrode 120 is disposed on the first gate insulating layer 130. The first gate insulating layer 130 is disposed between the first gate electrode 120 and the first sheet pattern NS1, and between the first gate electrode 120 and the second sheet pattern NS2.

The first gate insulating layer 130 includes at least one of silicon oxide, silicon oxynitride, silicon nitride, or a high-k material that has a higher dielectric constant than silicon oxide. The high-k material includes, for example, at least one of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

Although the figures show that the first gate insulating layer 130 is a single layer, it is for simplicity of description, and embodiments of the present disclosure are not necessarily limited thereto. In some embodiments, the first gate insulating layer 130 includes a plurality of layers. The first gate insulating layer 130 includes an interfacial layer and a high-k insulating layer disposed between the first sheet pattern NS1 and the first gate electrode 120 and between the second sheet pattern NS2 and the first gate electrode 120.

A semiconductor device according to some embodiments includes a negative capacitor (NC) FET that uses a negative capacitor (NC). For example, the first gate insulating layer 130 includes a ferroelectric material layer that has ferroelectric properties and a paraelectric material layer that has paraelectric properties.

The ferroelectric material layer has a negative capacitance, and the paraelectric material layer has a positive capacitance. For example, when two or more capacitors are connected in series and the capacitance of each capacitor has a positive value, the total capacitance is less than the capacitance of each capacitor. On the other hand, when at least one of the capacitances of two or more series-connected capacitors has a negative value, the total capacitance is positive and greater than the absolute value of each capacitance.

When a ferroelectric material layer that has a negative capacitance and a paraelectric material layer that has a positive capacitance are connected in series, the total capacitance value of the ferroelectric material layer and the paraelectric material layer connected in series increases. By using the principle that the total capacitance value is increased, a transistor that includes a ferroelectric material layer has a subthreshold swing (SS) less than or equal to a threshold voltage that is less than 60 mV/decade at room temperature.

A ferroelectric material layer has ferroelectric properties. The ferroelectric material layer includes, for example, at least one of hafnium oxide, hafnium zirconium oxide, barium strontium titanium oxide, barium titanium oxide, or lead zirconium titanium oxide. For example, the hafnium zirconium oxide contains hafnium oxide doped with zirconium (Zr). For another example, the hafnium zirconium oxide is a compound of hafnium (Hf), zirconium (Zr), and oxygen (O).

The ferroelectric material layer further includes a dopant. For example, the dopant include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of dopant in the ferroelectric material layer varies depending on which ferroelectric material is in the ferroelectric material layer.

When the ferroelectric material layer includes hafnium oxide, the dopant in the ferroelectric material layer includes, for example, at least one of gadolinium (Gd), silicon (Si), zirconium (Zr), aluminum (Al), or yttrium (Y).

When the dopant is aluminum (Al), the ferroelectric material layer includes 3 to 8 atomic percent (at %) of aluminum. For example, the ratio of the dopant is a ratio of aluminum to the sum of hafnium and aluminum.

When the dopant is silicon (Si), the ferroelectric material layer includes 2 to 10 at % of silicon. When the dopant is yttrium (Y), the ferroelectric material layer includes 2 to 10 at % of yttrium. When the dopant is gadolinium (Gd), the ferroelectric material layer includes 1 to 7 at % of gadolinium. When the dopant is zirconium (Zr), the ferroelectric material layer includes 50 to 80 at % of zirconium.

The paraelectric material layer has paraelectric properties. The paraelectric material layer includes, for example, at least one of silicon oxide or a metal oxide that has a high dielectric constant. The metal oxide includes, for example, at least one of hafnium oxide, zirconium oxide, or aluminum oxide, but is not necessarily limited thereto.

The ferroelectric material layer and the paraelectric material layer may include the same material. The ferroelectric material layer has ferroelectric properties, but the paraelectric material layer does not have ferroelectric properties. For example, when the ferroelectric material layer and the paraelectric material layer include hafnium oxide, the crystal structure of the hafnium oxide in the ferroelectric material layer differs from the crystal structure of the hafnium oxide in the paraelectric material layer.

The ferroelectric material layer has a thickness that exhibits ferroelectric properties. The thickness of the ferroelectric material layer is, for example, in a range of 0.5 nm to 10 nm, but is not necessarily limited thereto. Since a critical thickness at which each ferroelectric material exhibits ferroelectric properties differs, the thickness of the ferroelectric material layer varies depending on the ferroelectric material.

For example, the first gate insulating layer 130 includes one ferroelectric material layer. For another example, the first gate insulating layer 130 includes a plurality of ferroelectric material layers spaced apart from each other. The first gate insulating layer 130 has a laminated layer structure in which a plurality of ferroelectric material layers and a plurality of paraelectric material layers are alternately laminated.

A first gate spacer 140 is disposed on the sidewall of the first gate electrode 120. The first gate spacer 140 extends in the second direction D2.

For example, the first gate spacer 140 is not disposed between first sheet patterns NS1 adjacent in the third direction D3 and between the first sheet pattern NS1 and the first lower pattern BP1. The first gate spacer 140 includes only an outer spacer.

The first gate spacer 140 includes, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC) or a combination thereof.

In addition, in an example, a cross-sectional view taken along the second active pattern AP2 in FIG. 1 is similar to FIG. 2. For another example, a cross-sectional view taken along the second active pattern AP2 in FIG. 1 is similar to one of FIG. 47 or 48 to be described below.

A gate capping pattern 145 is disposed on the upper surface 120_US of the first gate electrode and the upper surface of the first gate spacer 140. A upper surface 145_US of the gate capping pattern is coplanar with the upper surface of a first interlayer insulating layer 190. In addition, the gate capping pattern 145 may be disposed between the first gate spacers 140.

The gate capping pattern 145 includes, for example, at least one of silicon nitride (SiN), silicon oxynitride (SiON), silicon oxide (SiO$_2$), silicon carbonitride (SiCN), silicon oxycarbonitride (SiOCN), or a combination thereof. The gate capping pattern 145 includes, for example, a material having an etch selectivity with respect to the first interlayer insulating layer 190.

The first source/drain pattern 150 is disposed on the substrate 100. The first source/drain pattern 150 is disposed on the first lower pattern BP1. The first source/drain pattern 150 is in contact with the first lower pattern BP1 and the first sheet pattern NS1. For example, the first source/drain pattern 150 is in contact with the first gate insulating layer 130 of the inner gate structure INT_GS.

The first source/drain pattern 150 is disposed between the gate structures GS1. The first source/drain pattern 150 is disposed on at least one side of the gate structure GS1. The first source/drain pattern 150 is disposed on the side surface of the first gate electrode 120. For example, the first source/drain patterns 150 is disposed on both sides of the gate structure GS1. However, the first source/drain pattern 150 may be disposed on one side of the gate structure GS1 and not on the other side of the gate structure GS1.

The second source/drain pattern 250 is disposed on the substrate 100. The second source/drain pattern 250 is disposed on the second lower pattern BP2. In addition, a shape of the second source/drain pattern 250 disposed on the second lower pattern BP2 is similar to a shape of the first source/drain pattern 150, as shown in FIG. 2.

For example, the first source/drain pattern 150 includes a plurality of width extension regions. In FIG. 2, the outer wall of the first source/drain pattern 150 has a wavy shape. In the width extension region, the width of the first source/drain pattern 150 in the first direction D1 increases and then decreases with increasing distance from the first lower pattern BP1. The width extension region of the first source/drain pattern 150 is located between first sheet patterns NS1 adjacent in the third direction D3. The width extension region of the first source/drain pattern 150 is located between the first lower pattern BP1 and the first sheet pattern NS1. In each width extension region of the first source/drain pattern 150, a point at which the width of the first source/drain pattern 150 is maximum is positioned between the first sheet pattern NS1 and the first lower pattern BP1 or between the first sheet patterns NS1 adjacent in the third direction D3.

The first source/drain pattern 150 is included in a source/drain of a transistor that uses the first active pattern AP1, such as the first sheet pattern NS1, as a channel region. The second source/drain pattern 250 is included in a source/drain of a transistor that uses the second sheet pattern NS2 as a channel region.

Each of the first source/drain pattern 150 and the second source/drain pattern 250 includes an epitaxial pattern. The first source/drain pattern 150 and the second source/drain pattern 250 include, for example, a semiconductor material.

The first source/drain pattern 150 and the second source/drain pattern 250 include n-type impurities or p-type impurities. The first source/drain pattern 150 and the second source/drain pattern 250 are conductive patterns.

In cross-sectional view, an upper surface 150US of the first source/drain pattern is higher than the upper surface of the first active pattern AP1, but embodiments of the present disclosure are not necessarily limited thereto.

A source/drain etch stop layer 156 is disposed on the upper surface of the field insulating layer 105, the sidewall of the gate structure GS1, the upper surface 150US of the first source/drain pattern, the sidewall of the first source/drain pattern 150, the upper surface of the second source/drain pattern 250, and the sidewall of the second source/drain pattern 250.

The source/drain etching stop layer 156 includes a material that has an etching selectivity with respect to the first interlayer insulating layer 190 to be described below. The source/drain etch stop layer 156 includes, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), or a combination thereof. However, in some embodiments, no source/drain etch stop layer 156 is formed.

The first interlayer insulating layer 190 is formed on the field insulating layer 105. The first interlayer insulating layer 190 is disposed on the first source/drain pattern 150 and the second source/drain pattern 250. The first interlayer insulating layer 190 does not cover the upper surface 145_US of the gate capping pattern.

The first interlayer insulating layer 190 includes, for example, at least one of silicon oxide, silicon nitride, silicon oxynitride, or a low-k material. The low-k material includes, for example, at least one of fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), tonen silazene (TOSZ), fluoride silicate glass (FSG), polyimide nanofoams such as polypropylene oxide, carbon doped silicon oxide (CDO), organo silicate glass (OSG), SILK, amorphous fluorinated carbon, silica aerogels, silica xerogels, mesoporous silica, or a combination thereof, but is not necessarily limited thereto.

A source/drain contact 170 is disposed on the first active pattern AP1 and the second active pattern AP2. The source/drain contact 170 is disposed on the first source/drain pattern 150. The source/drain contact 170 is connected to the first source/drain pattern 150 on the first active pattern AP1. The source/drain contact 170 extends in the third direction D3 along the sidewall of the first gate electrode 120. Based on the lowermost portion of the first source/drain pattern 150, the lowermost portion of the source/drain contact 170 is lower than the upper surface 120_US of the first gate electrode. The lowermost portion of the source/drain contact 170 is lower than the upper surface 150US of the first source/drain pattern.

Further, the source/drain contact 170 is disposed on the second source/drain pattern 250. The source/drain contact 170 is connected to the second source/drain pattern 250 on the second active pattern AP2.

However, in an embodiment, a part of the source/drain contact 170 connected to the first source/drain pattern 150 is directly connected to the source/drain contact 170 connected to the second source/drain pattern 250. For example, in a semiconductor device according to some embodiments, at least one source/drain contact 170 is disposed over the first active pattern AP1 and the second active pattern AP2.

The source/drain contact 170 is disposed in the first interlayer insulating layer 190. The source/drain contact 170 is surrounded by the first interlayer insulating layer 190. The source/drain contact 170 penetrates through the source/drain etch stop layer 156.

A first contact silicide layer 155 is formed between the source/drain contact 170 and the first source/drain pattern 150. A second contact silicide layer 255 is formed between the source/drain contact 170 and the second source/drain pattern 250. The figures show that the contact silicide layers 155 and 255 are formed along a profile of a boundary surface between the first source/drain pattern 150 and the source/drain contact 170, and along a profile of a boundary surface between the second source/drain pattern 250 and the source/drain contact 170, but embodiments of the present disclosure are not necessarily limited thereto. The first contact silicide layer 155 and the second contact silicide layer 255 include, for example, a metal silicide material.

For example, the first source/drain pattern 150 and the second source/drain pattern 250 are lower conductive patterns. The source/drain contact 170 is a plug pattern connected to the first source/drain pattern 150 and the second source/drain pattern 250. A first wiring line 207 and/or the source/drain via plug 180, which will be described below, are upper conductive patterns.

The gate contact 175 is disposed in the gate structure GS1. The gate contact 175 penetrates the gate capping pattern 145 and is connected to the first gate electrode 120. For example, the gate contact 175 is surrounded by the gate capping pattern 145.

The gate contact 175 overlaps the gate structure GS1. FIG. 1 shows that the gate contact 175 does not overlap the first active pattern AP1 or the second active pattern AP2, but embodiments are not necessarily limited thereto. In some embodiments, the gate contact 175 is disposed at a position that overlaps at least one of the first active pattern AP1 or the second active pattern AP2.

The first gate electrode 120 is a lower conductive pattern. The gate contact 175 is a plug pattern connected to the first gate electrode 120. The first wiring line 207 and/or the gate via plug 185, which will be described below, are upper conductive patterns.

The source/drain contact 170 includes a first contact barrier pattern 171 and a first contact plug metal pattern 172. The first contact barrier pattern 171 defines a plug recess 171R. The first contact plug metal pattern 172 is disposed on the first contact barrier pattern 171. The first contact plug metal pattern 172 fills the plug recess 171R. For example, the first contact barrier pattern 171 is in contact with the first contact silicide layer 155 and the first contact plug metal pattern 172.

The first contact plug metal pattern 172 includes a first contact molybdenum pattern 172A and a first contact tungsten pattern 172B. The first contact tungsten pattern 172B is disposed on the first contact molybdenum pattern 172A. The first contact molybdenum pattern 172A is disposed between the first contact barrier pattern 171 and the first contact tungsten pattern 172B. For example, the first contact molybdenum pattern 172A is in contact with the first contact barrier pattern 171. The first contact molybdenum pattern 172A is in contact with the first contact tungsten pattern 172B. In a semiconductor device according to some embodiments, the first contact molybdenum pattern 172A includes a bottom portion and a sidewall portion. The sidewall portion of the first contact molybdenum pattern 172A protrudes from the bottom portion of the first contact molybdenum pattern 172A and extends in the third direction D3. For example, the sidewall portion of the first contact molybdenum pattern 172A surrounds the sidewall of the first contact tungsten pattern 172B.

The gate contact 175 includes a second contact barrier pattern 176 and a second contact plug metal pattern 177. The second contact plug metal pattern 177 is disposed on the second contact barrier pattern 176. The second contact plug metal pattern 177 fills a plug recess defined by the second contact barrier pattern 176. For example, the second contact barrier pattern 176 is in contact with the first gate electrode 120 and the second contact plug metal pattern 177.

The second contact plug metal pattern 177 includes a second contact molybdenum pattern 177A and a second contact tungsten pattern 177B. The second contact tungsten pattern 177B is disposed on the second contact molybdenum pattern 177A. The second contact molybdenum pattern 177A is disposed between the second contact barrier pattern 176 and the second contact tungsten pattern 177B. For example, the second contact molybdenum pattern 177A is in contact with the second contact barrier pattern 176. The second contact molybdenum pattern 177A is in contact with the second contact tungsten pattern 177B. In a semiconductor device according to some embodiments, the second contact molybdenum pattern 177A includes a bottom portion and a sidewall portion. The sidewall portion of the second contact molybdenum pattern 177A protrudes from the bottom portion of the second contact molybdenum pattern 177A and extends in the third direction D3. For example, the sidewall portion of the second contact molybdenum pattern 177A surrounds the sidewall of the second contact tungsten pattern 177B.

Each of the first contact barrier pattern 171 and the second contact barrier pattern 176 includes, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Jr), or rhodium (Rh). Each of the first contact barrier pattern 171 and the second contact barrier pattern 176 is illustrated as a single layer, but embodiments are not necessarily limited thereto. In some embodiments, each of the first contact barrier pattern 171 and the second contact barrier pattern 176 includes a plurality of layers.

The first contact molybdenum pattern 172A and the second contact molybdenum pattern 177A include molybdenum (Mo). The first contact molybdenum pattern 172A and the second contact molybdenum pattern 177A are molybdenum layers. For example, a molybdenum layer contains impurities as well as a layer made of only molybdenum. The first contact tungsten pattern 172B and the second contact tungsten pattern 177B include tungsten (W). The first contact tungsten pattern 172B and the second contact tungsten pattern 177B are tungsten layers.

In FIG. 2, a height H1 of the source/drain contact 170 is measured from the lowermost portion of the source/drain contact 170 to an upper surface 170_US of the source/drain contact. For example, a height H11 of the first contact molybdenum pattern 172A is measured from the lowermost portion of the first contact molybdenum pattern 172A to the lowermost portion of the first contact tungsten pattern 172B. A height H12 of the first contact tungsten pattern 172B is measured from the lowermost portion of the first contact tungsten pattern 172B to the upper surface 170_US of the source/drain contact.

For example, a thickness H1-H11-H12 of the first contact barrier pattern 171 is less than ⅒ of the height H1 of the source/drain contact 170. A height H11+H12 of the first contact plug metal pattern 172 is greater than or equal to 9/10 of the height H1 of the source/drain contact 170. The height H11 of the first contact molybdenum pattern 172A is greater than or equal to three times the thickness H1-H11-H12 of the first contact barrier pattern 171.

The volume of the first contact molybdenum pattern 172A is greater than or equal to the volume of the first contact tungsten pattern 172B. For example, when the first contact molybdenum pattern 172A includes the sidewall portion of the first contact molybdenum pattern 172A, the height H11 of the first contact molybdenum pattern 172A is greater than or equal to ⅓ of the height H1 of the source/drain contact 170. The height H12 of the first contact tungsten pattern 172B is less than or equal to ⅔ of the height H1 of the source/drain contact 170.

In a semiconductor device according to some embodiments, based on the upper surface of the first active pattern AP1, the upper surface 120_US of the first gate electrode is higher than the lowermost portion of the first contact tungsten pattern 172B.

In FIG. 3, a height H2 of the gate contact 175 is measured from the lowermost portion of the gate contact 175 to an upper surface 175_US of the gate contact. A height H21 of the second contact molybdenum pattern 177A is measured from the lowermost portion of the second contact molybdenum pattern 177A to the lowermost portion of the second contact tungsten pattern 177B. A height H22 of the second contact tungsten pattern 177B is measured from the lowermost portion of the second contact tungsten pattern 177B to the upper surface 175_US of the gate contact.

For example, a thickness H2-H21-H22 of the second contact barrier pattern 176 is less than ⅒ of the height H2 of the gate contact 175. A height H21+H22 of the second contact plug metal pattern 177 is greater than or equal to 9/10 of the height H2 of the gate contact 175. The height H21 of the second contact molybdenum pattern 177A is greater than or equal to three times the thickness H2-H21-H22 of the second contact barrier pattern 176.

The volume of the second contact molybdenum pattern 177A is greater than or equal to the volume of the second contact tungsten pattern 177B. For example, when the second contact molybdenum pattern 177A includes the sidewall portion of the second contact molybdenum pattern 177A, the height H21 of the second contact molybdenum pattern 177A is greater than or equal to ⅓ of the height H2 of the gate contact 175. The height H22 of the second contact tungsten pattern 177B is less than or equal to ⅔ of the height H2 of the gate contact 175.

For example, an upper surface 170_US of the source/drain contact is defined by the first contact barrier pattern 171 and the first contact plug metal pattern 172. The upper surface 170_US of the source/drain contact is defined by the first contact barrier pattern 171, the first contact molybdenum pattern 172A, and the first contact tungsten pattern 172B. The upper surface 170_US of the source/drain contact includes an upper surface 171_US of the first contact barrier pattern, an upper surface 172A_US of the first contact molybdenum pattern, and an upper surface 172B_US of the first contact tungsten pattern. The first contact barrier pattern 171 includes a sidewall portion that extends along the sidewall of the first contact plug metal pattern 172 that extends in the third direction D3. The sidewall portion of the first contact barrier pattern 171 includes the upper surface 171_US of the first contact barrier pattern.

In the cross-sectional view of FIG. 5A, the upper surface 170_US of the source/drain contact is flat. Each of the upper surface 171_US of the first contact barrier pattern, the upper surface 172A_US of the first contact molybdenum pattern, and the upper surface 172B_US of the first contact tungsten pattern is flat. The upper surface 170_US of the source/drain contact is coplanar with the upper surface 145_US of the gate capping pattern.

In the cross-sectional view of FIG. 5B, based on the upper surface 145_US of the gate capping pattern, the upper surface 171_US of the first contact barrier pattern is lower than the upper surface 172A_US of the first contact molybdenum pattern. A first via barrier pattern 181 fills a space between the gate capping pattern 145 and the first contact molybdenum pattern 172A. However, in an embodiment, an air gap is disposed on the upper surface 171_US of the first contact barrier pattern.

In addition, the shape of the upper surface 175_US of the gate contact is similar to one of the shapes of the upper surface 170_US of the source/drain contact shown in FIGS. 5A to 9.

In the cross-sectional view as shown in FIG. 5A, the source/drain via plug 180 is aligned on the source/drain contact 170. For example, the source/drain via plug 180 covers the entire upper surface 170_US of the source/drain contact. However, the source/drain via plug 180 may be misaligned on the source/drain contact 170. In this case, the source/drain via plug 180 covers a part of the upper surface 170_US of the source/drain contact.

The resistivity of molybdenum (Mo) is lower than the resistivity of tungsten (W), so that the resistance of a contact that includes molybdenum is lower than the resistance of a contact that includes tungsten. On the other hand, tungsten has a thermal stability higher than that of molybdenum, so the loss of tungsten is less than that of molybdenum during a fabricating process. That is, the reliability of a contact that includes tungsten is greater than the reliability of a contact that includes molybdenum.

Since the first contact plug metal pattern 172 and the second contact plug metal pattern 177 include a molybdenum pattern and a tungsten pattern, the resistance of the first contact plug metal pattern 172 and the second contact plug metal pattern 177 decreases, and reliability increases.

A second interlayer insulating layer 191 is disposed on the first interlayer insulating layer 190, the gate structure GS, the source/drain contact 170, and the gate contact 175. The second interlayer insulating layer 191 includes, for example, at least one of silicon oxide, silicon nitride, silicon carbonitride, silicon oxynitride, or a low-k material.

A first etch stop layer 195 is disposed between the first interlayer insulating layer 190 and the second interlayer insulating layer 191. The first etch stop layer 195 extends along the upper surface 145_US of the gate capping pattern, the upper surface of the first interlayer insulating layer 190, the upper surface 170_US of the source/drain contact, and the upper surface 175_US of the gate contact.

The first etch stop layer 195 includes a material having an etch selectivity with respect to the second interlayer insulating layer 191. The first etch stop layer 195 includes, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), aluminum oxide (AlO), aluminum nitride (AlN) and aluminum oxycarbide (AlOC), or a combination thereof. Although the figures show that the first etch stop layer 195 is a single layer, embodiments of the present disclosure are not necessarily limited thereto. In an embodiment, no first etch stop layer 195 is formed.

A wiring structure is disposed on the source/drain contact 170 and the gate contact 175. The wiring structure includes the source/drain via plug 180, the gate via plug 185, and the first wiring line 207.

The source/drain via plug 180 and the gate via plug 185 are disposed in the second interlayer insulating layer 191. The source/drain via plug 180 penetrates the first etch stop layer 195 and is in contact with the source/drain contact 170. The gate via plug 185 penetrates the first etch stop layer 195 and is in contact with the gate contact 175.

The source/drain contact 170 is disposed between the first source/drain pattern 150 and the source/drain via plug 180. The source/drain contact 170 connects the first source/drain pattern 150 to the source/drain via plug 180. The gate contact 175 is disposed between the first gate electrode 120 and the gate via plug 185. The gate contact 175 connects the first gate electrode 120 to the gate via plug 185.

Based on the upper surface of the first active pattern AP1, the lowermost portion of the source/drain via plug 180 is higher than the upper surface 150US of the first source/drain pattern. The lowermost portion of the source/drain via plug 180 is higher than the upper surface 120_US of the first gate electrode. The lowermost portion of the gate via plug 185 is higher than the upper surface 120_US of the first gate electrode.

The source/drain via plug 180 includes the first via barrier pattern 181 and a first via plug metal pattern 182. The first via plug metal pattern 182 is disposed on the first via barrier pattern 181.

The gate via plug 185 includes a second via barrier pattern 186 and a second via plug metal pattern 187. The second via plug metal pattern 187 is disposed on the second via barrier pattern 186.

Each of the first via barrier pattern 181 and the second via barrier pattern 186 includes, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Jr), or rhodium (Rh). Although the figures show that each of the first via barrier pattern 181 and the second via barrier pattern 186 is a single layer, embodiments of the present disclosure are not necessarily limited thereto.

Each of the first via plug metal pattern 182 and the second via plug metal pattern 187 is a single layer. Each of the first via plug metal pattern 182 and the second via plug metal pattern 187 includes one of aluminum (Al), tungsten (W), cobalt (Co), copper (Cu), ruthenium (Ru), silver (Ag), gold (Au), manganese (Mn), or molybdenum (Mo). For example, the first via plug metal pattern 182 and the second via plug metal pattern 187 include a tungsten layer. For another example, the first via plug metal pattern 182 and the second via plug metal pattern 187 include a molybdenum layer.

FIG. 5A shows that the width of the source/drain contact 170 in the first direction D1 is the same as the width of the source/drain via plug 180 in the first direction D1 at the point where the source/drain via plug 180 meets the source/drain contact 170, but embodiments of the present disclosure are not necessarily limited thereto.

FIG. 3 shows that the width of the gate contact 175 in the second direction D2 is the same as the width of the gate via plug 185 in the second direction D2 at the point where the gate via plug 185 meets the gate contact 175, but embodiments of the present disclosure are not necessarily limited thereto.

A second etch stop layer 196 is disposed between the second interlayer insulating layer 191 and a third interlayer insulating layer 192. The second etch stop layer 196 extends along the upper surface of the second interlayer insulating layer 191.

The second etch stop layer 196 includes a material having an etch selectivity with respect to the third interlayer insulating layer 192. The second etch stop layer 196 includes, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), aluminum oxide (AlO), aluminum nitride (AlN) and aluminum oxycarbide (AlOC), or a combination thereof. Although the figures show that the second etch stop layer 196 is a single layer, embodiments of the present disclosure are not necessarily limited thereto. In some embodiments, no second etch stop layer 196 is formed.

The first wiring line 207 is disposed in the third interlayer insulating layer 192. The first wiring line 207 is connected to the source/drain via plug 180. The first wiring line 207 is in contact with the source/drain via plug 180. The first wiring line 207 is connected to the gate via plug 185. The first wiring line 207 is in contact with the gate via plug 185.

The first wiring line 207 includes a lower wiring barrier layer 207a and a lower wiring filling layer 207b. The lower wiring barrier layer 207a includes at least one of, for example, tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), or a two-dimensional (2D) material. The lower wiring filling layer 207b includes at least one of, for example, aluminum (Al), copper (Cu), tungsten (W), cobalt (Co), ruthenium (Ru), silver (Ag), gold (Au), manganese (Mn), or molybdenum (Mo).

Figure 6:
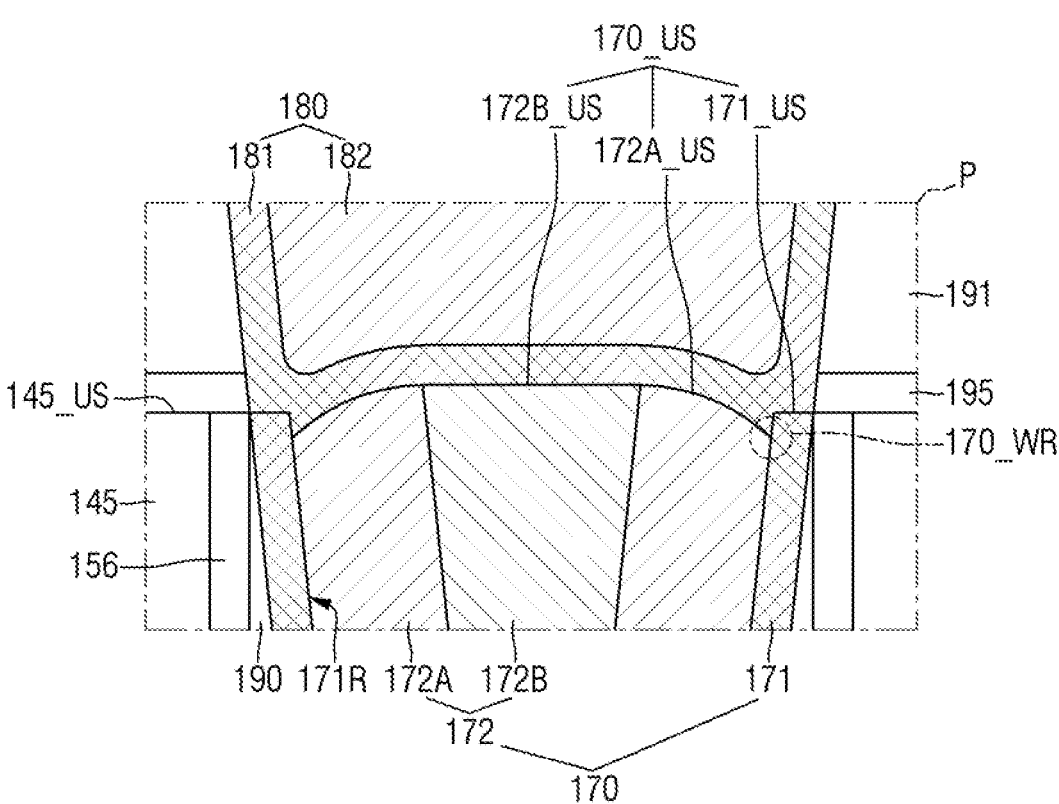
FIGS. 6 and 7 illustrate a semiconductor device according to some embodiments.
Figure 7:
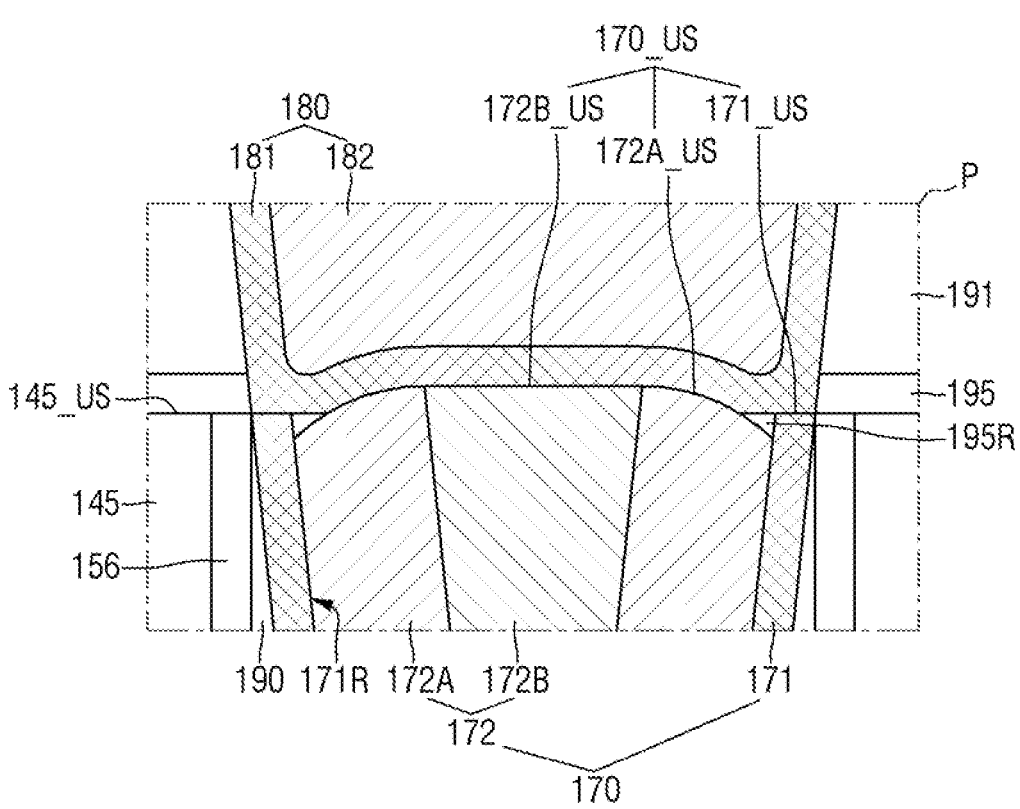
Figure 8:
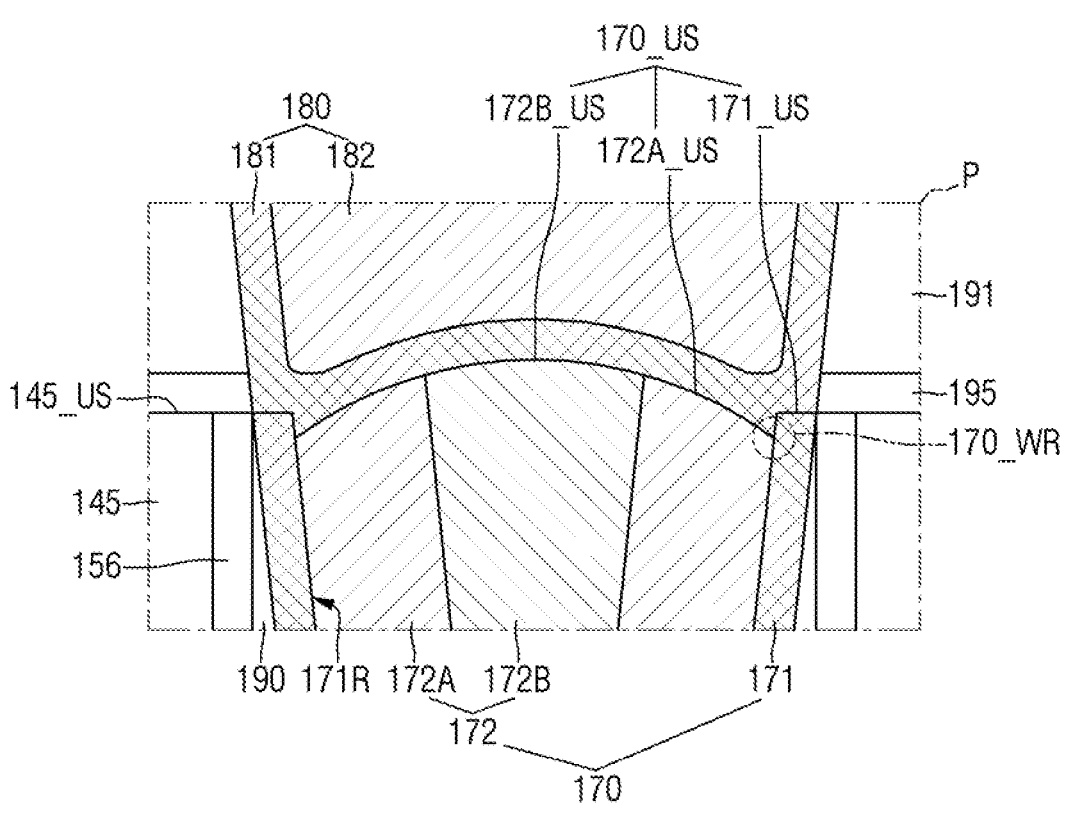
FIGS. 8 and 9 illustrate a semiconductor device according to some embodiments.
Figure 9:
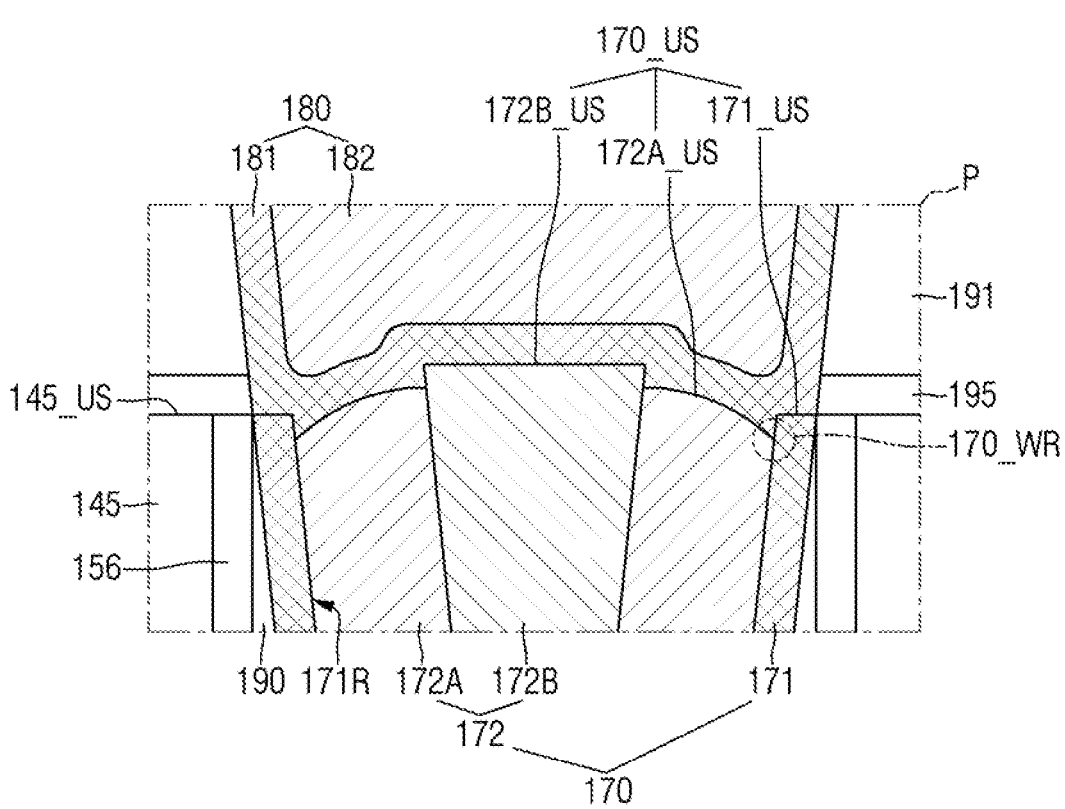

FIGS. 6 and 7 illustrate a semiconductor device according to some embodiments. FIGS. 8 and 9 illustrate a semiconductor device according to some embodiments. For simplicity of description, the following description will focus on differences from the description with reference to FIGS. 1 to 5B. For reference, FIGS. 6 to 9 are enlarged views of part P of FIG. 2.

Referring to FIGS. 6 and 7, in a semiconductor device according to some embodiments, the upper surface 172A_US of the first contact molybdenum pattern has a convex curved surface. The upper surface 172B_US of the first contact tungsten pattern is flat.

The upper surface 172A_US of the first contact molybdenum pattern and the upper surface 172B_US of the first contact tungsten pattern are connected without a height difference.

For example, there is a height difference between the upper surface 172A_US of the first contact molybdenum pattern and the upper surface 171_US of the first contact barrier pattern. The upper surface 170_US of the source/drain contact includes a wedge region 170_WR. The wedge region 170_WR is defined by a height difference between the upper surface 172A_US of the first contact molybdenum pattern and the upper surface 171_US of the first contact barrier pattern.

In an embodiment, FIG. 6 shows that the source/drain via plug 180 fills the wedge region 170_WR. For example, the first via barrier pattern 181 fills the wedge region 170_WR.

In an embodiment, FIG. 7 shows that a remaining portion 195R of the first etch stop layer fills at least a part of the wedge region 170_WR. A part of the upper surface 172A_US of the first contact molybdenum pattern is covered by the remaining portion 195R of the first etch stop layer.

However, in some embodiments, the upper surface 172A_US of the first contact molybdenum pattern and the upper surface 171_US of the first contact barrier pattern are connected without a height difference.

Referring to FIG. 8, in a semiconductor device according to some embodiments, the upper surface 172A_US of the first contact molybdenum pattern and the upper surface 172B_US of the first contact tungsten pattern each have a convex curved surface.

For example, the upper surface 172A_US of the first contact molybdenum pattern and the upper surface 172B_US of the first contact tungsten pattern are connected without a height difference. There is a height difference between the upper surface 172A_US of the first contact molybdenum pattern and the upper surface 171_US of the first contact barrier pattern.

However, in some embodiments, the upper surface 172A_US of the first contact molybdenum pattern and the upper surface 171_US of the first contact barrier pattern are connected without a height difference.

Referring to FIG. 9, in a semiconductor device according to some embodiments, there is a height difference between the upper surface 172A_US of the first contact molybdenum pattern and the upper surface 172B_US of the first contact tungsten pattern.

The upper surface 172B_US of the first contact tungsten pattern protrude above the upper surface 172A_US of the first contact molybdenum pattern. The upper surface 172A_US of the first contact molybdenum pattern has a convex curved surface. The upper surface 172B_US of the first contact tungsten pattern is flat.

There is a height difference between the upper surface 172A_US of the first contact molybdenum pattern and the upper surface 171_US of the first contact barrier pattern, but embodiments of the present disclosure are not necessarily limited thereto.

Figure 10:
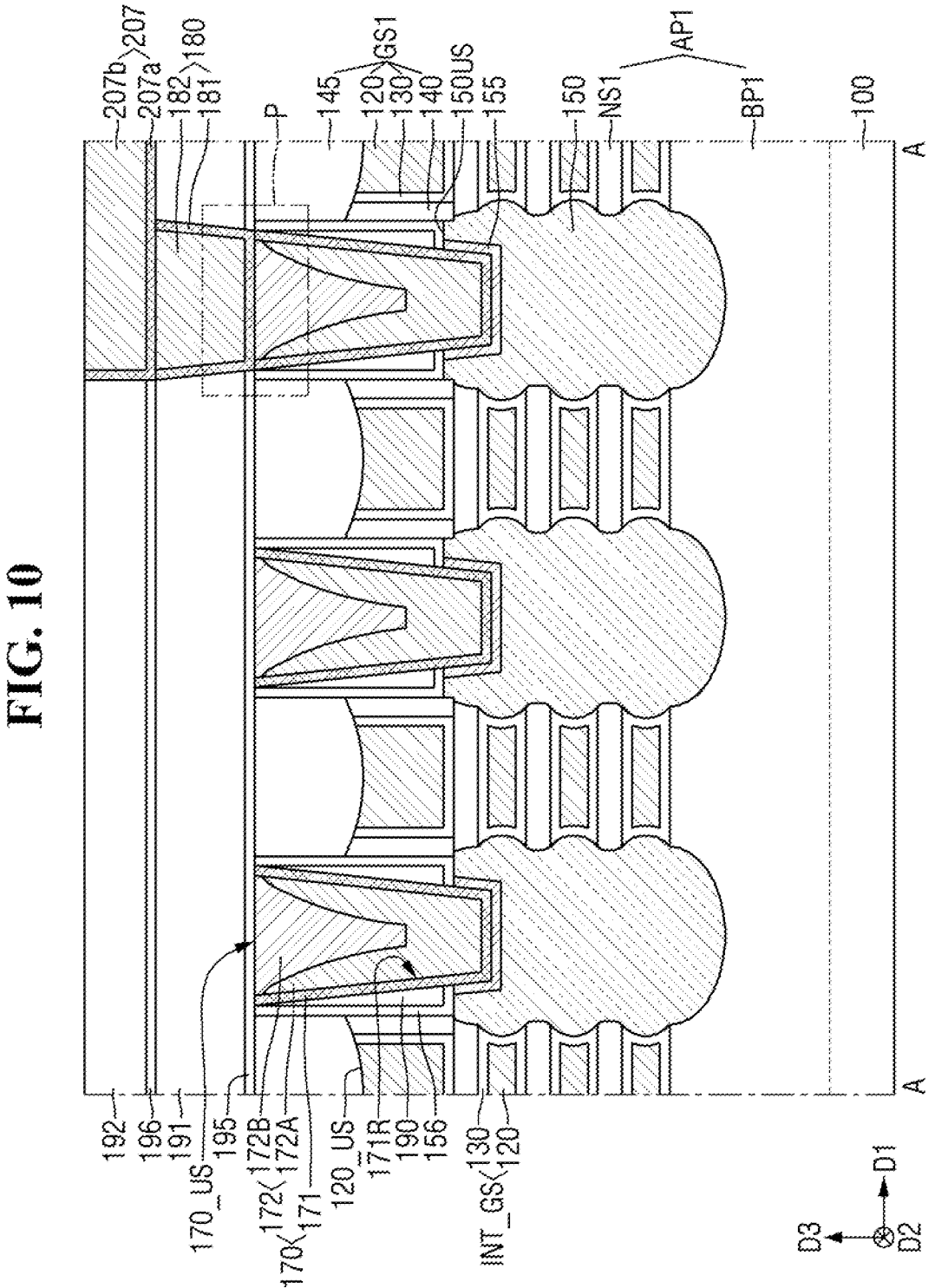
FIGS. 10 to 12 illustrate a semiconductor device according to some embodiments.
Figure 11:
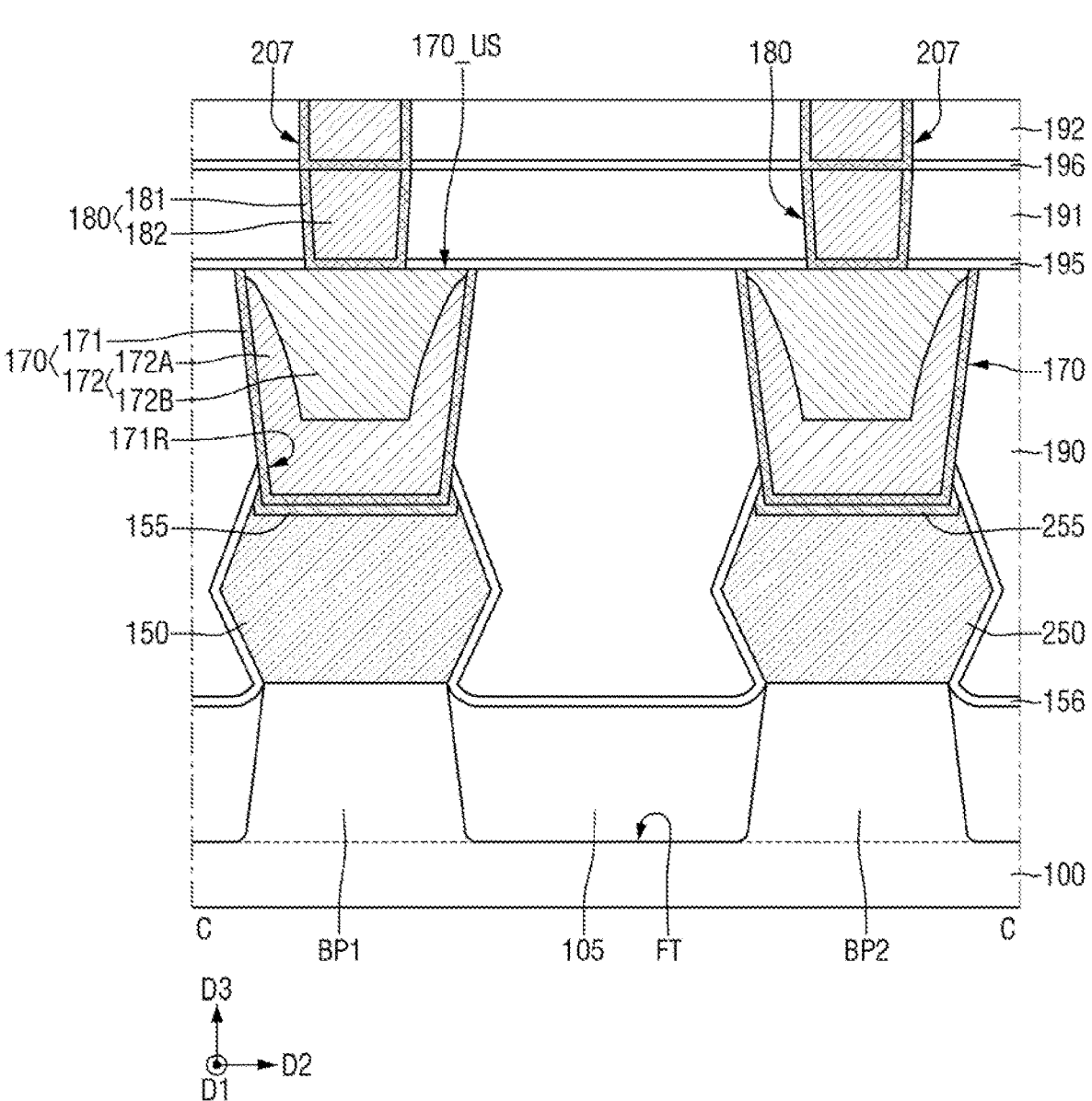
Figure 12:
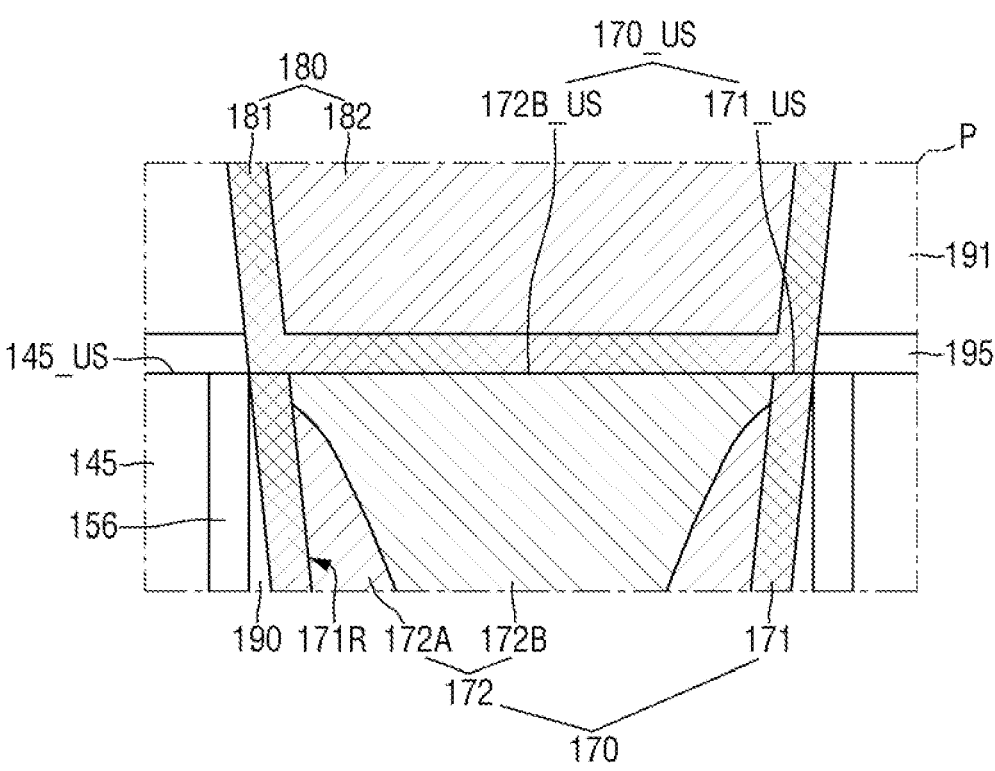
Figure 13:
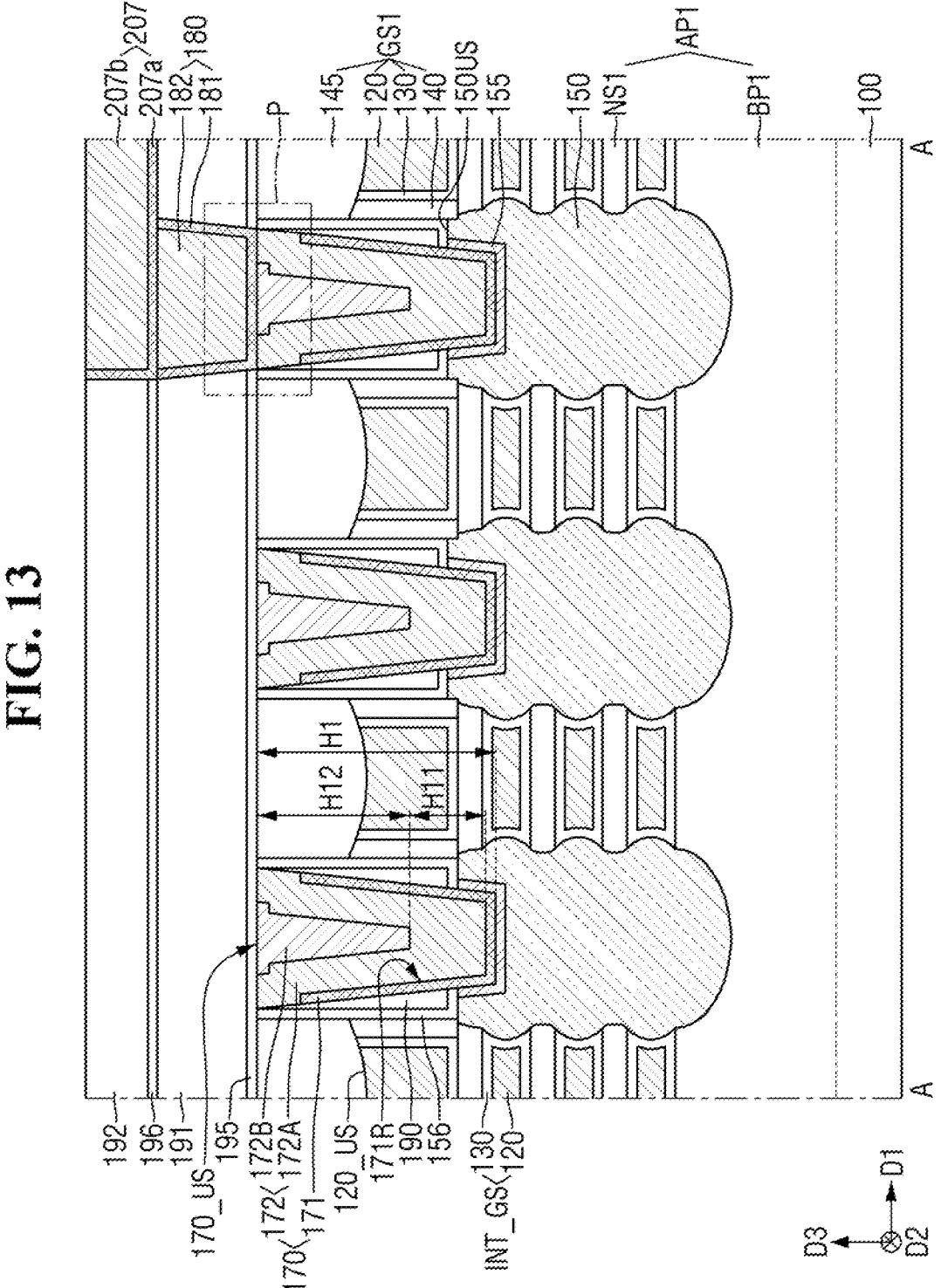
FIGS. 13 to 15 illustrate a semiconductor device according to some embodiments.
Figure 14:
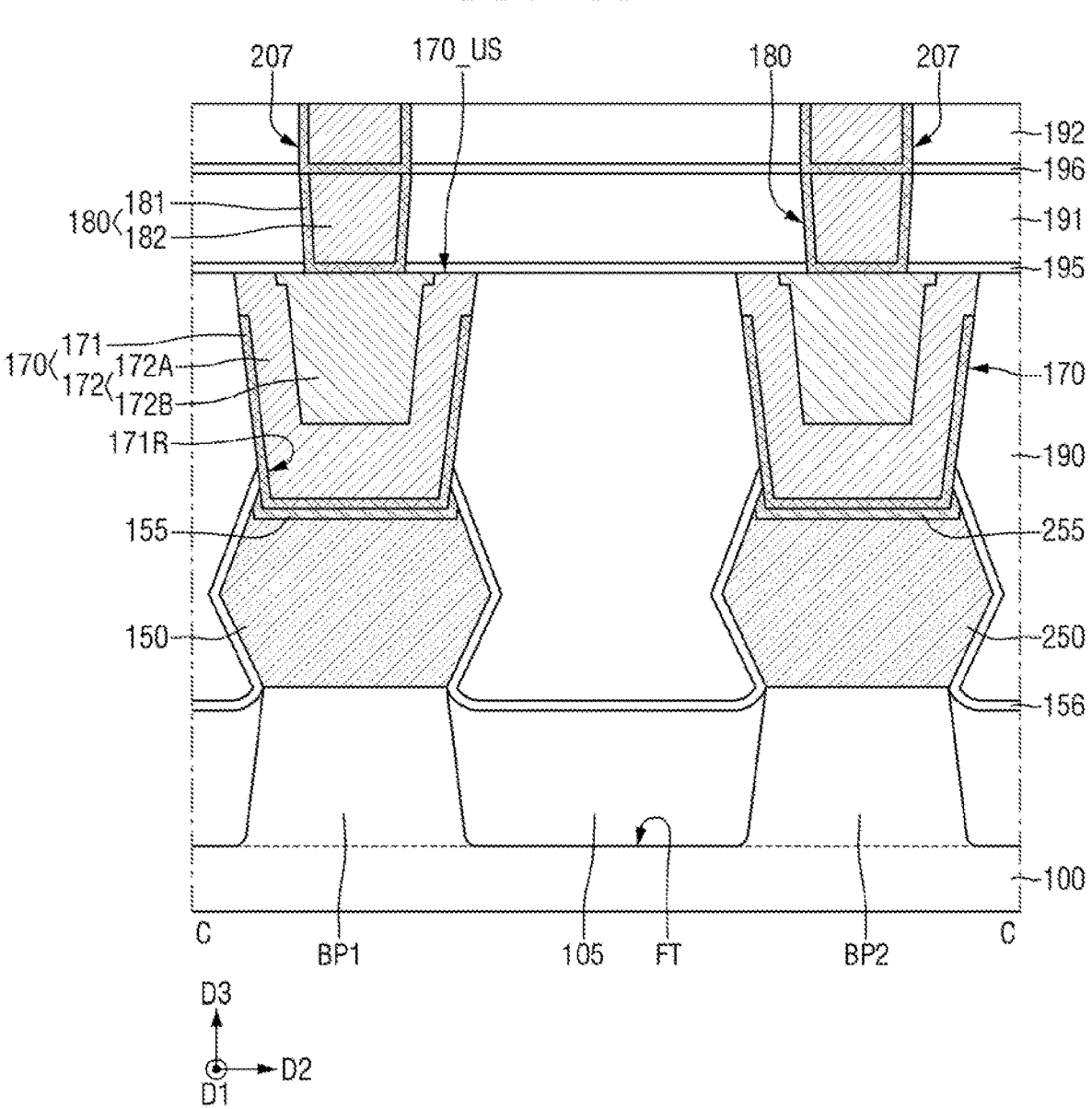
Figure 15:
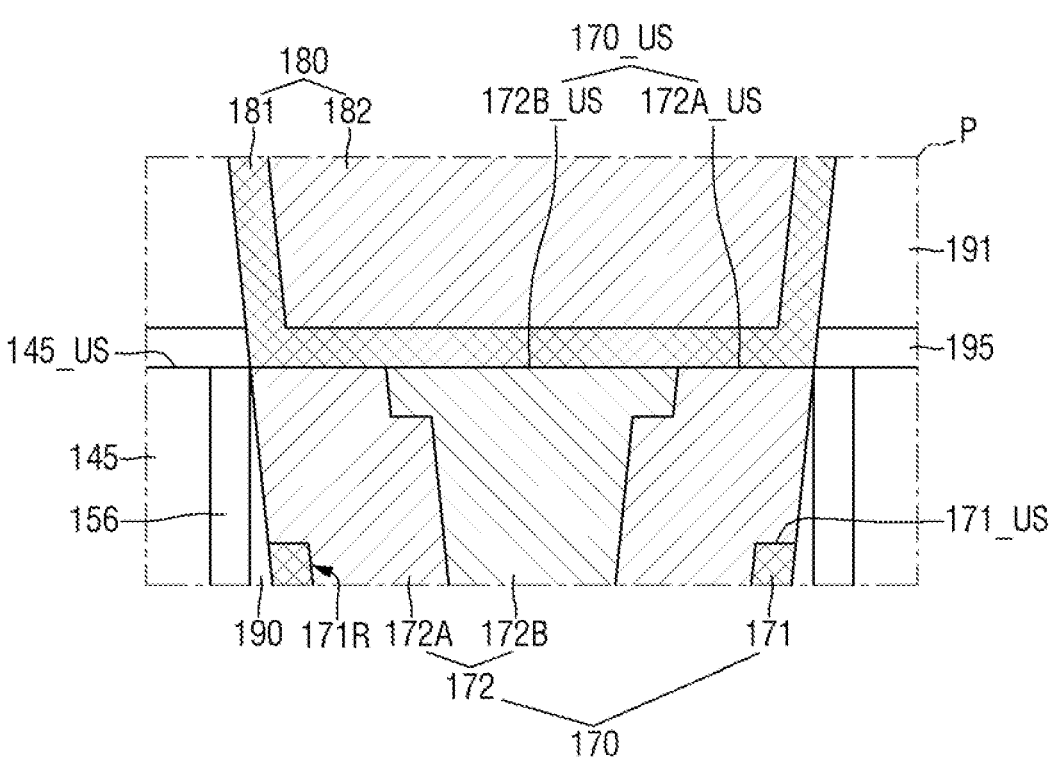

FIGS. 10 to 12 illustrate a semiconductor device according to some embodiments. FIGS. 13 to 15 illustrate a semiconductor device according to some embodiments. For simplicity of description, the following description will focus on differences from the description with reference to FIGS. 1 to 5B.

Referring to FIGS. 10 to 12, in a semiconductor device according to some embodiments, the upper surface 170_US of the source/drain contact is defined by the first contact barrier pattern 171 and the first contact tungsten pattern 172B.

The upper surface 170_US of the source/drain contact includes the upper surface 171_US of the first contact barrier pattern and the upper surface 172B_US of the first contact tungsten pattern. The width of the sidewall portion of the first contact molybdenum pattern 172A in the first direction D1 decreases with increasing distance from the bottom portion of the first contact molybdenum pattern 172A.

In addition, in some embodiments, similar to the source/drain contact 170, the upper surface 175_US of the gate contact is defined by the second contact barrier pattern 176 and the second contact tungsten pattern 177B.

Referring to FIGS. 13 to 15, in a semiconductor device according to some embodiments, the upper surface 170_US of the source/drain contact is defined by the first contact plug metal pattern 172.

The upper surface 170_US of the source/drain contact is defined by the first contact molybdenum pattern 172A and the first contact tungsten pattern 172B. The upper surface 170_US of the source/drain contact includes the upper surface 172A_US of the first contact molybdenum pattern and the upper surface 172B_US of the first contact tungsten pattern.

The first contact plug metal pattern 172 covers the upper surface 171_US of the first contact barrier pattern 171. The first contact molybdenum pattern 172A covers the upper surface 171_US of the first contact barrier pattern 171.

Figure 16:
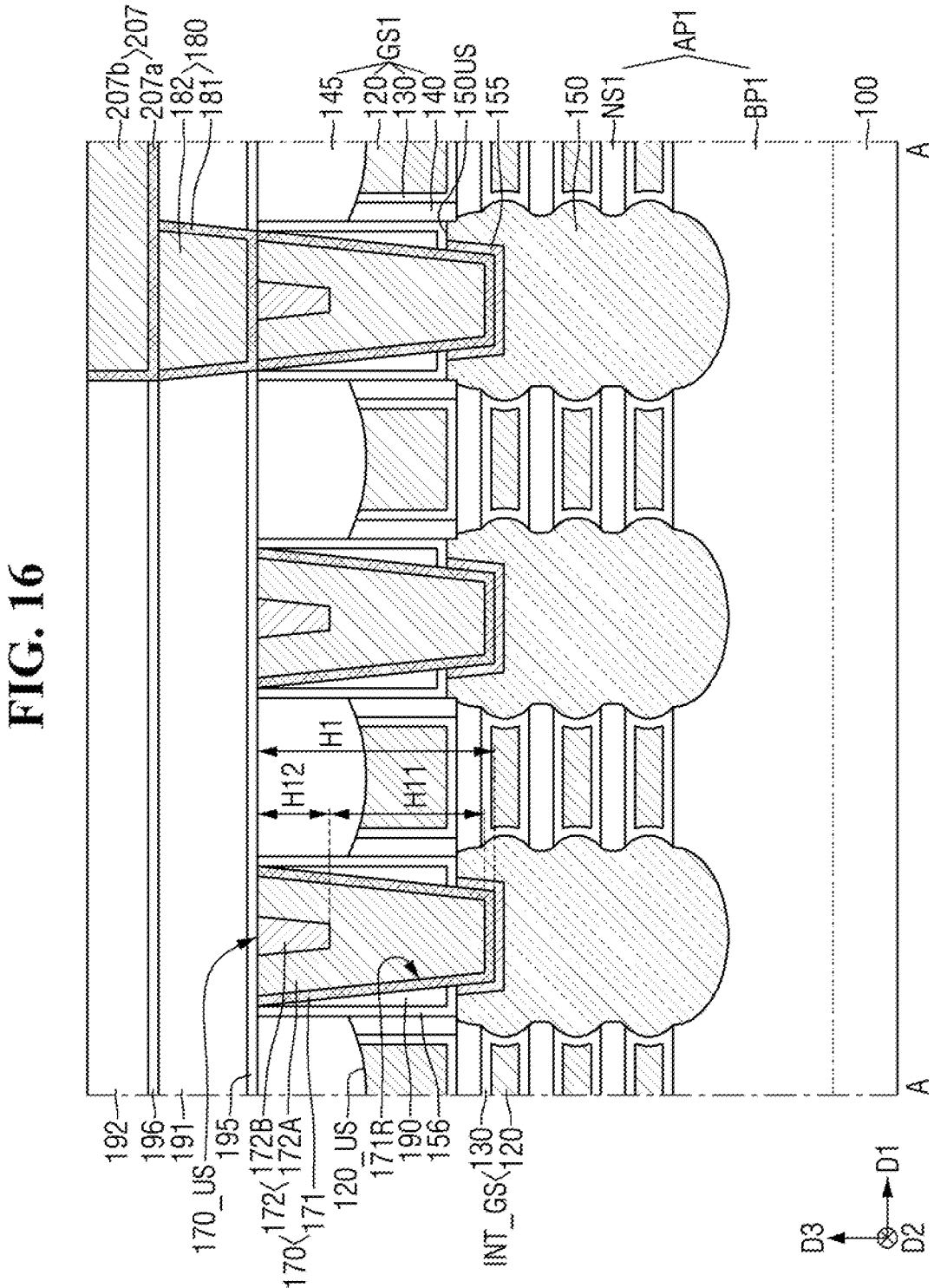
FIGS. 16 to 18 illustrate a semiconductor device according to some embodiments.
Figure 17:
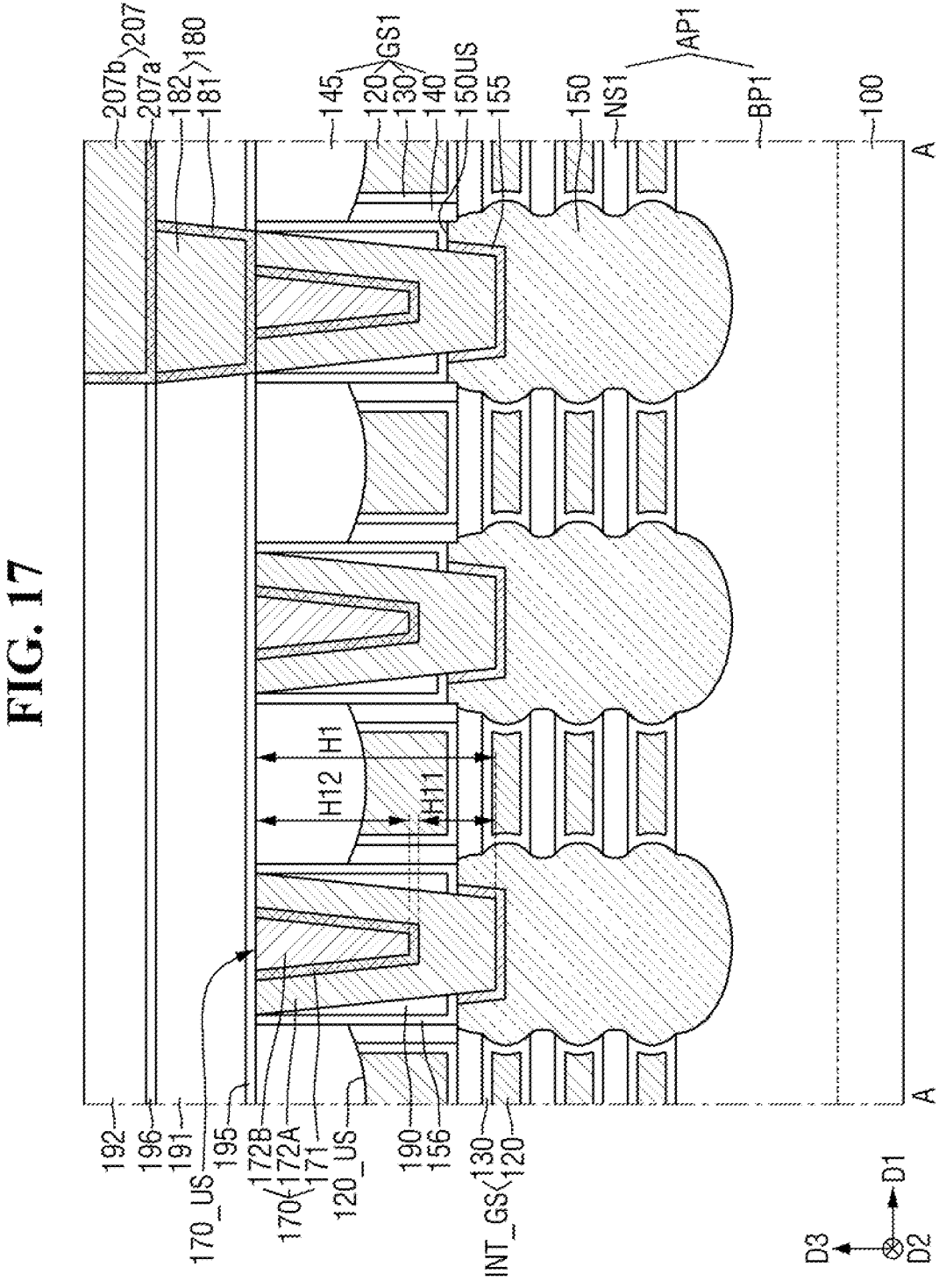
Figure 18:
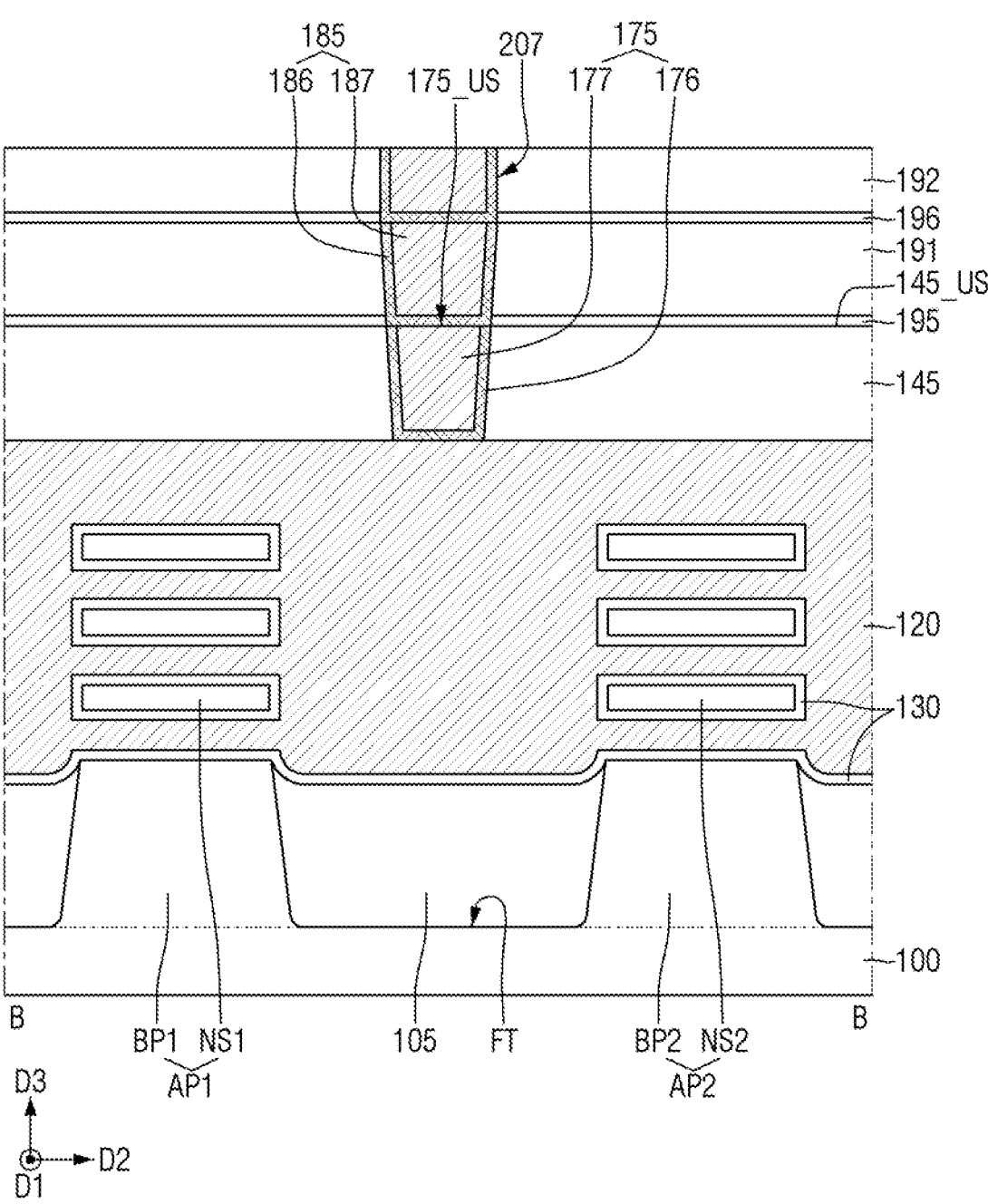

FIGS. 16 to 18 illustrate a semiconductor device according to some embodiments. For simplicity of description, the following description will focus on differences from the description with reference to FIGS. 1 to 5B.

Referring to FIG. 16, in a semiconductor device according to some embodiments, based on the upper surface of the first active pattern AP1, the lowermost portion of the first contact tungsten pattern 172B is higher than the upper surface 120_US of the first gate electrode.

The height H11 of the first contact molybdenum pattern 172A is greater than a height from the lowermost portion of the first contact molybdenum pattern 172A to the upper surface 120_US of the first gate electrode.

Referring to FIG. 17, in a semiconductor device according to some embodiments, the source/drain contact 170 includes the first contact molybdenum pattern 172A, the first contact barrier pattern 171, and the first contact tungsten pattern 172B sequentially stacked above the first source/drain pattern 150.

The first contact barrier pattern 171 is disposed between the first contact molybdenum pattern 172A and the first contact tungsten pattern 172B. The first contact barrier pattern 171 is in contact with the first contact molybdenum pattern 172A and the first contact tungsten pattern 172B.

The first contact silicide layer 155 is disposed between the first contact molybdenum pattern 172A and the first source/drain pattern 150. The first contact silicide layer 155 is in contact with the first contact molybdenum pattern 172A.

Referring to FIG. 18, in a semiconductor device according to some embodiments, the second contact plug metal pattern 177 is a single layer.

The structure of the stacked conductive layer of the gate contact 175 differs from the structure of the stacked conductive layer of the source/drain contact 170.

The second contact plug metal pattern 177 includes one of aluminum (Al), tungsten (W), cobalt (Co), copper (Cu), ruthenium (Ru), silver (Ag), gold (Au), manganese (Mn), or molybdenum (Mo). For example, the second contact plug metal pattern 177 includes one of a tungsten pattern or a molybdenum pattern. For example, the second contact plug metal pattern 177 includes one of a tungsten layer or a molybdenum layer.

However, in some embodiments, the second contact plug metal pattern 177 includes the second contact molybdenum pattern 177A and the second contact tungsten pattern 177B. The first contact plug metal pattern 172 is a single layer.

Figure 19:
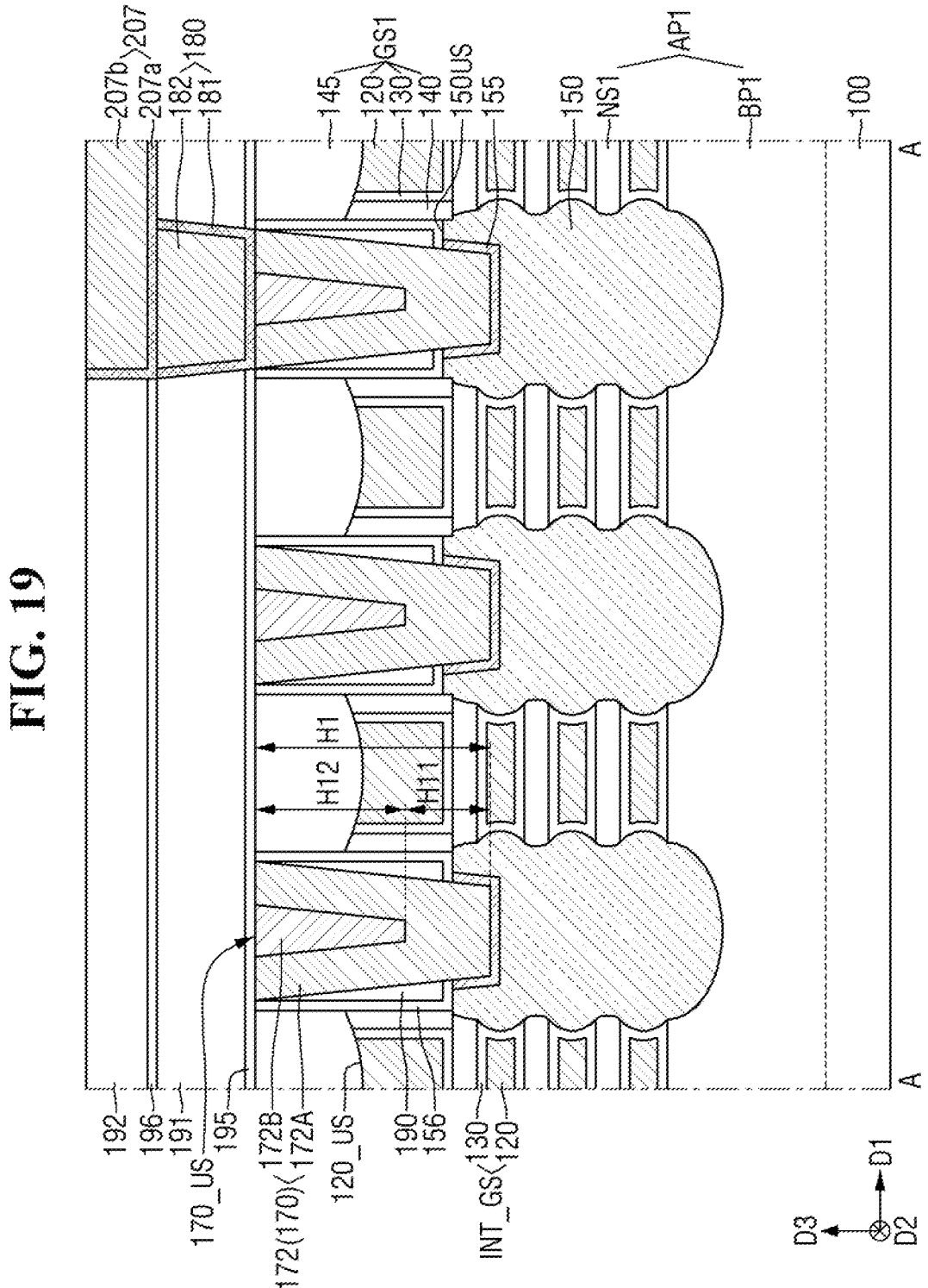
FIGS. 19 and 20 illustrate a semiconductor device according to some embodiments.
Figure 20:
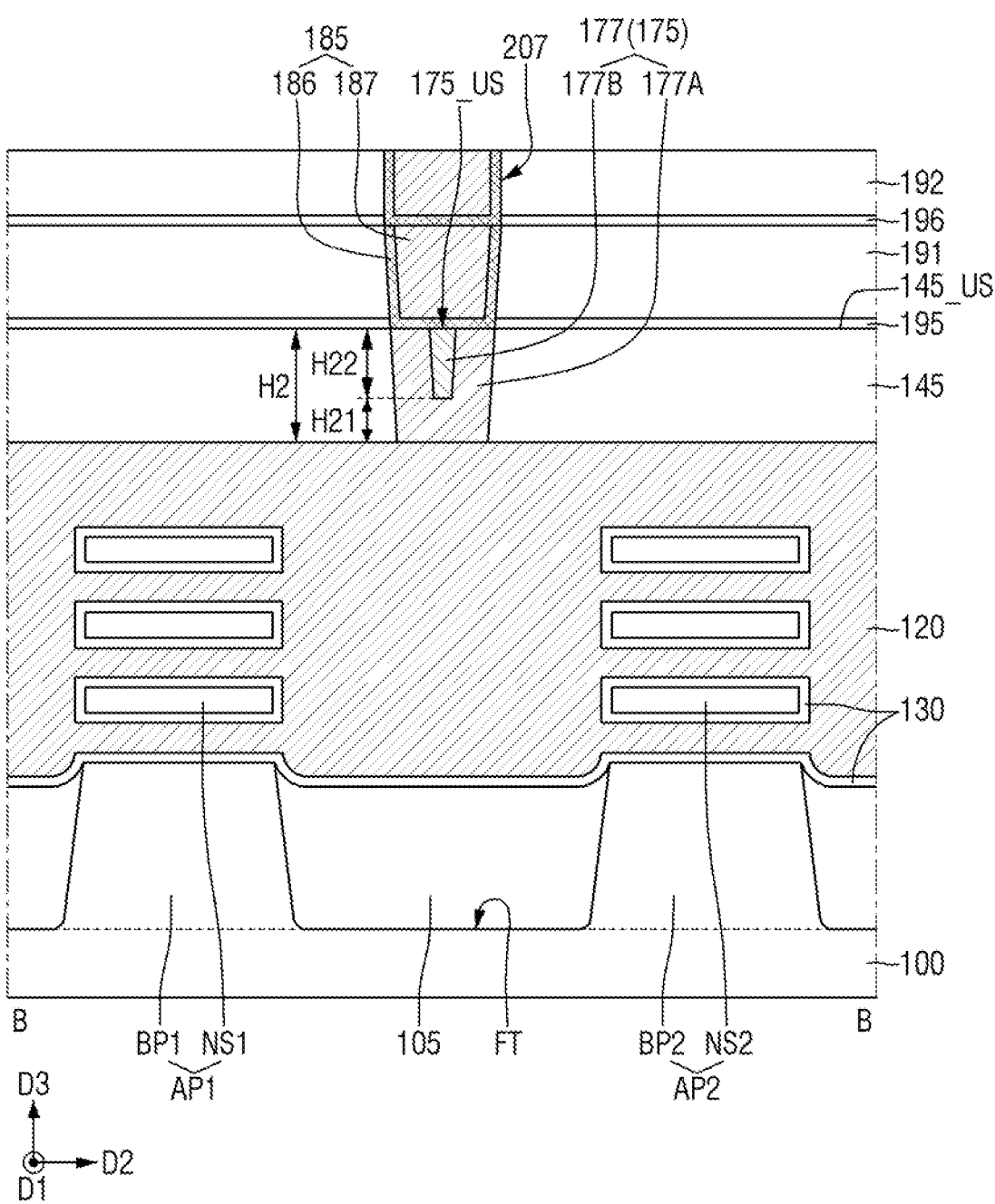

FIGS. 19 and 20 illustrate a semiconductor device according to some embodiments. For simplicity of description, the following description will focus on differences from the description with reference to FIGS. 1 to 5B.

Referring to FIGS. 19 and 20, in a semiconductor device according to some embodiments, the source/drain contact 170 includes the first contact plug metal pattern 172 without the first contact barrier pattern 171 (see FIG. 2).

The source/drain contact 170 includes the first contact molybdenum pattern 172A and the first contact tungsten pattern 172B without the first contact barrier pattern 171. The first contact molybdenum pattern 172A is in contact with the first contact silicide layer 155. The sidewall of the first contact molybdenum pattern 172A is in contact with the first interlayer insulating layer 190 and/or the source/drain etch stop layer 156.

The gate contact 175 includes the second contact plug metal pattern 177 without the second contact barrier pattern 176 (see FIG. 3). The gate contact 175 includes the second contact molybdenum pattern 177A and the second contact tungsten pattern 177B without the second contact barrier pattern 176. The second contact molybdenum pattern 177A is in contact with the first gate electrode 120. The sidewall of the second contact molybdenum pattern 177A is in contact with the gate capping pattern 145.

The height H1 in the third direction D3 of the source/drain contact 170 is equal to the sum of the height H11 of the first contact molybdenum pattern 172A and the height H12 of the first contact tungsten pattern 172B. Since the first contact molybdenum pattern 172A includes the sidewall portion of the first contact molybdenum pattern 172A, the height H11 of the first contact molybdenum pattern 172A is greater than or equal to ⅓ of the height H1 of the source/drain contact 170.

The height H2 of the gate contact 175 is equal to the sum of the height H21 of the second contact molybdenum pattern 177A and the height H22 of the second contact tungsten pattern 177B. The height H21 of the second contact molybdenum pattern 177A is greater than or equal to ⅓ of the height H2 of the gate contact 175.

However, in some embodiments, one of the source/drain contact 170 or the gate contact 175 includes a contact barrier pattern as shown in FIGS. 2 and 3.

Figure 21:
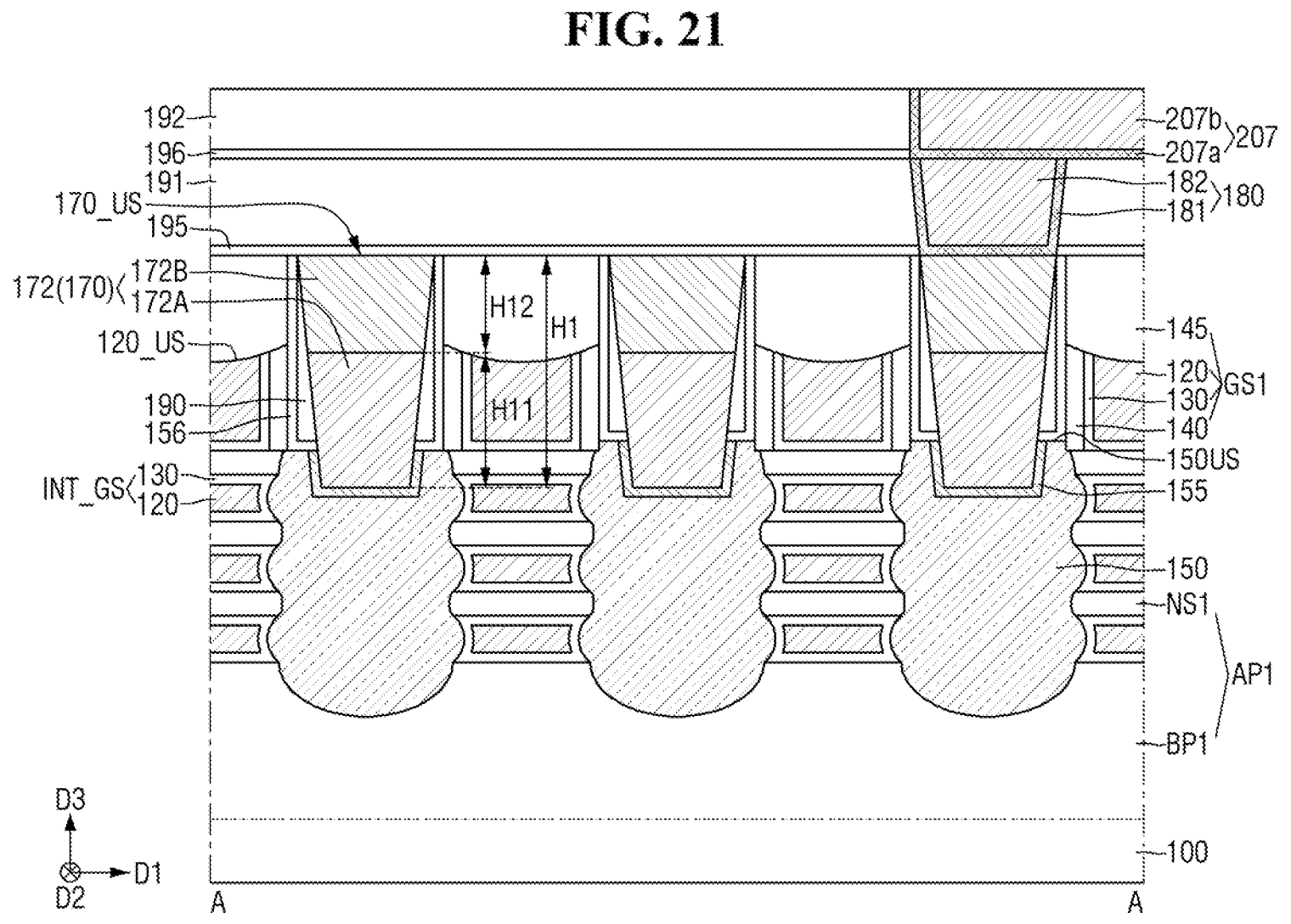
Figure 22:
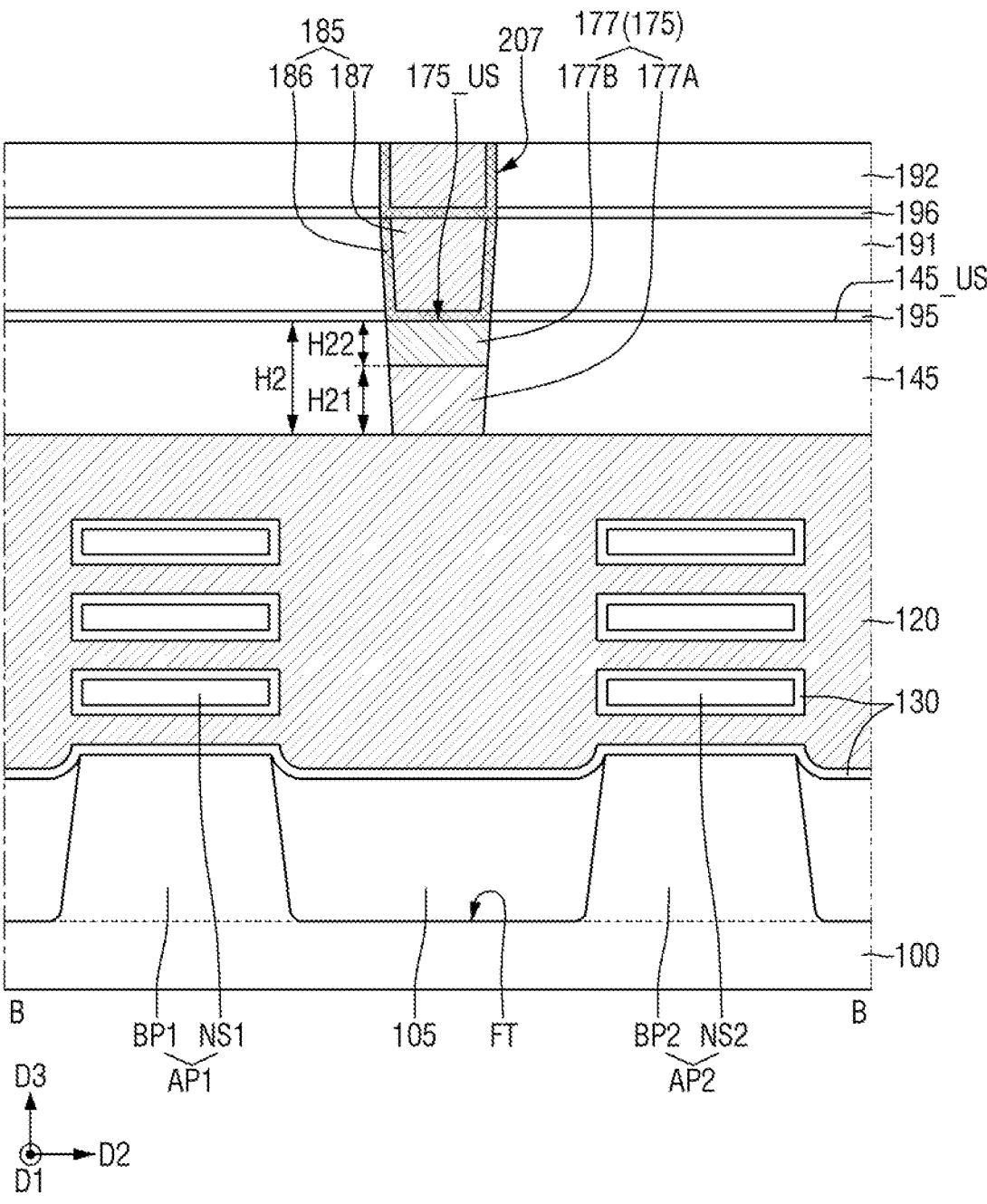

FIGS. 21 and 22 illustrate a semiconductor device according to some embodiments. For simplicity of description, the following description will focus on differences from the description with reference to FIGS. 19 and 20.

Referring to FIGS. 21 and 22, in a semiconductor device according to some embodiments, the first contact molybdenum pattern 172A does not include the sidewall portion of the first contact molybdenum pattern 172A that extends along the sidewall of the first contact tungsten pattern 172B.

The second contact molybdenum pattern 177A does not include the sidewall portion of the second contact molybdenum pattern 177A that extends along the sidewall of the second contact tungsten pattern 177B.

For example, in a cross-sectional view, the upper surface of the first contact molybdenum pattern 172A and the upper surface of the second contact molybdenum pattern 177A are flat. For another example, the upper surface of the first contact molybdenum pattern 172A and the upper surface of the second contact molybdenum pattern 177A are convex curved surfaces.

However, in some embodiments, one of the source/drain contact 170 or the gate contact 175 includes a molybdenum pattern as shown in FIGS. 19 and 20.

The volume of the first contact molybdenum pattern 172A is greater than or equal to the volume of the first contact tungsten pattern 172B. The volume of the second contact molybdenum pattern 177A is greater than or equal to the volume of the second contact tungsten pattern 177B. The height H11 of the first contact molybdenum pattern 172A is equal to or greater than ½ of the height H1 of the source/drain contact 170. The height H21 of the second contact molybdenum pattern 177A is equal to or greater than ½ of the height H2 of the gate contact 175.

Figure 23:
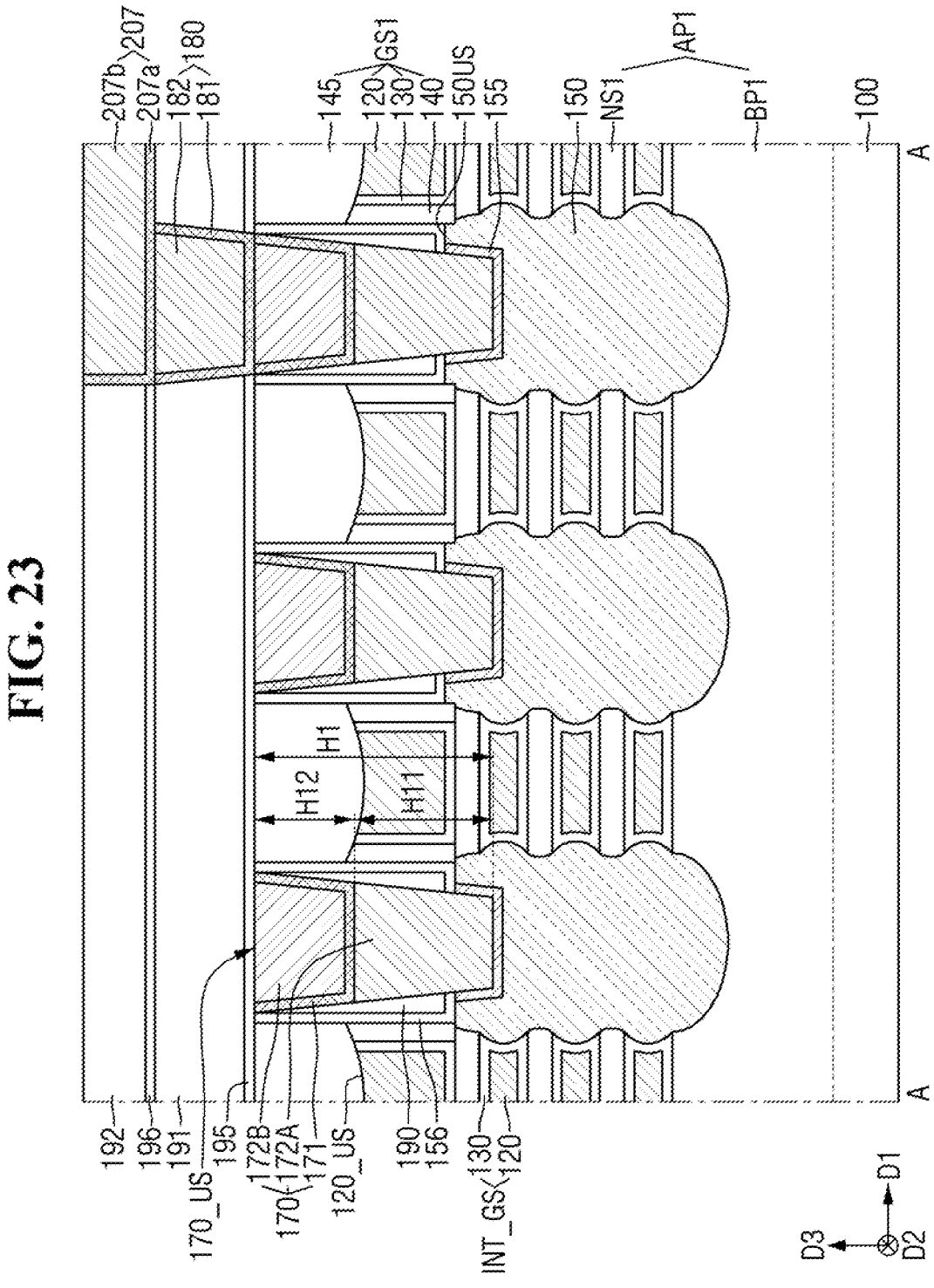
FIG. 23 illustrates a semiconductor device according to some embodiments.

FIG. 23 illustrates a semiconductor device according to some embodiments. For simplicity of description, the description will focus on points different from those described with reference to FIGS. 21 and 22.

Referring to FIG. 23, in a semiconductor device according to some embodiments, the source/drain pattern 170 includes the first contact barrier pattern 171 that covers the entire upper surface of the first contact molybdenum pattern 172A.

The first contact barrier pattern 171 is in contact with the first contact tungsten pattern 172B. The first contact barrier pattern 171 surrounds the sidewall of the first contact tungsten pattern 172B. The first contact tungsten pattern 172B fills a sub-plug recess defined by the first contact barrier pattern 171.

In addition, the gate contact 175 may also have a structure similar to that of the source/drain contact 170.

FIGS. 24 to 27 illustrate a semiconductor device according to some embodiments. For simplicity of description, the following description will focus on differences from the description with reference to FIGS. 1 to 5B.

Figure 24:
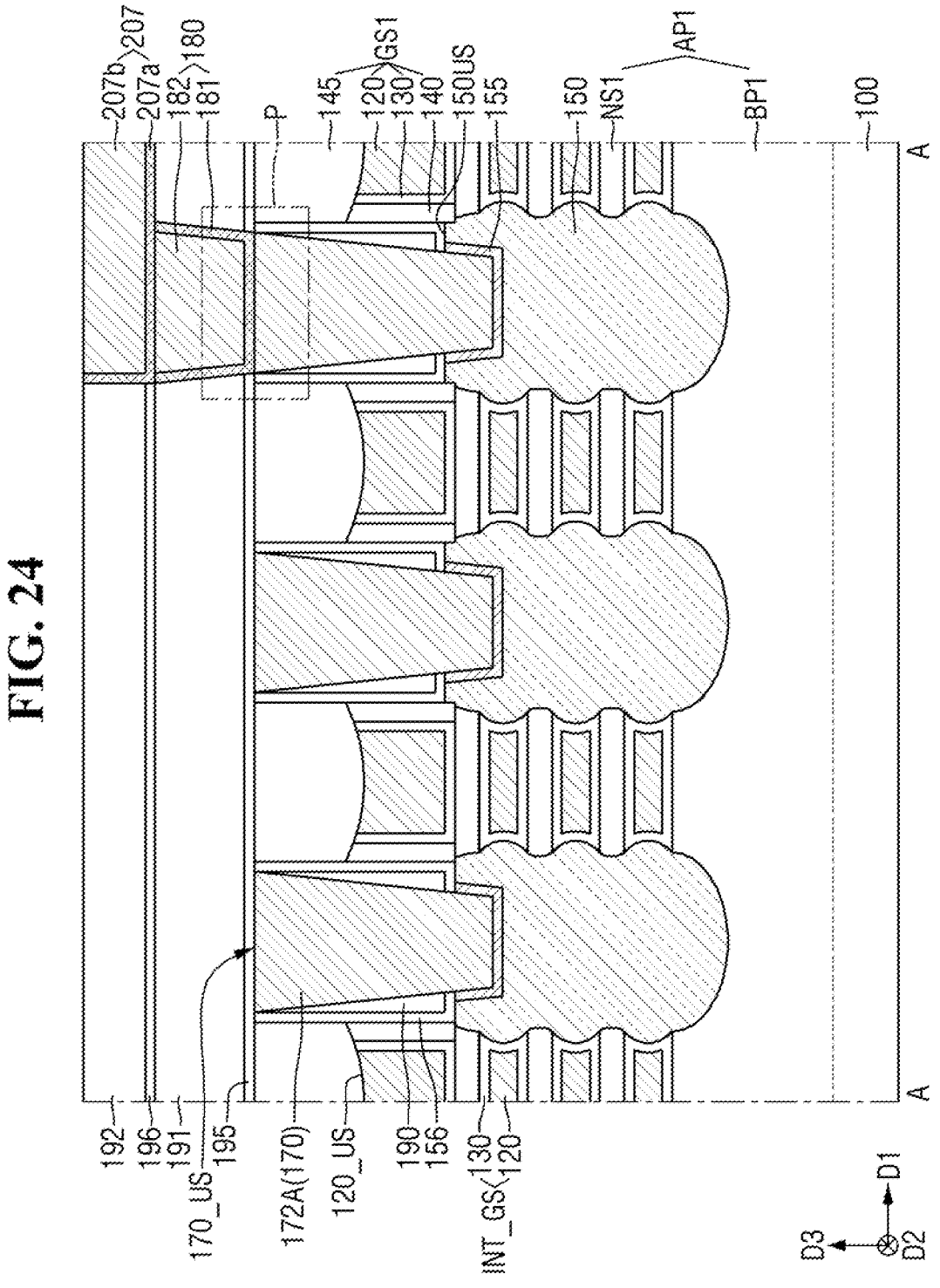
FIGS. 24 to 27 illustrate a semiconductor device according to some embodiments.
Figure 25:
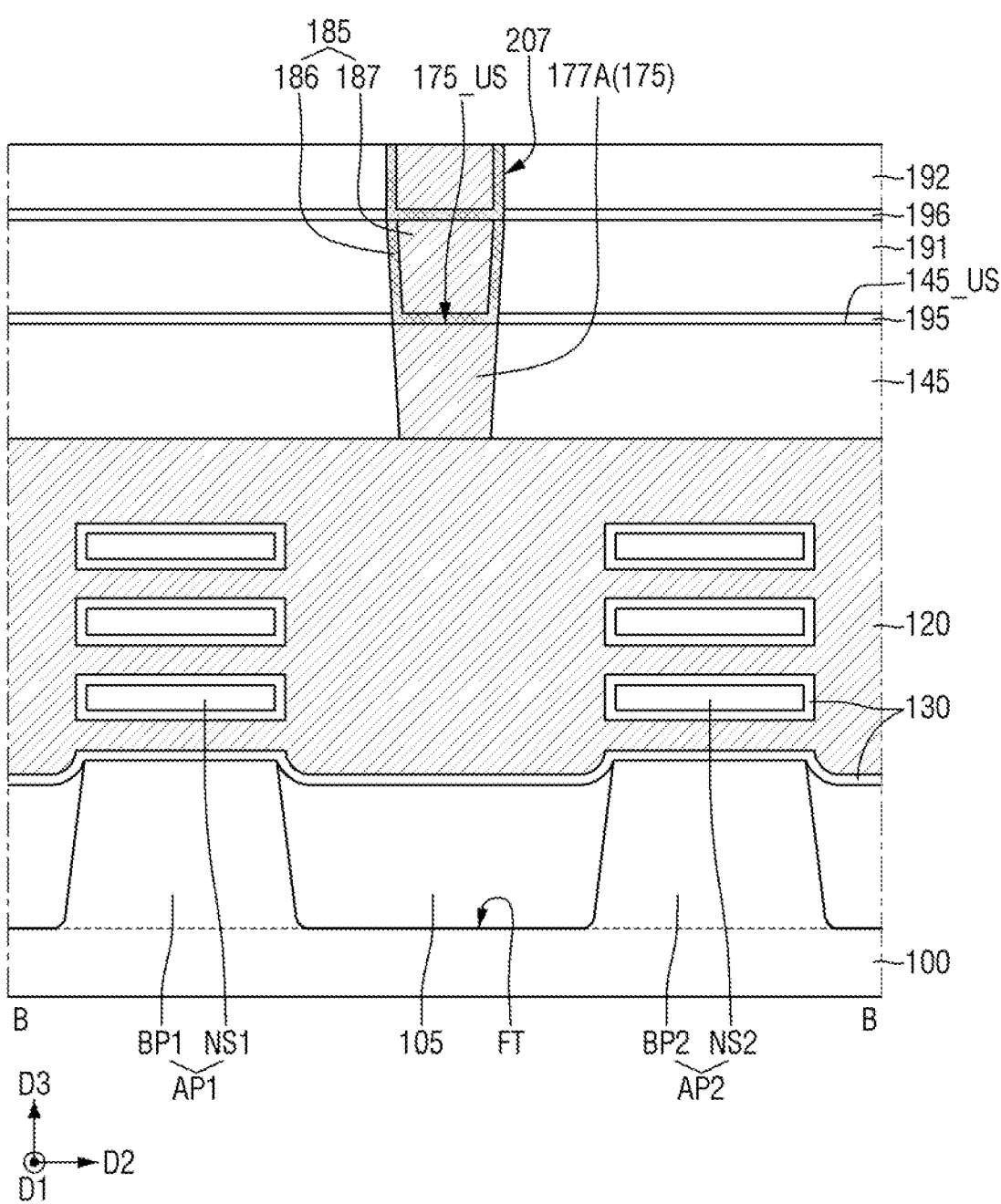
Figure 26A:
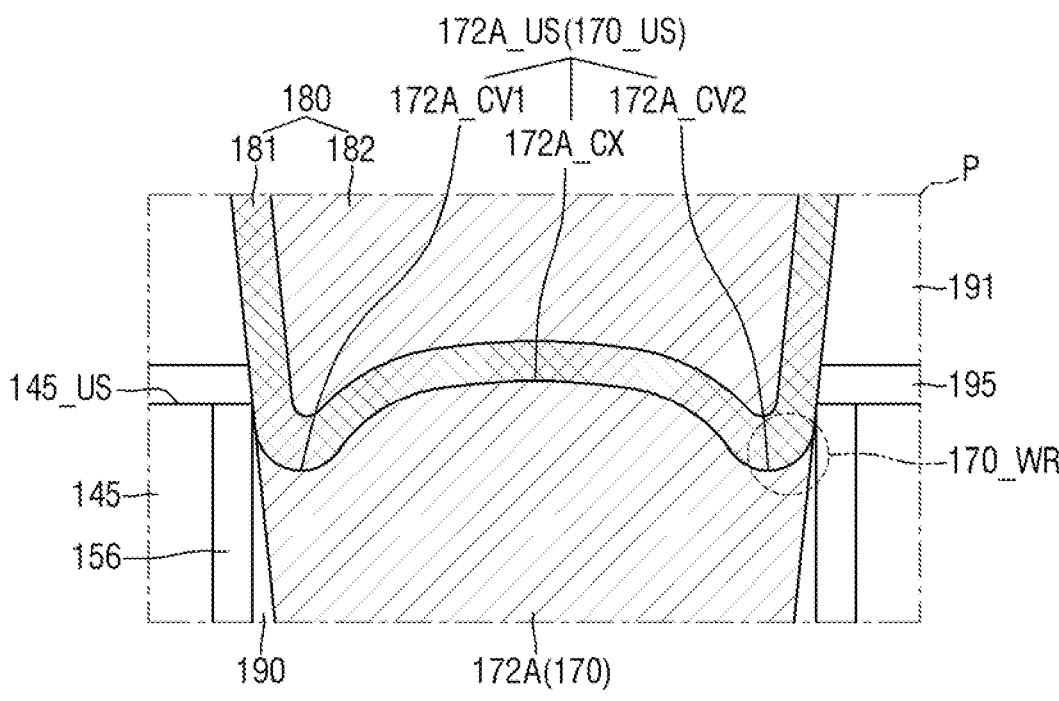

For reference, FIGS. 24 and 25 are cross-sectional views taken along lines A-A and B-B of FIG. 1. FIGS. 26A to 27 are enlarged views of part P of FIG. 24.

Referring to FIGS. 24 to 27, in a semiconductor device according to some embodiments, the source/drain contact 170 includes only the first contact molybdenum pattern 172A.

The source/drain contact 170 is a molybdenum layer. The sidewall of the first contact molybdenum pattern 172A is in contact with the first interlayer insulating layer 190.

The gate contact 175 includes only the second contact molybdenum pattern 177A. The gate contact 175 is a molybdenum layer. The sidewall of the second contact molybdenum pattern 177A is in contact with the gate capping pattern 145.

The upper surface 170_US of the source/drain contact is the upper surface 172A_US of the first contact molybdenum pattern. The upper surface 172A_US of the first contact molybdenum pattern includes a first concave region 172A_CV1, a second concave region 172A_CV2, and a convex region 172A_CX. The convex region 172A_CX is disposed between the first concave region 172A_CV1 and the second concave region 172A_CV2.

The upper surface 170_US of the source/drain contact includes the wedge region 170_WR defined in the first concave region 172A_CV1 and the second concave region 172A_CV2.

FIG. 26A shows that the source/drain via plug 180 fills the wedge region 170_WR. For example, the first via barrier pattern 181 fills the wedge region 170_WR. For example, the first via barrier pattern 181 fills the concave regions 172A_CV1 and 172A_CV2 of the upper surface 172A_US of the first contact molybdenum pattern.

Figure 26B:
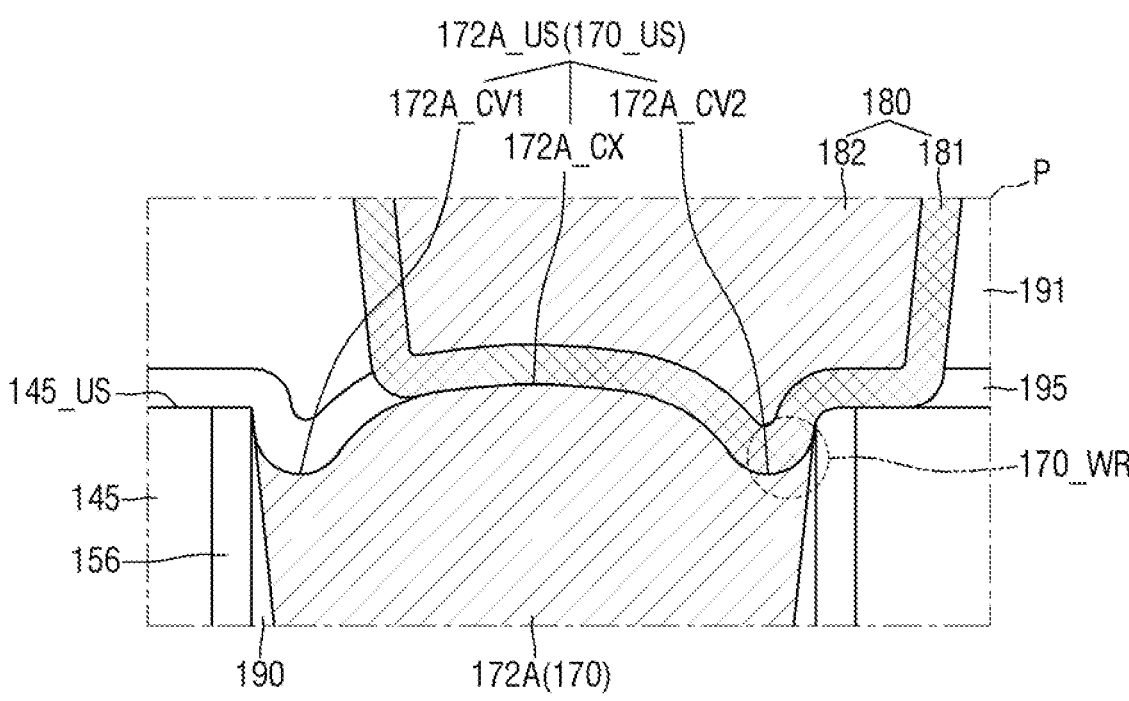
Figure 27:
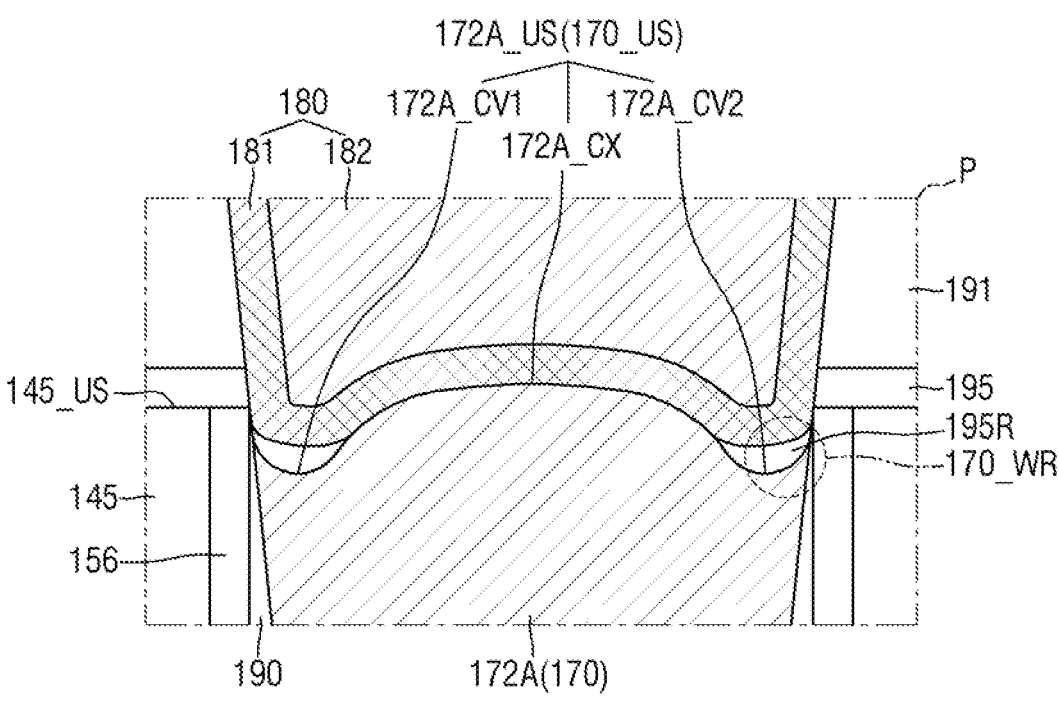

FIG. 26B shows that the source/drain via plug 181 is misaligned on the source/drain contact 170. The first via barrier pattern 181 fills the second concave region 172A_CV2 of the upper surface 172A_US of the first contact molybdenum pattern. However, the first via barrier pattern 181 does not fill the entire first concave region 172A_CV1 of the upper surface 172A_US of the first contact molybdenum pattern. For example, the first etch stop layer 195 fills the first concave region 172A_CV1 of the upper surface 172A_US of the first contact molybdenum pattern.

FIG. 27 shows that a remaining portion 195R of the first etch stop layer fills at least a part of the wedge region 170_WR. The concave regions 172A_CV1 and 172A_CV2 of the upper surface 172A_US of the first contact molybdenum pattern are covered by the remaining portion 195R of the first etch stop layer.

Figure 28:
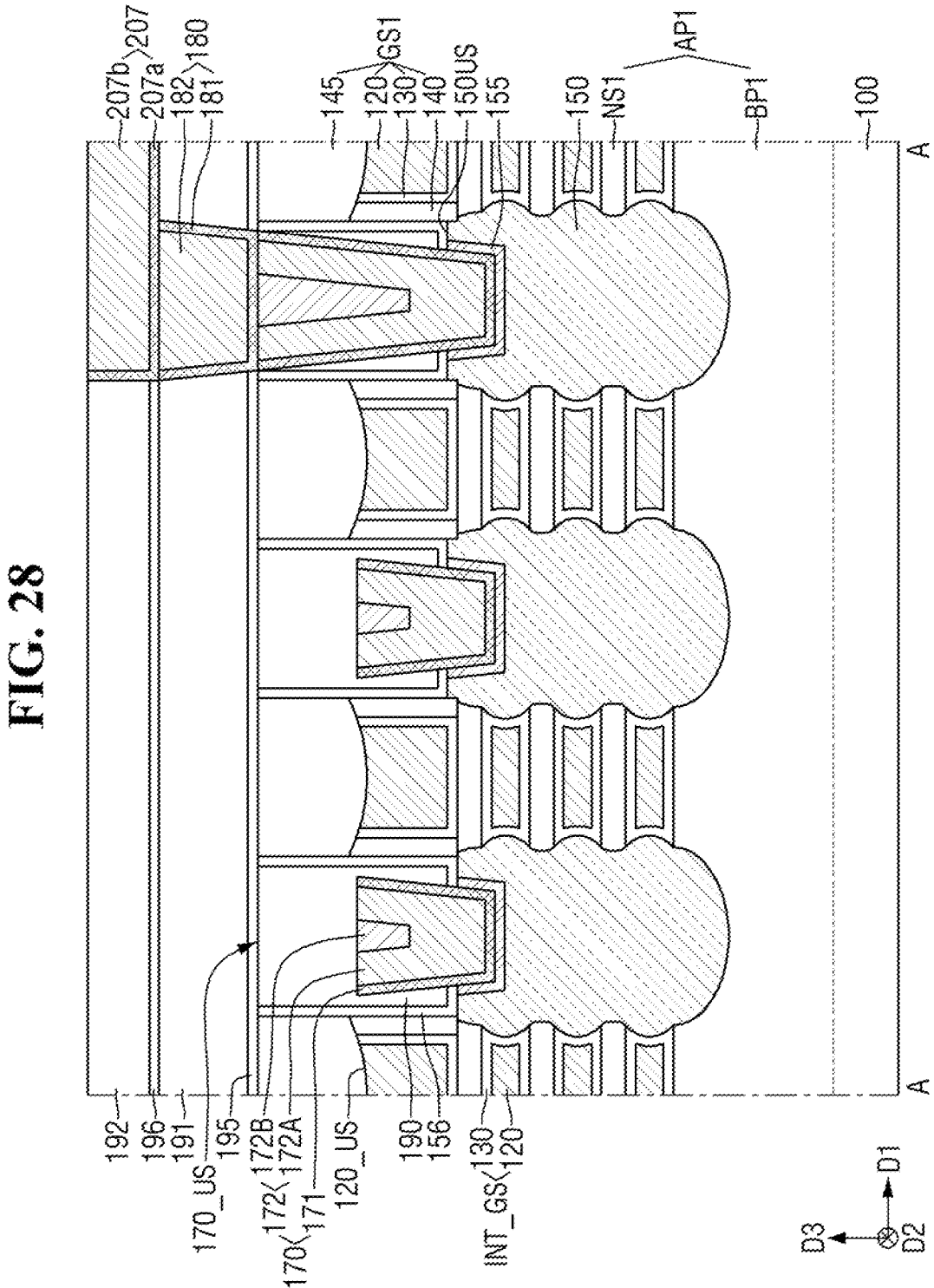
FIGS. 28 and 29 illustrate a semiconductor device according to some embodiments.
Figure 29:
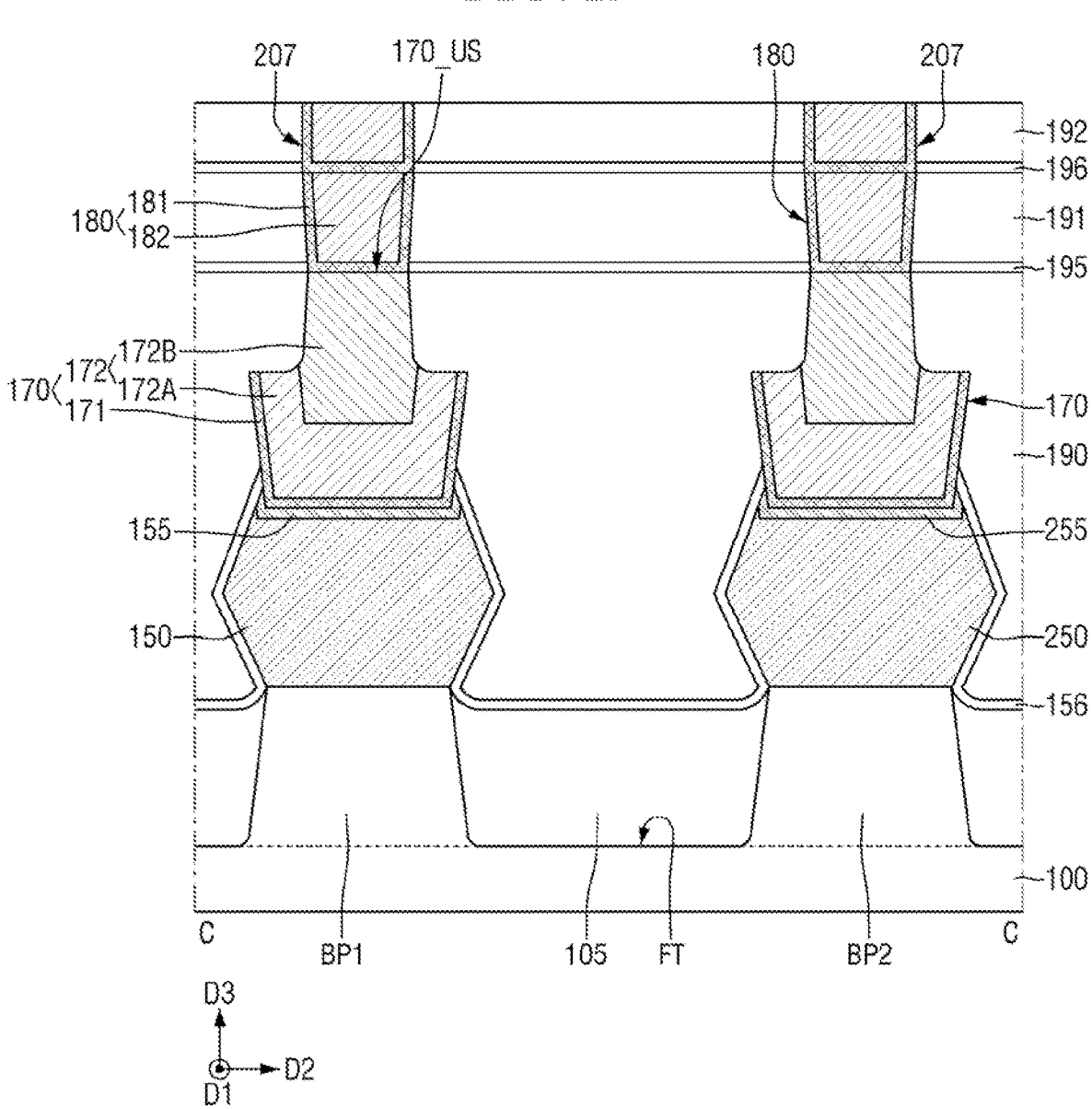
Figure 30:
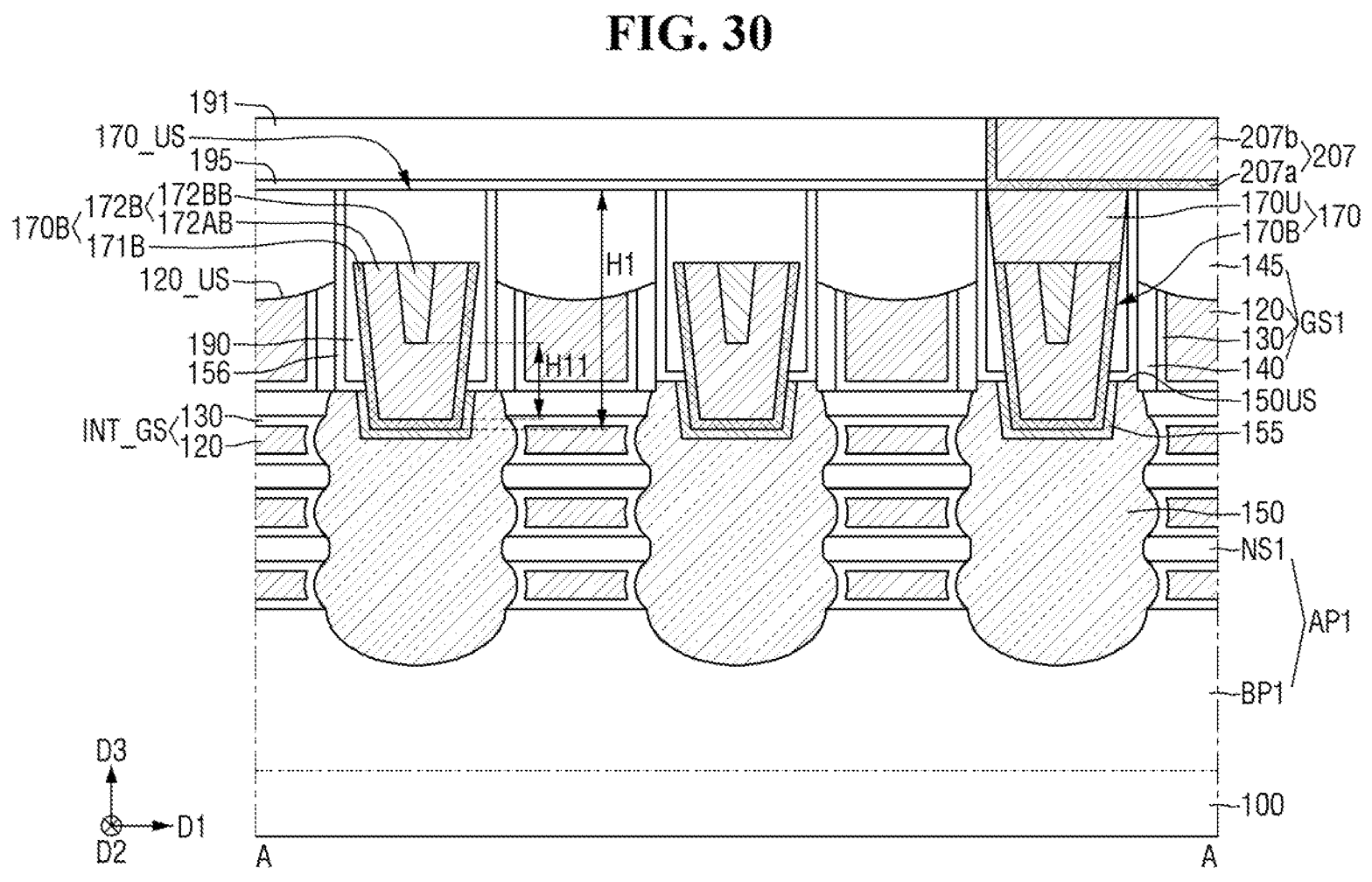
Figure 31:
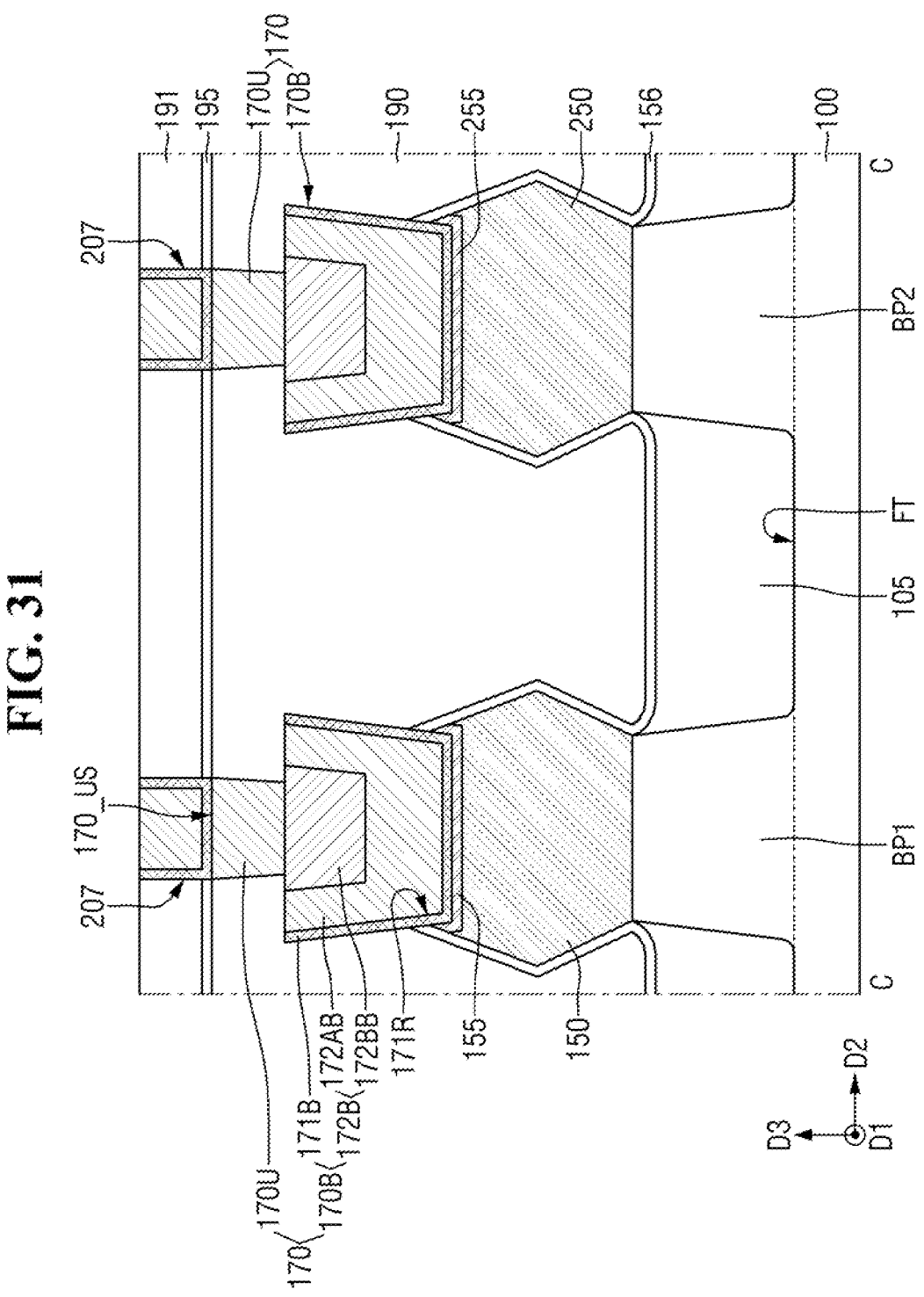
Figure 32:
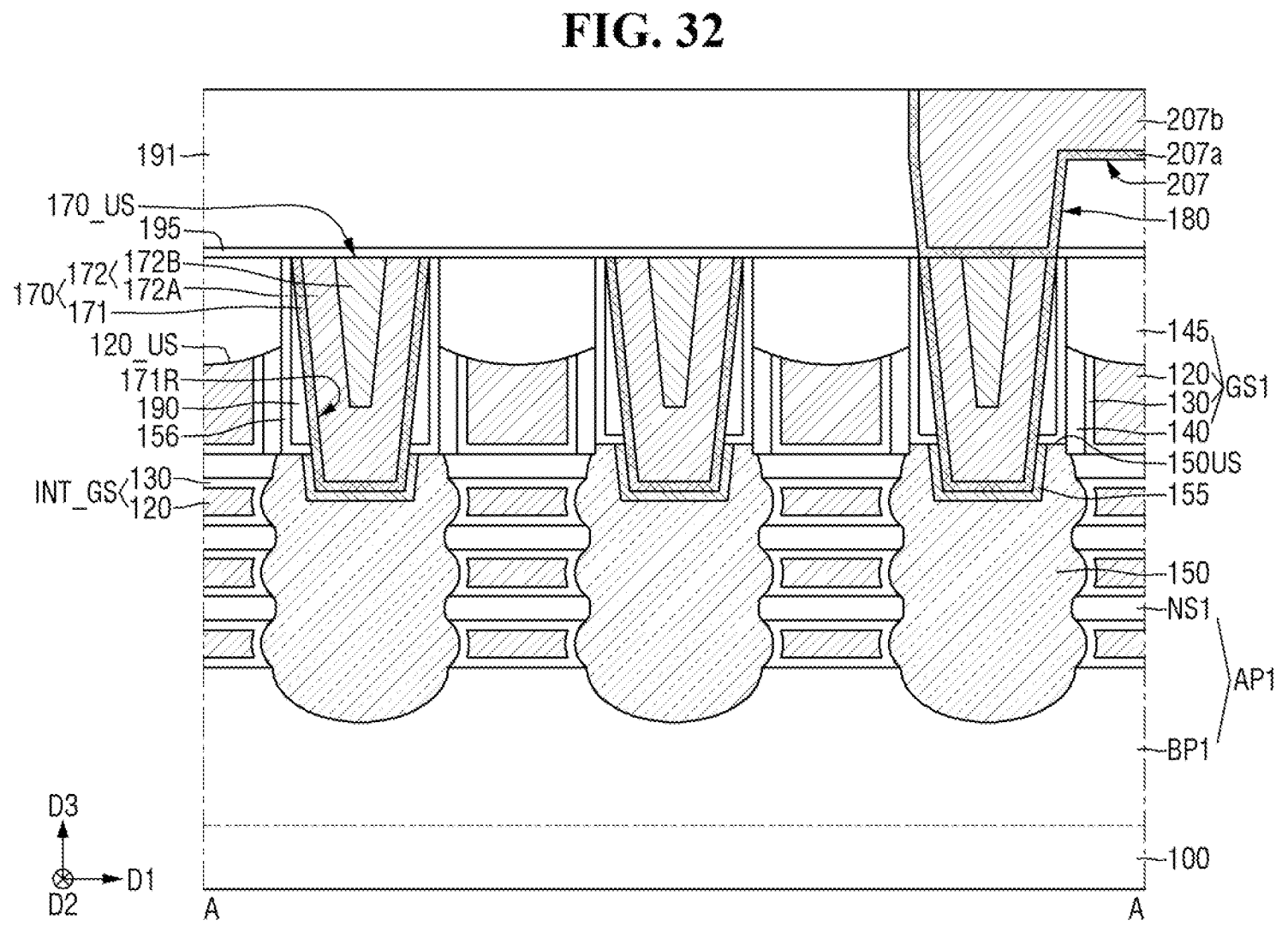

FIGS. 28 and 29 illustrate a semiconductor device according to some embodiments. FIGS. 30 and 31 illustrate a semiconductor device according to some embodiments. FIG. 32 illustrates a semiconductor device according to some embodiments. For simplicity of description, the following description will focus on differences from the description with reference to FIGS. 1 to 5B.

Referring to FIGS. 28 and 29, in a semiconductor device according to some embodiments, a part of the source/drain contact 170 is recessed in a portion not connected to the source/drain via plug 180.

The source/drain contact 170 includes a first portion and a second portion. The first portion of the source/drain contact 170 is directly connected to the second portion of the source/drain contact 170. The first portion of the source/drain contact 170 is located where the source/drain via plug 180 is located. The second portion of the source/drain contact 170 is located where the source/drain via plug 180 is not located.

The upper surface of the first portion of the source/drain contact 170 is higher than the upper surface of the second portion of the source/drain contact 170. The upper surface of the first portion of the source/drain contact 170 is higher than the upper surface of the second portion of the source/drain contact 170, based on the upper surface of the field insulating layer 105. For example, the upper surface 170_US of the source/drain contact is an upper surface of the first portion of the source/drain contact 170.

FIG. 29 shows that, depending on where the source/drain via plug 180 is located, the upper surface of the first portion of the source/drain contact 170 may be defined by the first contact molybdenum pattern 172A, or may be defined by the first contact molybdenum pattern 172A and the first contact tungsten pattern 172B. The cross-sectional shape of the first contact tungsten pattern 172B varies depending on where the source/drain via plug 180 is located.

The source/drain contact 170 is illustrated as having a T-shape rotated by 180 degrees, but embodiments are not necessarily limited thereto. In an embodiment, the source/drain contact 170 has an L-shape.

Referring to FIGS. 30 and 31, in a semiconductor device according to some embodiments, the source/drain contact 170 includes a lower source/drain contact 170B and an upper source/drain contact 170U.

The lower source/drain contact 170B includes a lower contact barrier pattern 171B and a lower contact plug metal pattern 172B. The lower contact plug metal pattern 172B includes a lower contact molybdenum pattern 172AB and a lower contact tungsten pattern 172BB. Based on the upper surface of the first active pattern AP1, the upper surface of the lower source/drain contact 170B is higher than the upper surface 120_US of the first gate electrode, but embodiments of the present disclosure are not necessarily limited thereto.

A height H11 of the lower contact molybdenum pattern 172AB is measured from the lowermost portion of the lower contact molybdenum pattern 172AB to the lowermost portion of the lower contact tungsten pattern 172BB. The height H1 of the source/drain contact 170 is the sum of the height of the lower source/drain contact 170B and the height of the upper source/drain contact 170U. The height H11 of the lower contact molybdenum pattern 172AB is greater than or equal to ⅓ of the height H1 of the source/drain contact 170.

The material included in the lower contact barrier pattern 171B is the same as the material of the first contact barrier pattern 171. The material included in the lower contact plug metal pattern 172B is the same as the material of the first contact plug metal pattern 172.

The upper source/drain contact 170U is disposed on the lower source/drain contact 170B. The upper source/drain contact 170U includes the upper surface 170_US of the source/drain contact. The upper source/drain contact 170U includes a conductive material. Although the upper source/drain contact 170U is illustrated as being a single layer, this is for simplicity of description and embodiments of the present disclosure are not necessarily limited thereto.

The upper source/drain contact 170U is connected to the wiring line 207 without the source/drain via plug 180 (see FIG. 2). The upper source/drain contact 170U is disposed at a portion connected to the wiring line 207. In addition, the gate contact 175 (see FIG. 3) is also connected to the wiring line 207 without the gate via plug 185 (see FIG. 3). For example, the wiring line 207 is disposed in the second interlayer insulating layer 191 and the first etch stop layer 195.

In addition, in some embodiments, the source/drain via plug 180 (see FIG. 2) is disposed between the upper source/drain contact 170U and the wiring line 207. The gate via plug 185 (see FIG. 3) is disposed between the gate contact 175 and the wiring line 207.

Referring to FIG. 32, in a semiconductor device according to some embodiments, the source/drain via plug 180 and the first wiring line 207 have an integral structure. For example, the source/drain via plug 180 is integrally formed with the first wiring line 207

Similar to the first wiring line 207, the source/drain via plug 180 includes the lower wiring barrier layer 207a and the lower wiring filling layer 207b.

Figure 33:
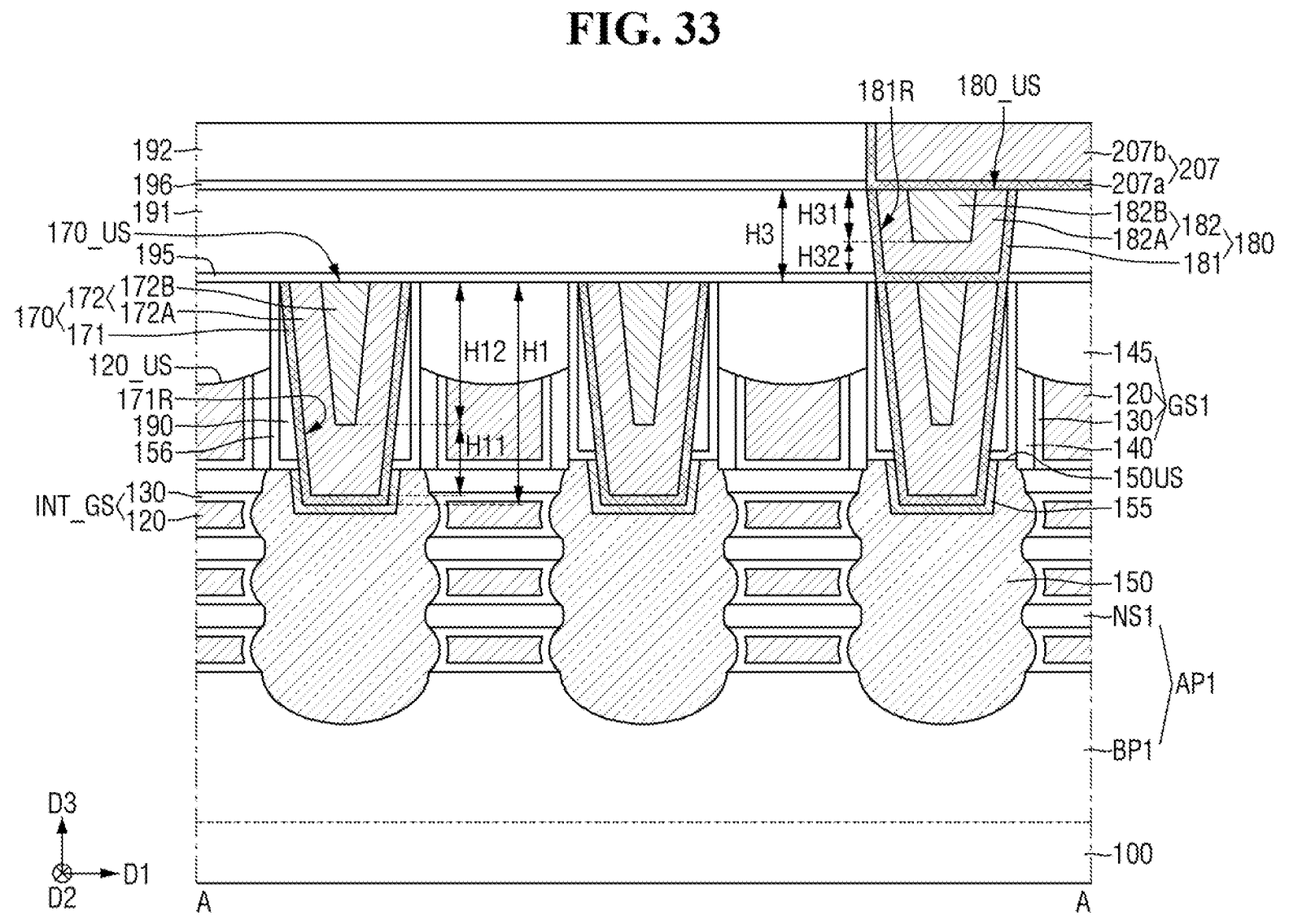
Figure 34:
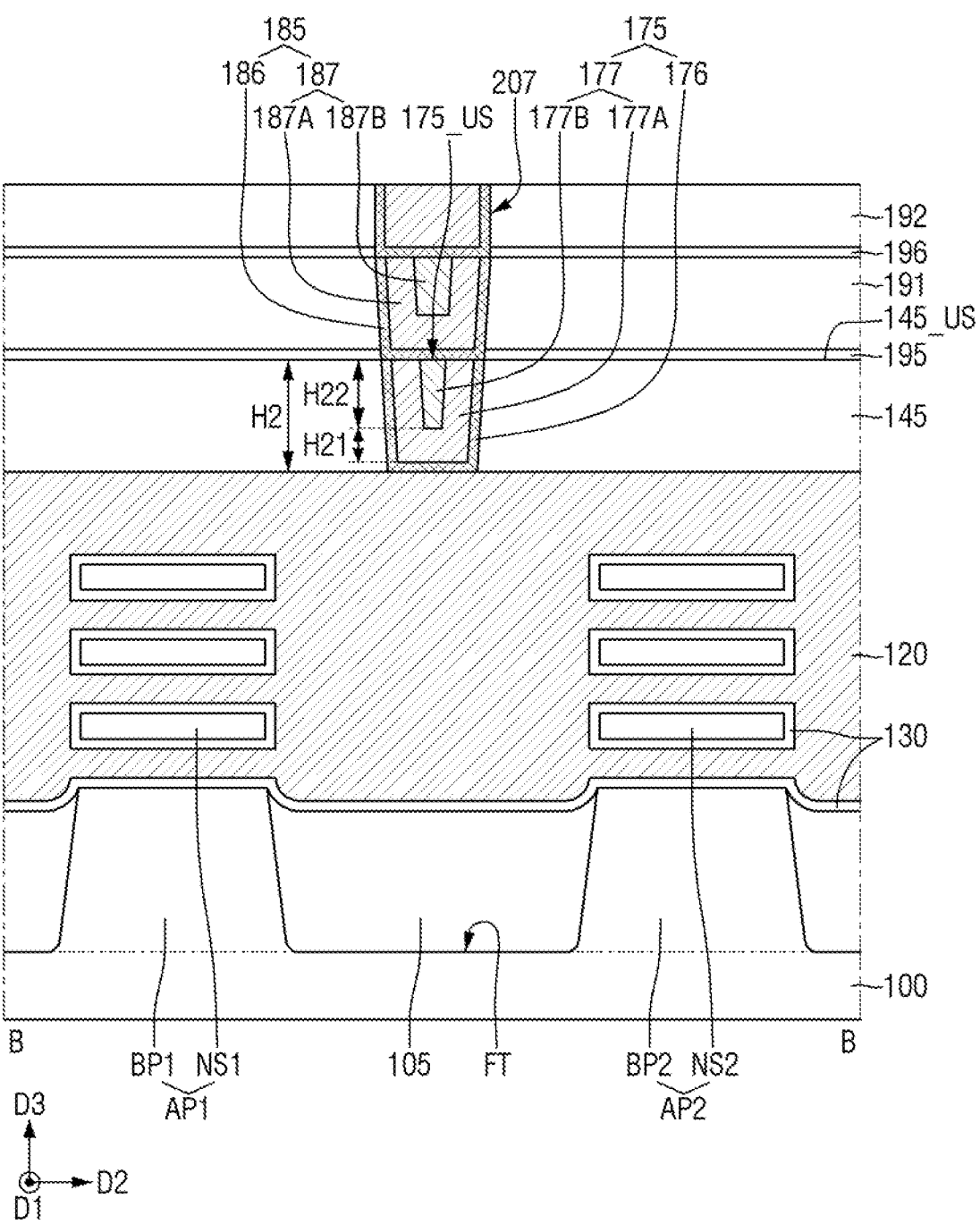

FIGS. 33 and 34 illustrate a semiconductor device according to some embodiments. For simplicity of description, the following description will focus on differences from the description with reference to FIGS. 1 to 5B.

Referring to FIGS. 33 and 34, in a semiconductor device according to some embodiments, the first via plug metal pattern 182 includes a first via molybdenum pattern 182A and a first via tungsten pattern 182B.

The first via tungsten pattern 182B is disposed on the first via molybdenum pattern 182A. The first via molybdenum pattern 182A is disposed between the first via barrier pattern 181 and the first via tungsten pattern 182B. The first via molybdenum pattern 182A is formed along the profile of a via plug recess 181R defined by the first via barrier pattern 181. The first via molybdenum pattern 182A is in contact with the first via barrier pattern 181 and the first via tungsten pattern 182B.

In a semiconductor device according to some embodiments, the first via molybdenum pattern 182A includes a bottom portion and a sidewall portion. The sidewall portion of the first via molybdenum pattern 182A surrounds the sidewall of the first via tungsten pattern 182B. The bottom portion of the first via molybdenum pattern 182A extends along the upper surface 170_US of the source/drain contact.

The second via plug metal pattern 187 includes a second via molybdenum pattern 187A and a second via tungsten pattern 187B. The second via molybdenum pattern 187A is disposed between the second via barrier pattern 186 and the second via tungsten pattern 187B. The second via molybdenum pattern 187A is formed along a profile of the via plug recess defined by the second via barrier pattern 186. The second via molybdenum pattern 187A is in contact with the second via barrier pattern 186 and the second via tungsten pattern 187B. The sidewall portion of the second via molybdenum pattern 187A surrounds the sidewall of the second via tungsten pattern 187B.

The first via molybdenum pattern 182A and the second via molybdenum pattern 187A include molybdenum (Mo). The first via molybdenum pattern 182A and the second via molybdenum pattern 187A are molybdenum layers. The first via tungsten pattern 182B and the second via tungsten pattern 187B include tungsten (W). The first via tungsten pattern 182B and the second via tungsten pattern 187B are tungsten layers.

For example, the source/drain contact 170 and the gate contact 175 are lower conductive patterns. The source/drain via plug 180 and the gate via plug 185 are plug patterns connected to the source/drain contact 170 and the gate contact 175.

Since the source/drain via plug 180 and the gate via plug 185 can be simultaneously formed, the following description will focus on the source/drain via plug 180.

In FIG. 33, a height H3 of the source/drain via plug 180 is measured from the lowermost portion of the source/drain via plug 180 to an upper surface 180_US of the source/drain via plug. For example, a height H32 of the first via molybdenum pattern 182A is measured from the lowermost portion of the first via molybdenum pattern 182A to the lowermost portion of the first via tungsten pattern 182B. A height H31 of the first via tungsten pattern 182B may be measured from the lowermost portion of the first via tungsten pattern 182B to the upper surface 180_US of the source/drain via plug.

For example, a thickness H3-H31-H32 of the first via barrier pattern 181 is less than ¹⁄₁₀ of the height H3 of the source/drain via plug 180. A height H31+H32 of the first via plug metal pattern 182 is greater than or equal to ⁹⁄₁₀ of the height H3 of the source/drain via plug 180. The height H32 of the first via molybdenum pattern 182A is at least twice the thickness H3-H31-H32 of the first via barrier pattern 181.

The volume of the first via molybdenum pattern 182A is less than or equal to the volume of the first via tungsten pattern 182B. For example, the height H32 of the first via molybdenum pattern 182A is less than or equal to ½ of the height H3 of the source/drain via plug 180. The height H31 of the first via tungsten pattern 182B is equal to or greater than ½ of the height H3 of the source/drain via plug 180.

For example, the ratio of the height H31 of the first via tungsten pattern 182B to the height H3 of the source/drain via plug 180 is greater than or equal to the ratio of the height H12 of the first contact tungsten pattern 172B to the height H1 of the source/drain contact 170.

The source/drain via plug 180 needs more thermal stability than that of the source/drain contact 170. Accordingly, the ratio of the tungsten layer in the source/drain via plug 180 is higher than the ratio of the tungsten layer in the source/drain contact 170.

The shape of the upper surface 180_US of the source/drain via plug is similar to one of the upper surfaces 170_US of the source/drain contact shown in FIGS. 5A to 9.

However, in some embodiments, the first via plug metal pattern 182 covers the upper surface of the first via barrier pattern 181.

Figure 39:
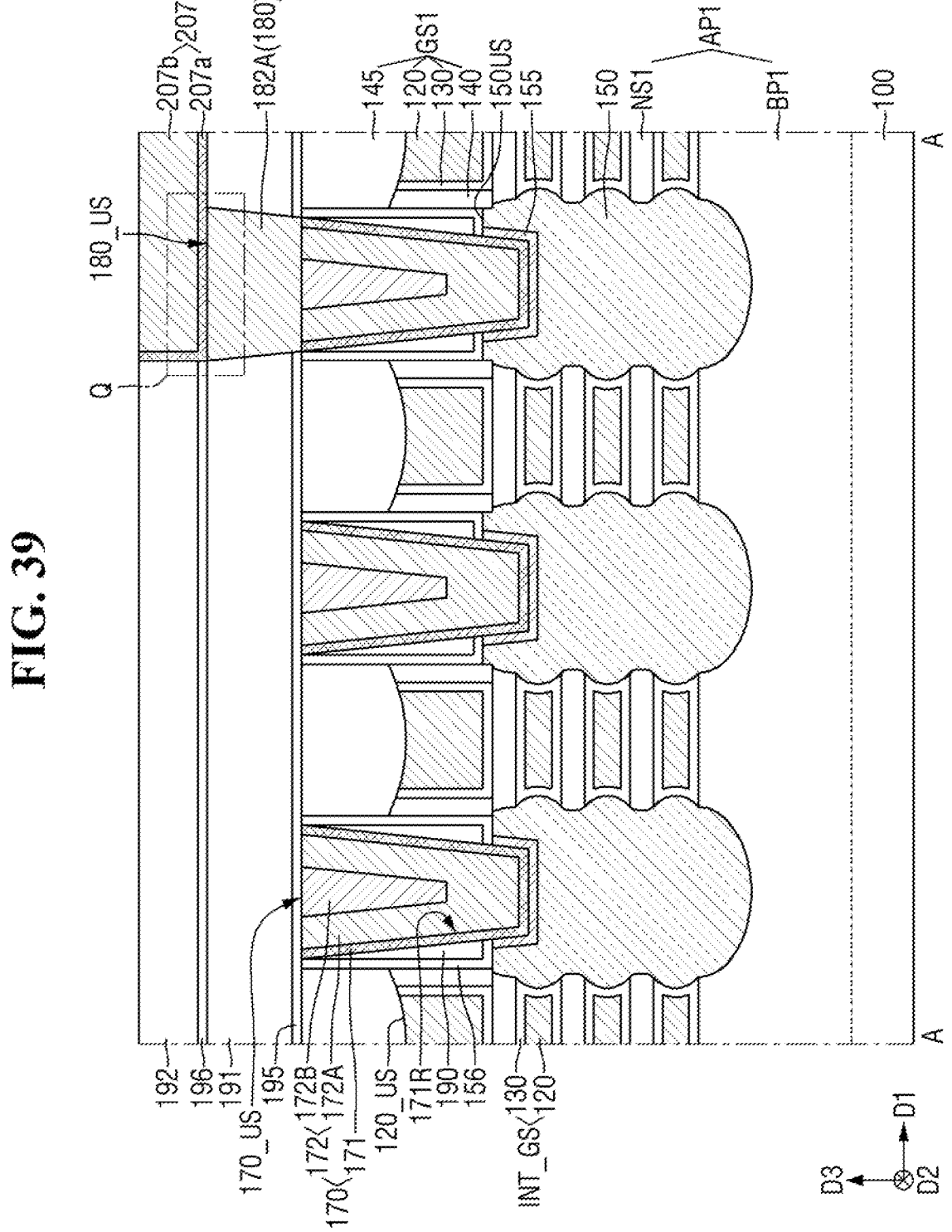
FIGS. 39 and 40 illustrate a semiconductor device according to some embodiments.
Figure 40:
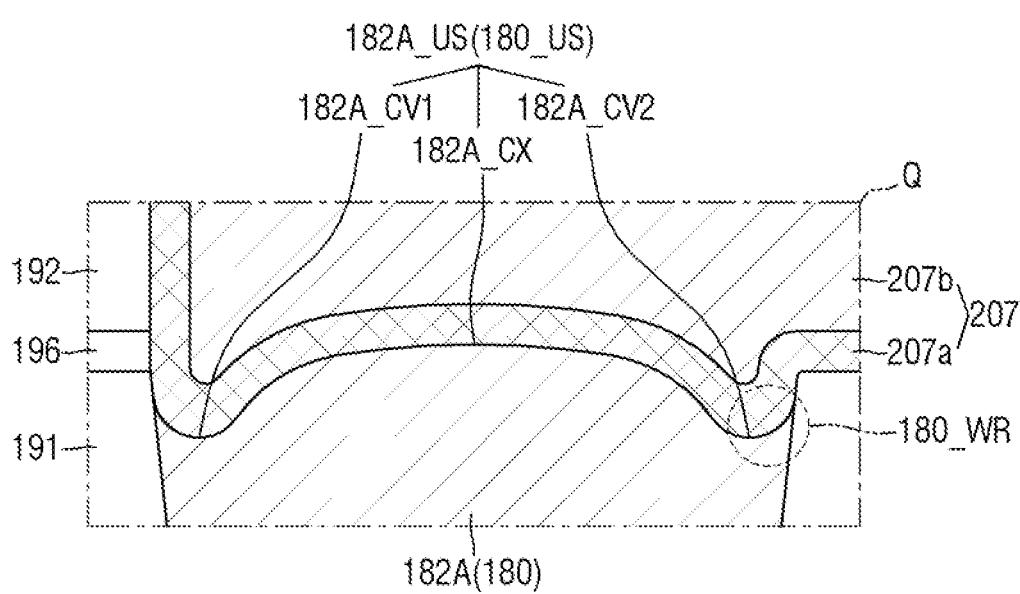
Figure 41:
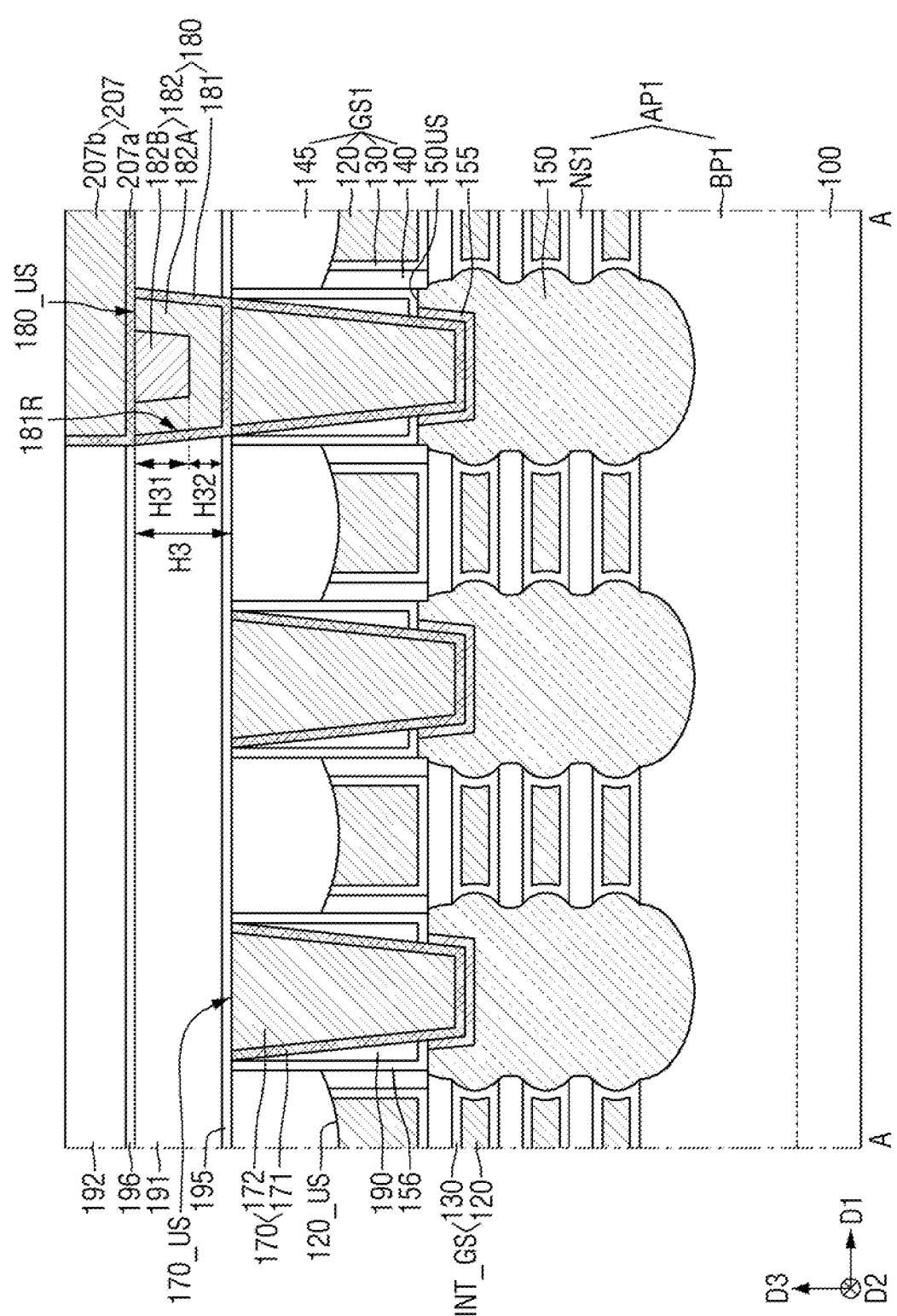
Figure 42:
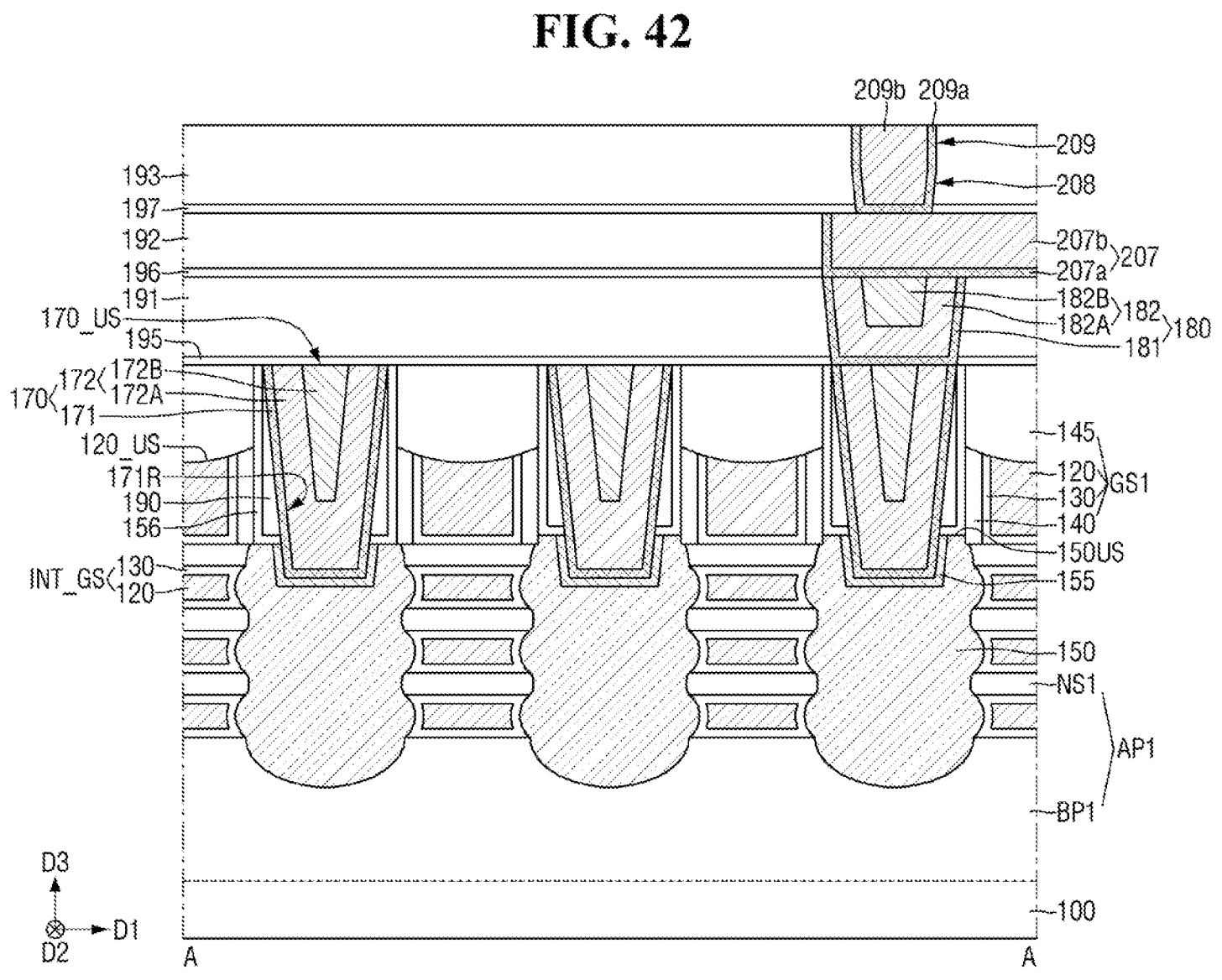

FIGS. 35 to 38 illustrate a semiconductor device according to some embodiments. FIGS. 39 and 40 illustrate a semiconductor device according to some embodiments. FIGS. 41 and 42 illustrate a semiconductor device according to some embodiments. For simplicity of description, the following description will focus on differences from the description with reference to FIGS. 33 and 34.

The description of the source/drain via plug 180 also applies to the gate via plug 185 (see FIG. 34). FIG. 40 is an enlarged view of portion Q of FIG. 39.

Figure 35:
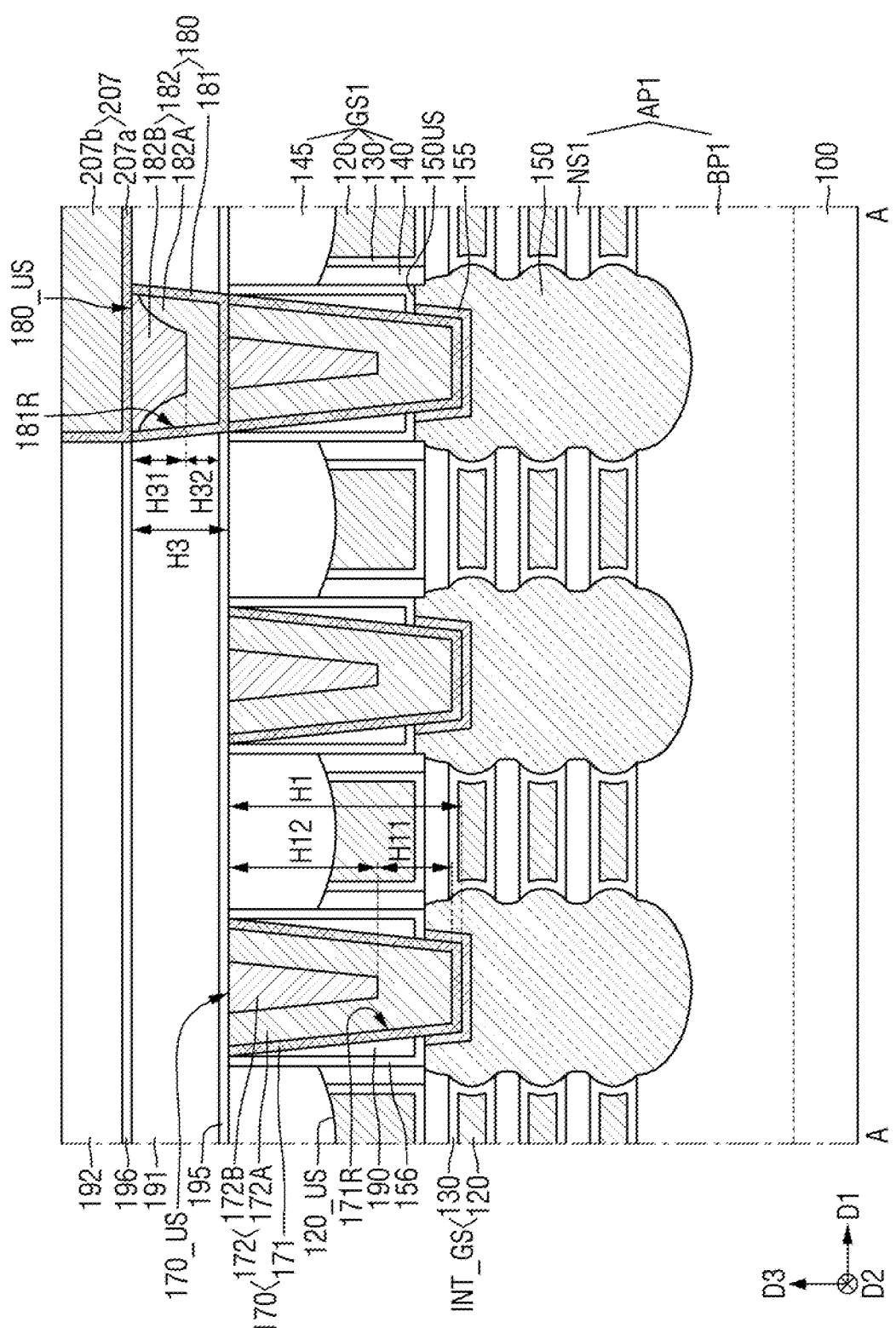

Referring to FIG. 35, in an embodiment, the upper surface 180_US of the source/drain via plug is defined by the first via barrier pattern 181 and the first via tungsten pattern 182B.

The width of the sidewall portion of the first via molybdenum pattern 182A in the first direction D1 decreases with increasing distance from the bottom portion of the first via molybdenum pattern 182A.

Figure 36:
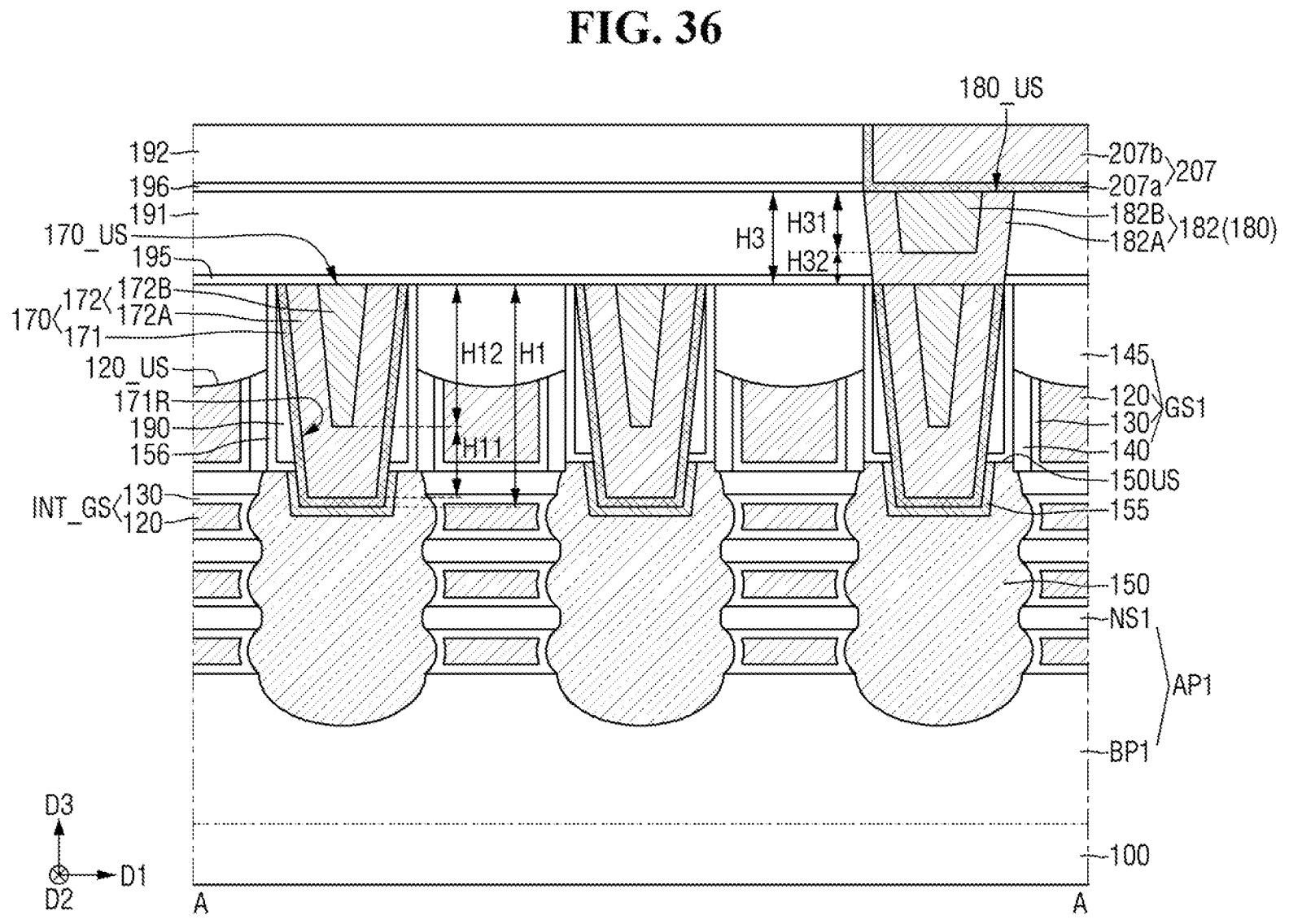

Referring to FIG. 36, in a semiconductor device according to some embodiments, the source/drain via plug 180 includes the first via plug metal pattern 182 without the first via barrier pattern 181 (see FIG. 33).

The source/drain via plug 180 includes the first via molybdenum pattern 182A and the first via tungsten pattern 182B without the first via barrier pattern 181. The sidewall of the first via molybdenum pattern 182A is in contact with the second interlayer insulating layer 191.

The height H3 of the source/drain via plug 180 is equal to the sum of the height H32 of the first via molybdenum pattern 182A and the height H31 of the first via tungsten pattern 182B. The height H31 of the first via tungsten pattern 182B is equal to or greater than ½ of the height H3 of the source/drain via plug 180.

Figure 37:
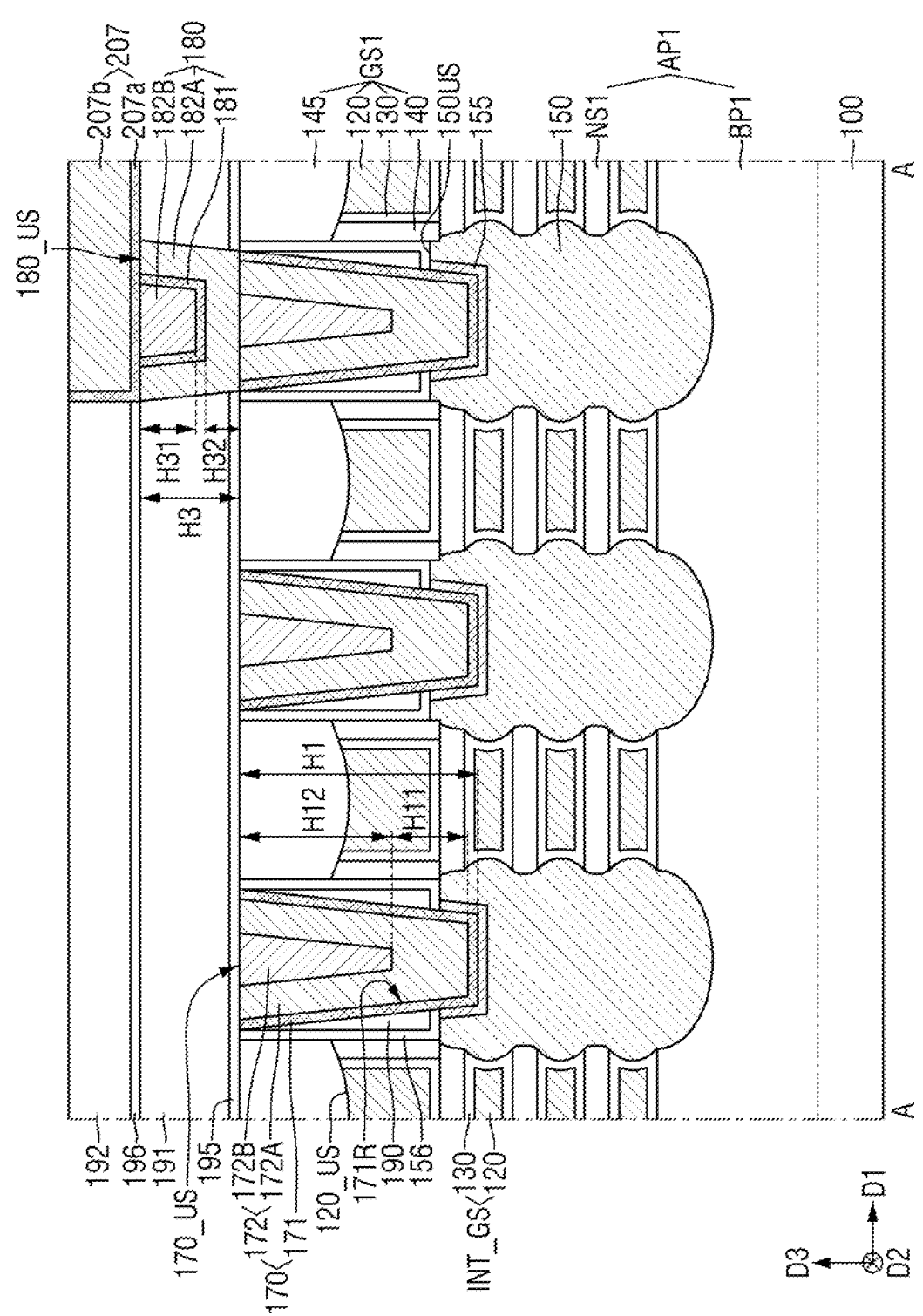

Referring to FIG. 37, in an embodiment, the source/drain via plug 180 includes the first via molybdenum pattern 182A, the first via barrier pattern 181, and the first via tungsten pattern 182B sequentially stacked on the source/drain contact 170.

The first via barrier pattern 181 is disposed between first via molybdenum pattern 182A and the first via tungsten pattern 182B. The first via barrier pattern 181 is in contact with the first via molybdenum pattern 182A and the first via tungsten pattern 182B. The first via molybdenum pattern 182A is in contact with the source/drain contact 170.

Figure 38:
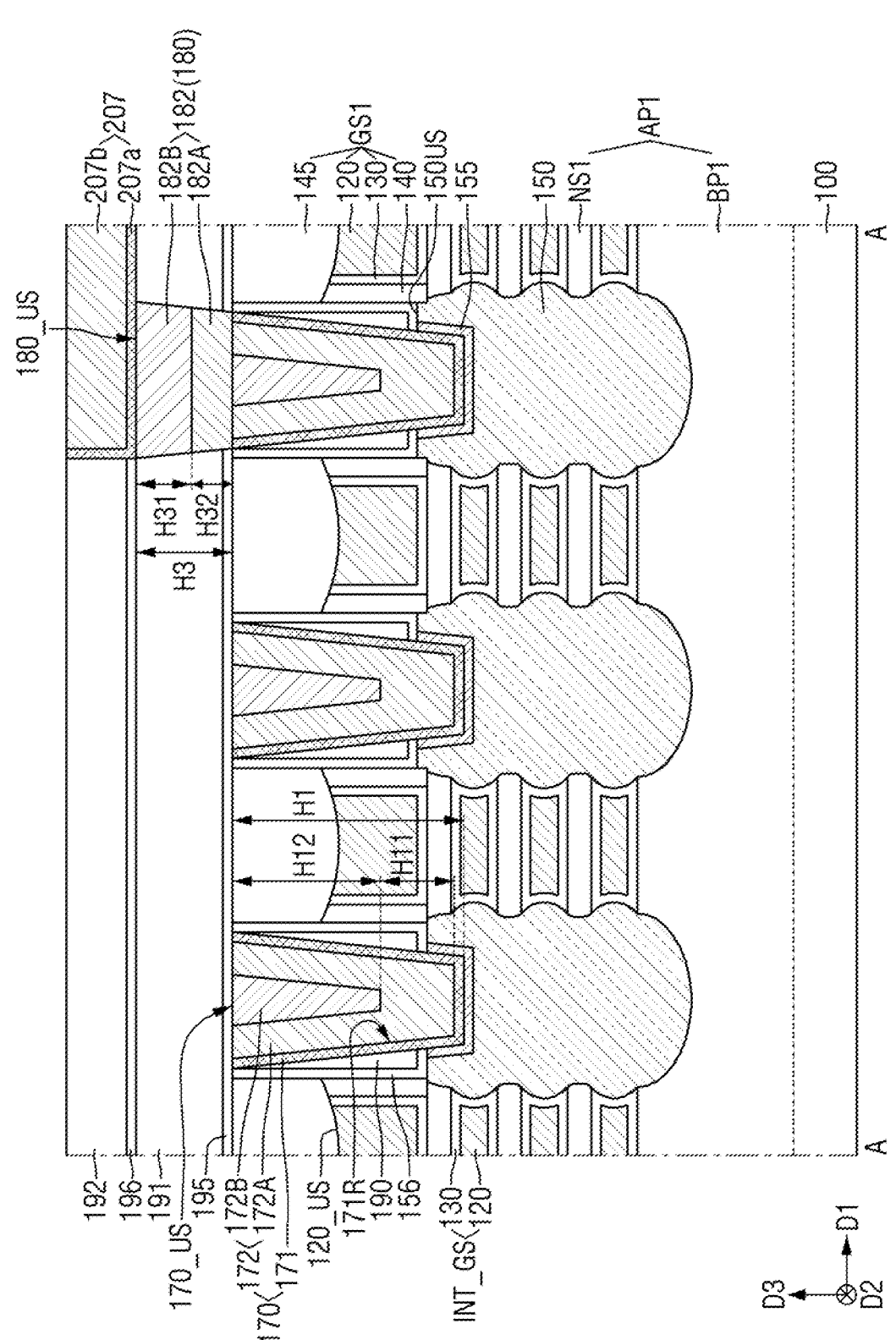

Referring to FIG. 38, in a semiconductor device according to some embodiments, the first via molybdenum pattern 182A does not include the sidewall portion that extends along the sidewall of the first via tungsten pattern 182B.

The source/drain via plug 180 does not include the first via barrier pattern 181 (see FIG. 33).

However, in some embodiment, as shown in FIG. 24, the source/drain via plug 180 includes the first via barrier pattern 181 that covers the entire upper surface of the first via molybdenum pattern 182A.

Referring to FIGS. 39 and 40, in some embodiments, the source/drain via plug 180 includes only the first via molybdenum pattern 182A.

The source/drain via plug 180 is a molybdenum layer. The sidewall of the first via molybdenum pattern 182A is in contact with the second interlayer insulating layer 191.

The upper surface 180_US of the source/drain via plug is a upper surface 182A_US of the first via molybdenum pattern. The upper surface 182A_US of the first via molybdenum pattern includes a first concave region 182A_CV1, a second concave region 182A_CV2, and a convex region 182A_CX. The convex region 182A_CX is disposed between the first concave region 182A_CV1 and the second concave region 182A_CV2.

The upper surface 180_US of the source/drain via plug includes a wedge region 180_WR defined in the first concave region 182A_CV1 and the second concave region 182A_CV2. The first wiring line 207 fills the wedge region 180_WR.

However, in some embodiments, a part of the second etch stop layer 196 fills at least a part of the wedge region 180_WR.

Referring to FIG. 41, in a semiconductor device according to some embodiments, the first contact plug metal pattern 172 is a single layer.

The structure of the stacked conductive layer of the first contact plug metal pattern 172 differs from the structure of the stacked conductive layer of the first via plug metal pattern 182.

For example, the first contact plug metal pattern 172 includes one of a tungsten pattern or a molybdenum pattern. For example, the second contact plug metal pattern 177 includes one of a tungsten layer or a molybdenum layer.

Referring to FIG. 42, a semiconductor device according to some embodiments further includes a wiring via plug 208 and a second wiring line 209 disposed on the first wiring line 207.

A third etch stop layer 197 is disposed between the third interlayer insulating layer 192 and a fourth interlayer insulating layer 193. The third etch stop layer 197 extends along the upper surface of the third interlayer insulating layer 192.

The wiring via plug 208 and the second wiring line 209 are disposed in the fourth interlayer insulating layer 193 and the third etch stop layer 197. The wiring via plug 208 and the second wiring line 209 have an integral structure. For example, the wiring via plug 208 is integrally formed with the second wiring line 209. The wiring via plug 208 and the second wiring line 209 include an upper wiring barrier layer 209a and an upper wiring filling layer 209b. The material included in the upper wiring barrier layer 209a is the same as the material of the lower wiring barrier layer 207a. The material included in the upper wiring filling layer 209b is the same as the material of the lower wiring filling layer 207b.

Although FIG. 42 shows that the wiring via plug 208 is in contact with the first wiring line 207, this is for simplicity of description, and embodiments of the present disclosure are not necessarily limited thereto. In some embodiments, one or more wiring lines are additionally disposed between the wiring via plug 208 and the first wiring line 207.

Figure 43:
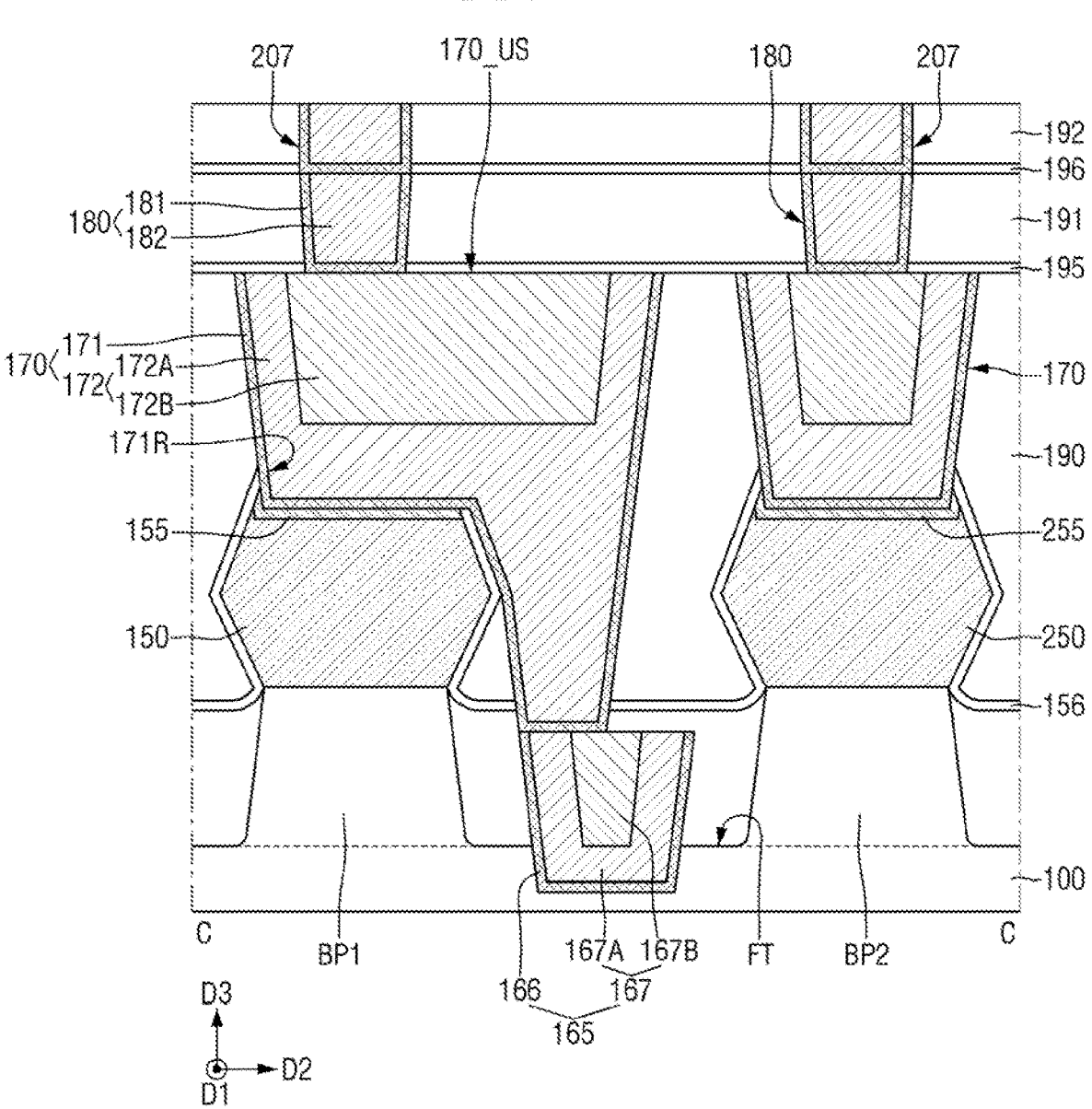
FIGS. 43 and 44 illustrate a semiconductor device according to some embodiments.
Figure 44:
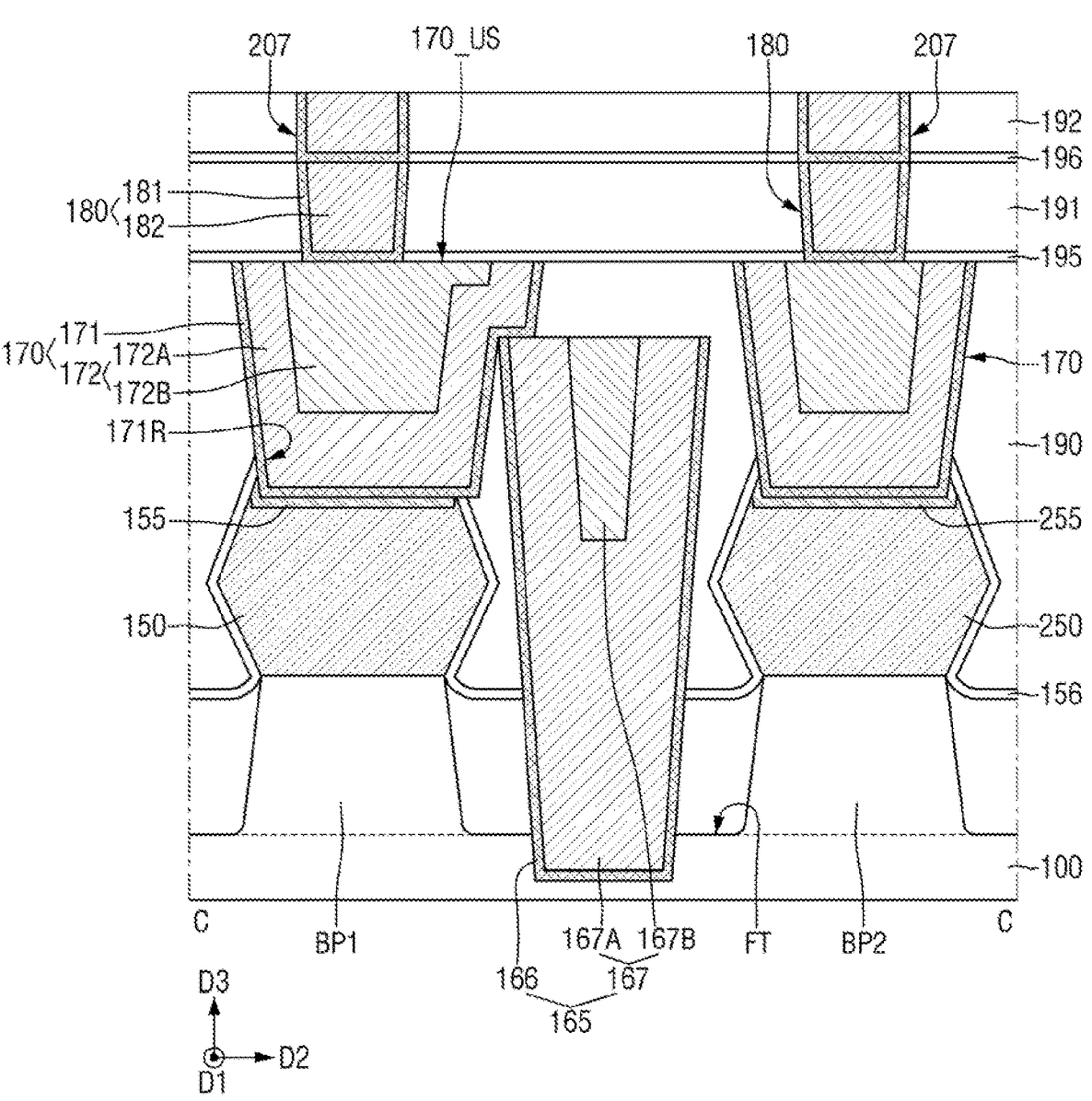

FIGS. 43 and 44 illustrate a semiconductor device according to some embodiments. For simplicity of description, the following description will focus on differences from the description with reference to FIGS. 1 to 5B.

Referring to FIGS. 43 and 44, a semiconductor device according to some embodiments further includes a buried via plug 165.

The buried via plug 165 is disposed between the first lower pattern BP1 and the second lower pattern BP2. At least a part of the buried via plug 165 is buried in the substrate 100. The buried via plug 165 is connected to the source/drain contact 170.

FIG. 43 shows that the buried via plug 165 is disposed in the substrate 100 and the field insulating layer 105. A part of the buried via plug 165 is disposed in the substrate 100. The field insulating layer 105 covers the remainder of the buried via plug 165. The field insulating layer 105 covers the upper surface of the buried via plug 165.

FIG. 44 shows that the buried via plug 165 is disposed in the substrate 100, the field insulating layer 105, and the first interlayer insulating layer 190. A part of the buried via plug 165 protrudes in the third direction D3 above the upper surface of the field insulating layer 105.

The buried via plug 165 includes a buried barrier pattern 166 and a buried plug metal pattern 167. The buried plug metal pattern 167 is disposed on the buried barrier pattern 166. The buried plug metal pattern 167 fills a buried plug recess defined by the buried barrier pattern 166.

The buried plug metal pattern 167 includes a buried molybdenum pattern 167A and a buried tungsten pattern 167B. The buried tungsten pattern 167B is disposed on the buried molybdenum pattern 167A. The buried molybdenum pattern 167A is disposed between the buried barrier pattern 166 and the buried tungsten pattern 167B. For example, the buried molybdenum pattern 167A is in contact with the buried barrier pattern 166 and the buried tungsten pattern 167B.

The buried barrier pattern 166 includes at least one of, for example, tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Jr), or rhodium (Rh). The figures show that each of the buried barrier patterns 166 is a single layer, but embodiments are not necessarily limited thereto. The buried molybdenum pattern 167A includes molybdenum (Mo). The buried molybdenum pattern 167A is a molybdenum layer. The buried tungsten pattern 167B includes tungsten (W). The buried tungsten pattern 167B is a tungsten layer.

However, in some embodiments, the buried via plug 165 does not include the buried barrier pattern 166.

In addition, to electrically insulate the buried via plug 165 from the substrate 100, a buried via insulating layer extends along the sidewall of the buried via plug 165.

The substrate 100 includes a frontside and a backside. The first gate electrode 120 and the source/drain contact 170 are disposed on the frontside of the substrate 100. In addition, a semiconductor device according to some embodiments further includes a connection through via disposed in the substrate 100. The connection through via extends from the backside of the substrate 100 toward the frontside of the substrate 100.

Figure 45:
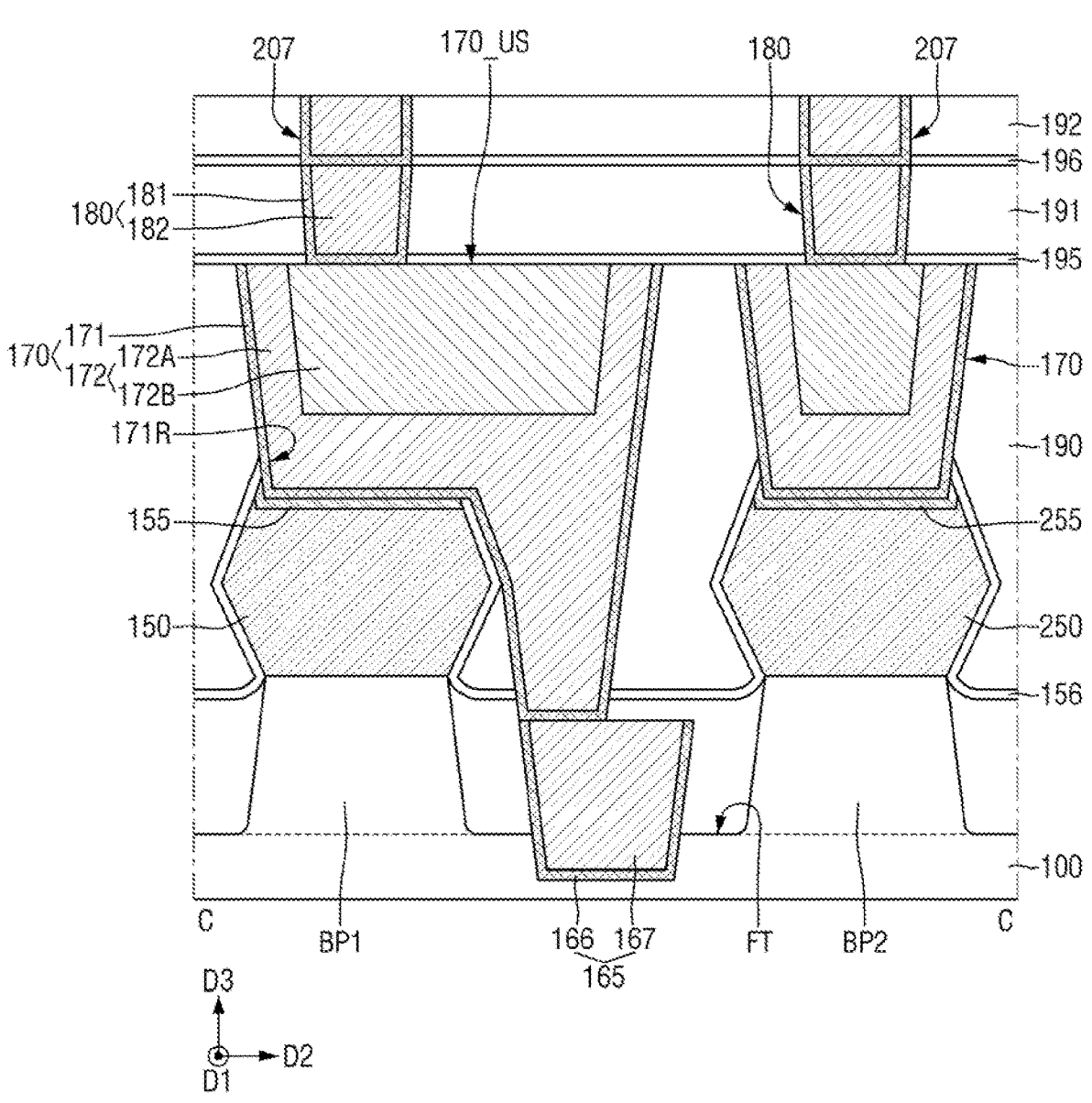
FIGS. 45 and 46 illustrate a semiconductor device according to some embodiments.
Figure 46:
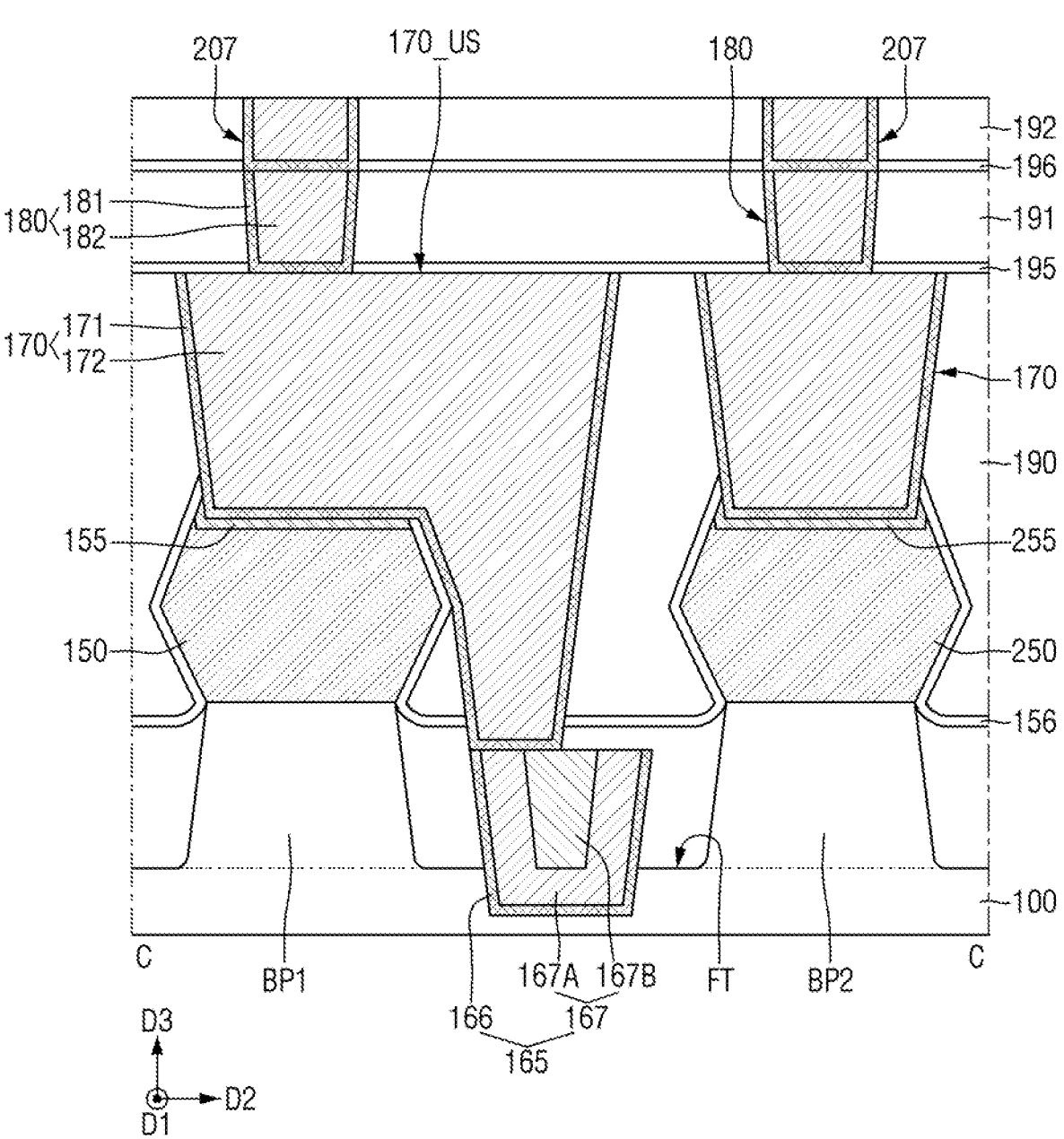

FIGS. 45 and 46 illustrate a semiconductor device according to some embodiments. For simplicity of description, the following description will focus on differences from the description with reference to FIG. 43.

Unlike the illustrated example, the buried via plug 165 as shown in FIG. 44 may be disposed in FIGS. 45 and 46.

Referring to FIG. 45, in a semiconductor device according to some embodiments, the buried plug metal pattern 167 is a single layer.

The buried plug metal pattern 167 includes one of aluminum (Al), tungsten (W), cobalt (Co), copper (Cu), ruthenium (Ru), silver (Ag), gold (Au), manganese (Mn), or molybdenum (Mo).

Referring to FIG. 46, in a semiconductor device according to some embodiments, the first contact plug metal pattern 172 is a single layer.

For example, the first contact plug metal pattern 172 includes one of a tungsten pattern or a molybdenum pattern.

Figure 47:
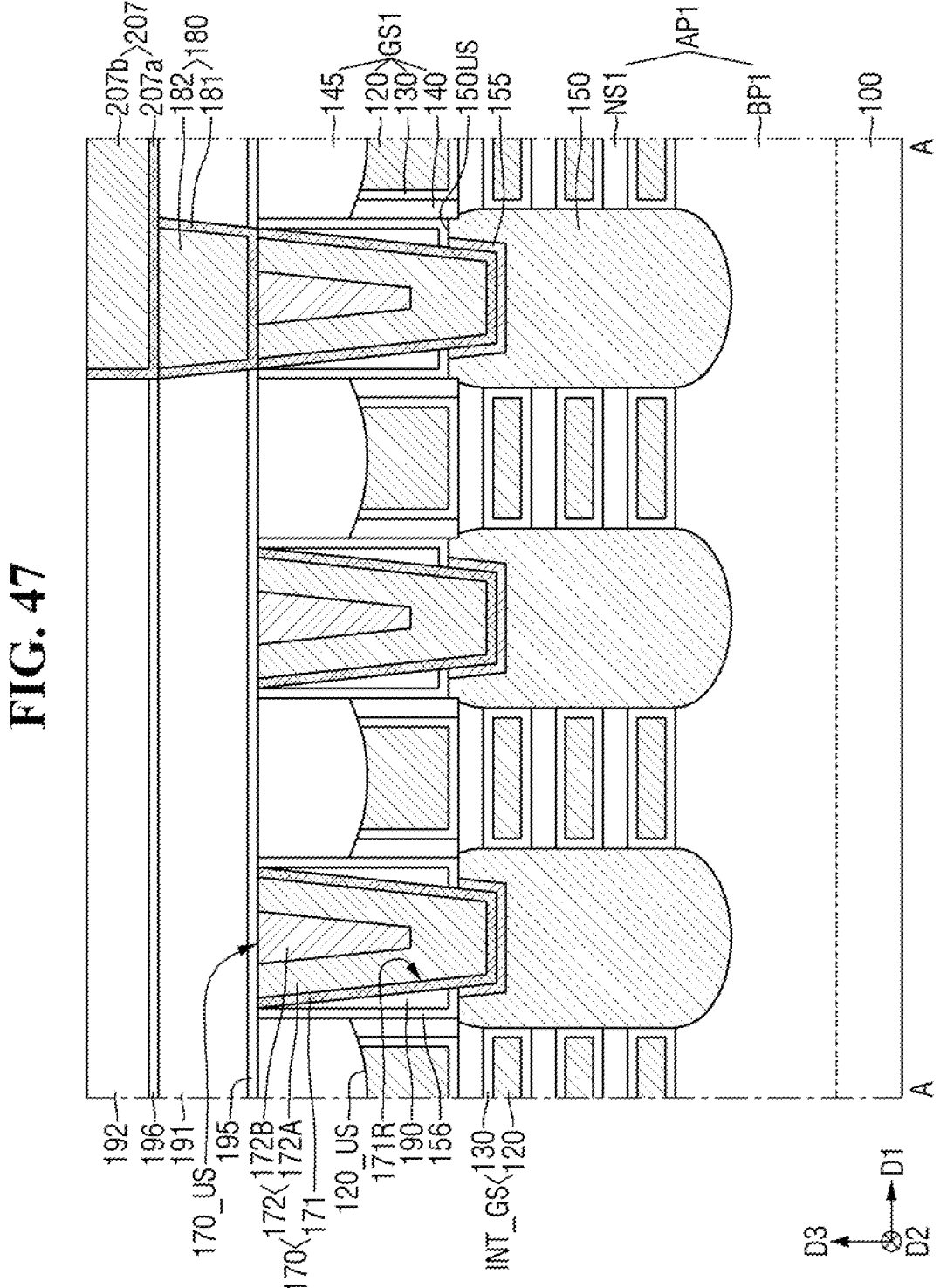
Figure 48:
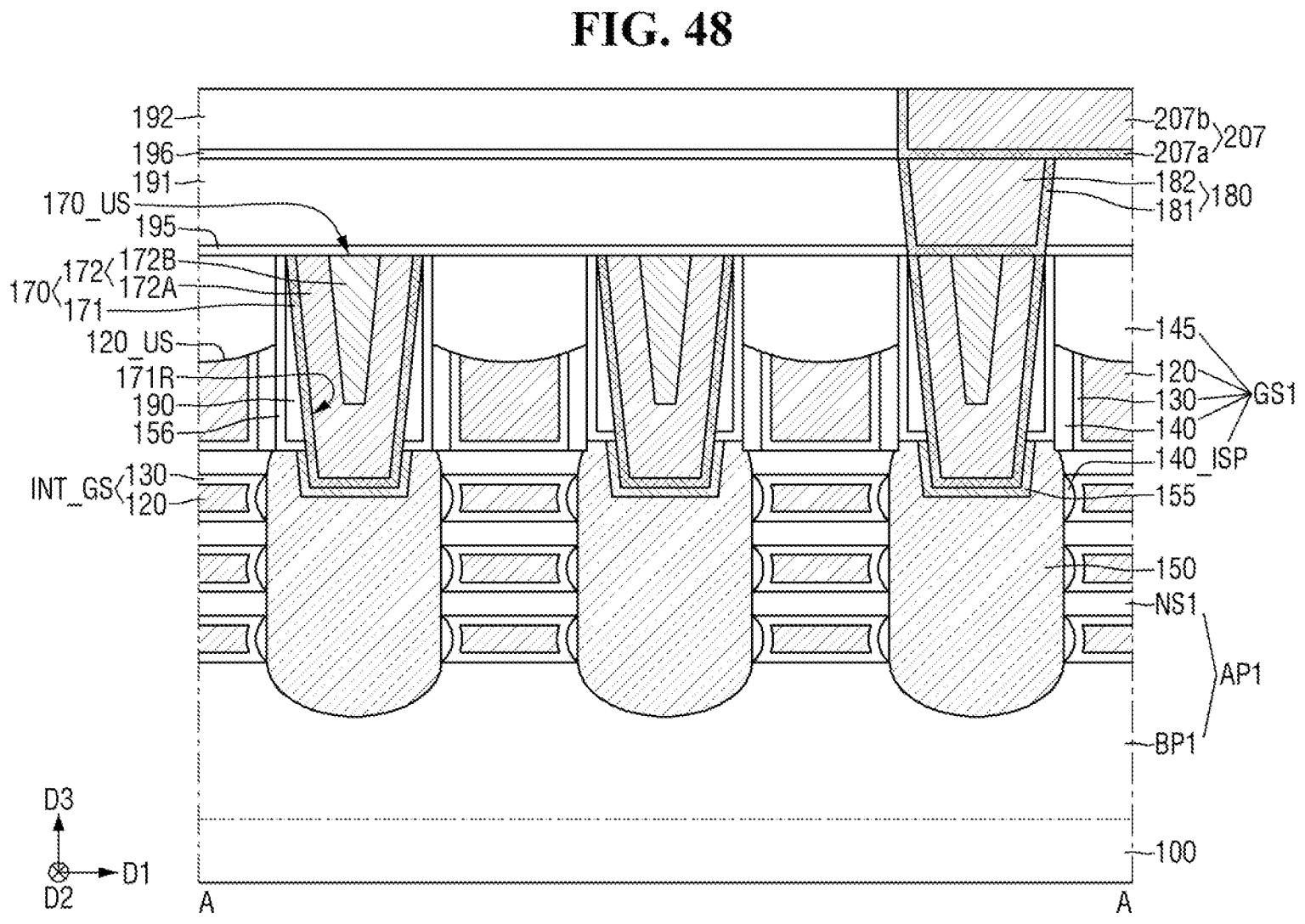

FIGS. 47 and 48 illustrate a semiconductor device according to some embodiments. For simplicity of description, the following description will focus on differences from the description with reference to FIGS. 1 to 5B.

Referring to FIG. 47, in a semiconductor device according to some embodiments, the first source/drain pattern 150 does not include a width extension region.

The width of the first source/drain pattern 150 in the first direction D1 increases and then decreases with increasing distance from the first lower pattern BP1.

Referring to FIG. 48, in a semiconductor device according to some embodiments, the gate structure GS1 further includes a plurality of inner spacers 140_ISP disposed between the first sheet patterns NS1 adjacent in the third direction D3.

The inner spacer 140_ISP is disposed between the inner gate structure INT_GS and the first source/drain pattern 150. Due to the presence of the inner spacer 140_ISP, the inner gate structure INT_GS is not in contact with the first source/drain pattern 150.

The inner spacer 140_ISP include, for example, at least one of silicon nitride (SiN), silicon oxynitride (SiON), silicon oxide (SiO₂), silicon oxynitride (SiOCN), silicon boron nitride (SiBN), silicon oxyboron nitride (SiOBN), silicon oxycarbide (SiOC), or a combination thereof.

FIGS. 49 to 52 illustrate a semiconductor device according to some embodiments. For simplicity of description, the following description will focus on differences from the description with reference to FIGS. 1 to 5B.

Figure 49:
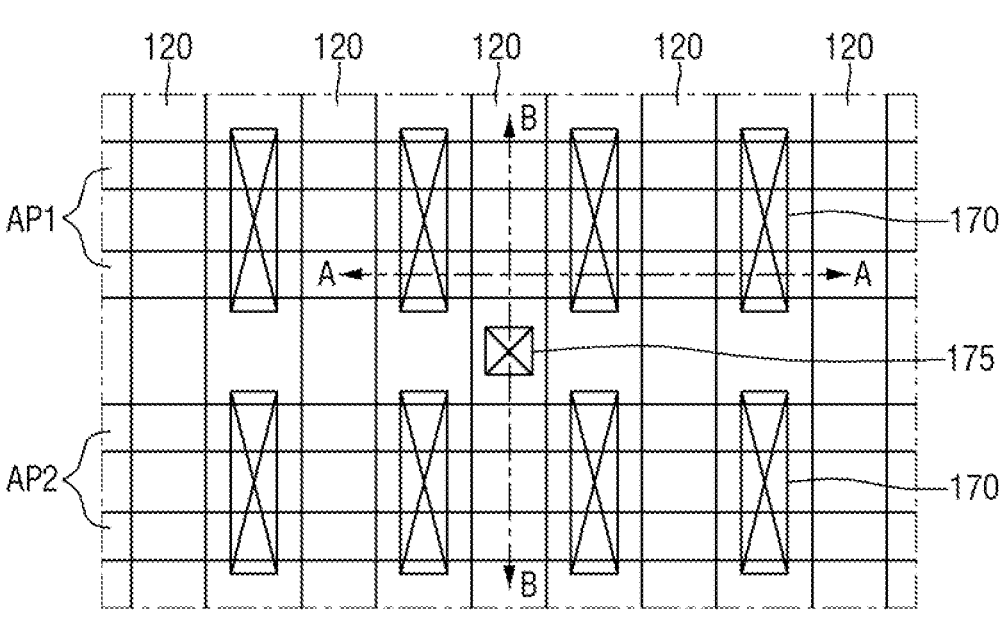
FIGS. 49 to 52 illustrate a semiconductor device according to some embodiments.
Figure 49:
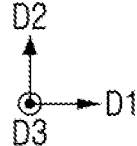
Figure 50:
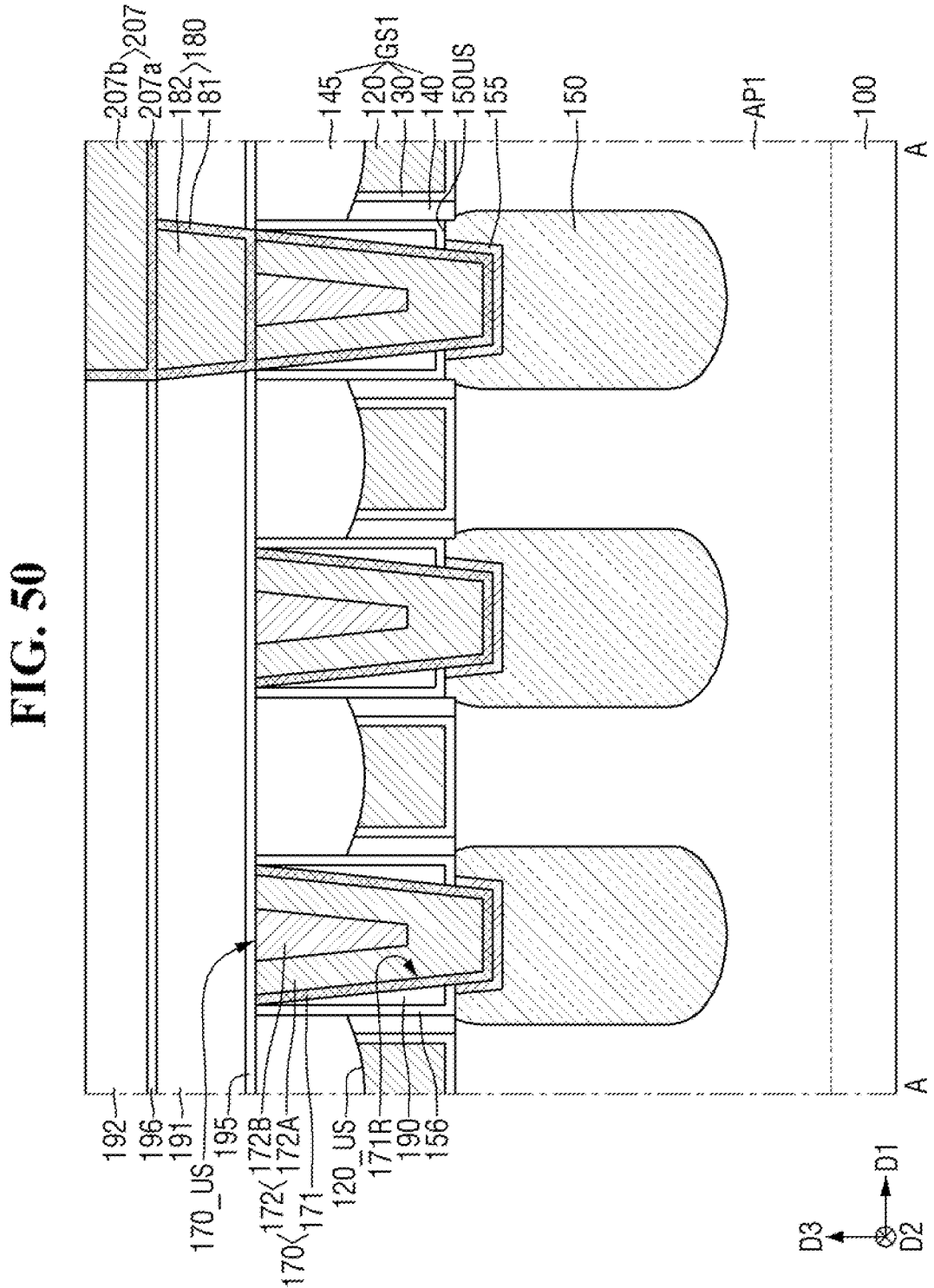
Figure 51:
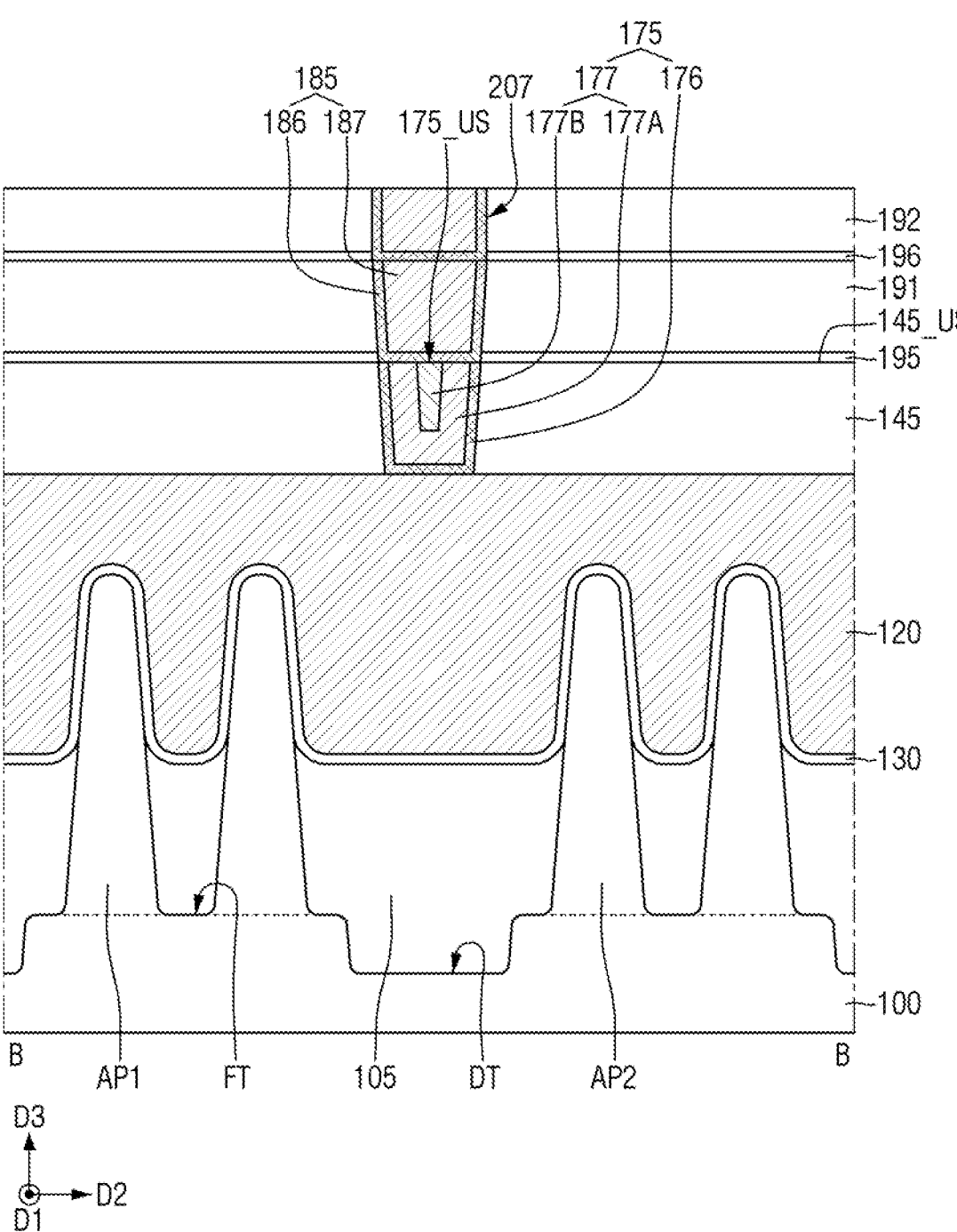
Figure 52:
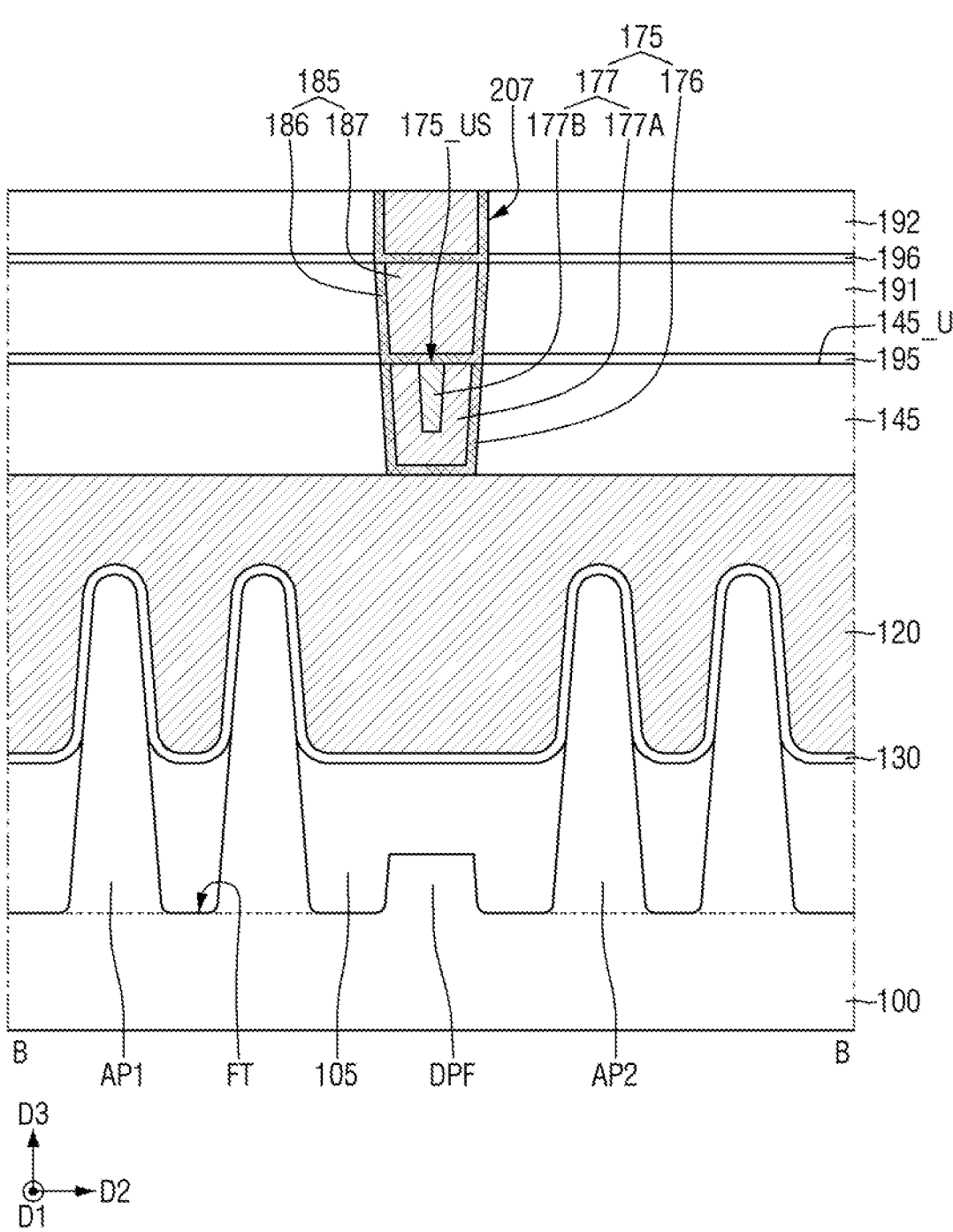

For reference, FIG. 49 is a layout view of a semiconductor device according to some embodiments. FIG. 50 is a cross-sectional view taken along line A-A of FIG. 49. FIGS. 51 and 52 are cross-sectional views taken along line B-B of FIG. 49.

Referring to FIGS. 49 to 52, in a semiconductor device according to some embodiments, each of the first active pattern AP1 and the second active pattern AP2 has a fin-shaped pattern that protrudes above the upper surface of the field insulating layer 105.

FIG. 51 shows that each of the first active pattern AP1 and the second active pattern AP2 is disposed in an active region defined by a deep trench DT. The deep trench DT defines a field region disposed between the active regions.

Although the figures show that two first active patterns AP1 and two second active patterns AP2 are disposed in the active region, embodiments of the present disclosure are not necessarily limited thereto. Each of the first and second active patterns AP1 and AP2 disposed in the active region may be one active pattern, or may include three or more active patterns. The first active patterns AP1 disposed in the active region and the second active patterns AP2 disposed in the active region are each separated by the fin trench FT that extends in the first direction D1.

The field insulating layer 105 fills the deep trench DT.

FIG. 52 shows that a dummy protrusion pattern DPF is disposed in the field region that divides the active region. The deep trench DT (see FIG. 51) is not formed in the field region. The upper surface of the dummy protrusion pattern DPF is covered by the field insulating layer 105.

Each of the first and second active patterns AP1 and AP2 includes, for example, silicon or germanium, which is an elemental semiconductor material. In addition, the first active pattern AP1 and the second active pattern AP2 include a compound semiconductor, such as a group IV-IV compound semiconductor or a group III-V compound semiconductor. For example, the first active pattern AP1 and the second active pattern AP2 include the same material. For another example, the first active pattern AP1 includes a different material from the second active pattern AP2.

When the first active pattern AP1 is disposed in the PMOS formation region and the second active pattern AP2 is disposed in the NMOS formation region, the first active pattern AP1 is a fin-shaped pattern that includes silicon-germanium, and the second active pattern AP2 is a fin-shaped pattern that includes silicon, but embodiments of the present disclosure are not necessarily limited thereto.

The gate structure GS1 does not include the inner gate structure INT_GS (see FIG. 2).

Figure 53:
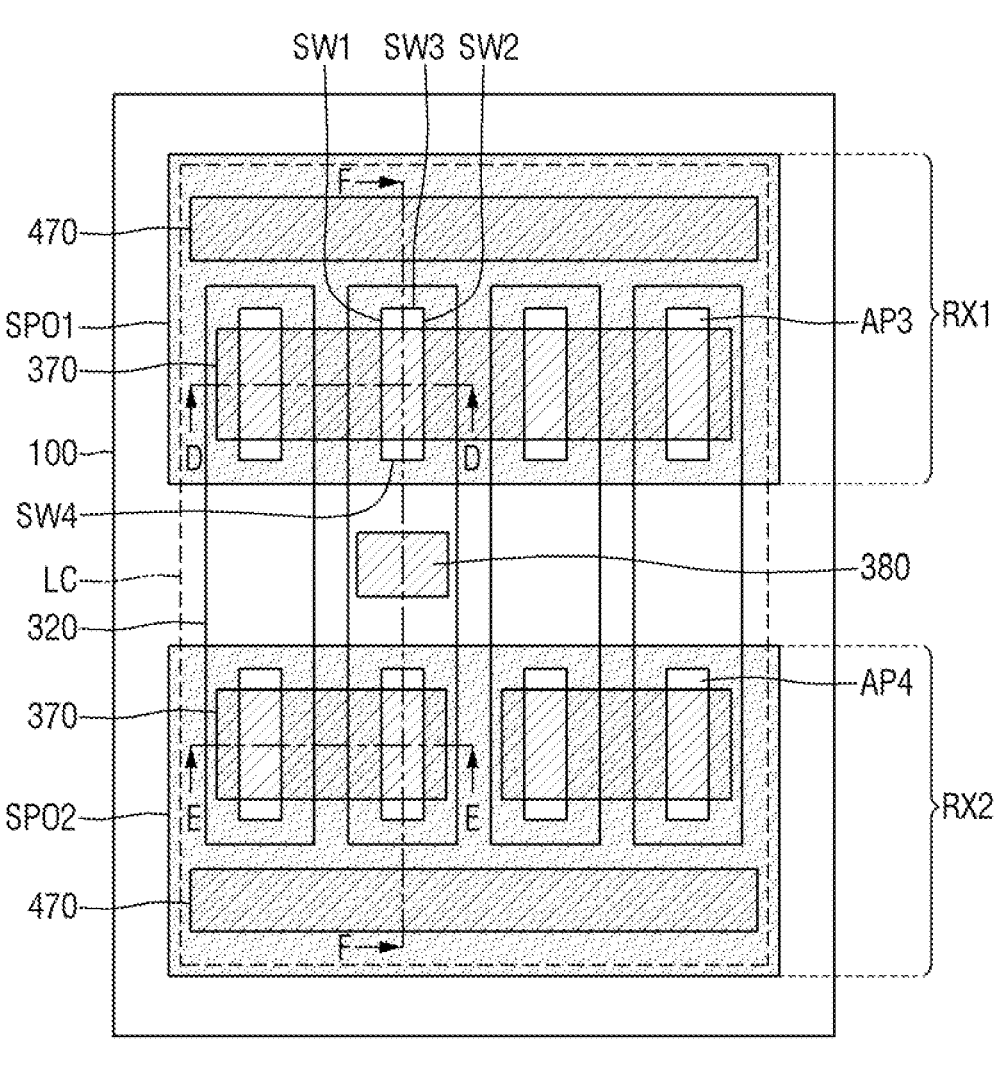
FIGS. 53 to 55 illustrate a semiconductor device according to some embodiments.
Figure 53:
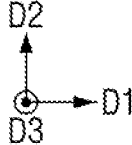
Figure 54:
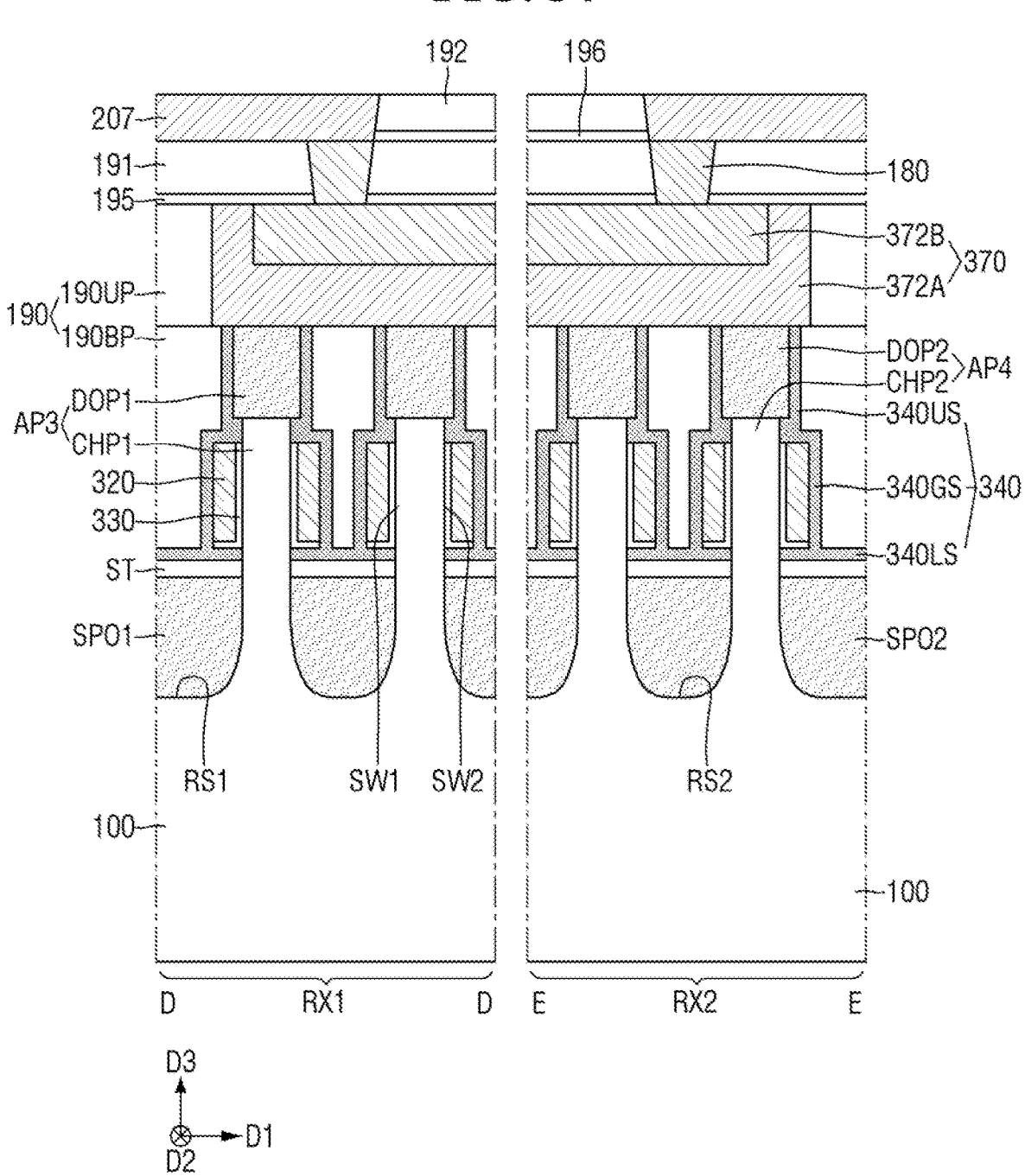
Figure 55:
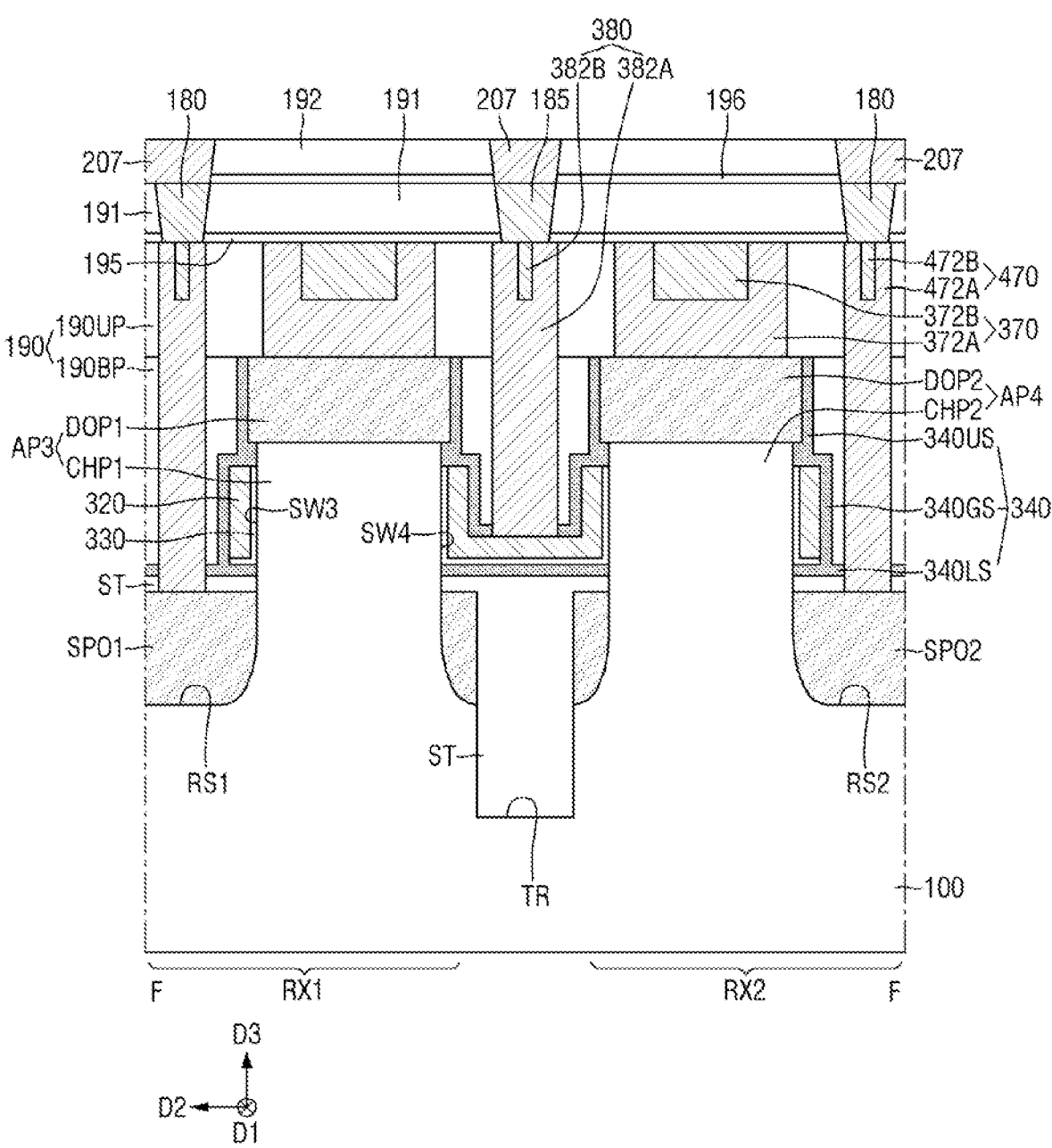

FIGS. 53 to 55 illustrate a semiconductor device according to some embodiments. For reference, FIG. 53 is a plan view of a semiconductor device according to some embodiments. FIG. 54 is a cross-sectional view taken along lines D-D and E-E of FIG. 53. FIG. 55 is a cross-sectional view taken along line F-F of FIG. 53.

Referring to FIGS. 53 to 55, in an embodiment, a logic cell LC is disposed on the substrate 100. The logic cell LC refers to a logic element, such as an inverter, a flip-flop, etc., that performs a specific function. The logic cell LC includes vertical transistors (vertical FETs) that constitute a logic element and wires that connect the vertical transistors to each other.

The logic cell LC on the substrate 100 includes the first active region RX1 and the second active region RX2. For example, the first active region RX1 is a PMOSFET region, and the second active region RX2 is an NMOSFET region. The first and second active regions RX1 and RX2 are defined by the trench TR formed on the substrate 100. The first and second active regions RX1 and RX2 are spaced apart from each other in the second direction D2.

A first lower epitaxial pattern SPO1 is disposed on the first active region RX1, and a second lower epitaxial pattern SPO2 is disposed on the second active region RX2. In a plan view, the first lower epitaxial pattern SPO1 overlaps the first active region RX1, and the second lower epitaxial pattern SPO2 overlaps the second active region RX2. The first and second lower epitaxial patterns SPO1 and SPO2 are formed by a selective epitaxial growth process. The first lower epitaxial pattern SPO1 is formed in a first recess area RS1 of the substrate 100, and the second lower epitaxial pattern SPO2 is formed in a second recess area RS2 of the substrate 100.

Third active patterns AP3 are disposed on the first active region RX1, and fourth active patterns AP4 are disposed on the second active region RX2. Each of the third and fourth active patterns AP3 and AP4 has a fin shape that vertically protrudes. In a plan view, each of the third and fourth active patterns AP3 and AP4 has a bar shape that extends in the second direction D2. The third active patterns AP3 are arranged along the first direction D1, and the fourth active patterns AP4 are arranged along the first direction D1.

Each of the third active patterns AP3 includes a first channel pattern CHP1 that vertically protrudes from the first lower epitaxial pattern SPO1 and a first upper epitaxial pattern DOP1 disposed on the first channel pattern CHP1.

Each of the fourth active patterns AP4 includes a second channel pattern CHP2 that vertically protrudes from the second lower epitaxial pattern SPO2 and a second upper epitaxial pattern DOP2 disposed on the second channel pattern CHP2.

An element isolation layer ST is disposed on the substrate 100 and fills the trench TR. The element isolation layer ST covers the upper surfaces of the first and second lower epitaxial patterns SPO1 and SPO2. The third and fourth active patterns AP3 and AP4 vertically protrude above the element isolation layer ST.

A plurality of second gate electrodes 320 that extend parallel to each other in the second direction D2 are disposed on the element isolation layer ST. The second gate electrodes 320 are arranged along the first direction D1. The second gate electrode 320 wrap the first channel pattern CHP1 of the third active pattern AP3 and wrap the second channel pattern CHP2 of the fourth active pattern AP4. For example, the first channel pattern CHP1 of the third active pattern AP3 includes first to fourth sidewalls SW1 to SW4. The first and second sidewalls SW1 and SW2 face each other in the first direction D1, and the third and fourth sidewalls SW3 and SW4 face each other in the second direction D2. The second gate electrode 320 is provided on the first to fourth sidewalls SW1 to SW4. For example, the second gate electrode 320 surrounds the first to fourth sidewalls SW1 to SW4. For example, the second gate electrode 320 surrounds the first channel pattern CHP1. Similarly, the second gate electrode 320 surrounds the second channel pattern CHP2.

A second gate insulating layer 330 is interposed between the second gate electrode 320 and each of the first and second channel patterns CHP1 and CHP2. The second gate insulating layer 330 covers the bottom surface of the second gate electrode 320 and the inner wall of the second gate electrode 320. For example, the second gate insulating layer 330 directly covers the first to fourth sidewalls SW1 to SW4 of the third active pattern AP3.

The first and second upper epitaxial patterns DOP1 and DOP2 vertically protrude above the second gate electrode 320. The upper surface of the second gate electrode 320 is lower than the bottom surface of each of the first and second upper epitaxial patterns DOP1 and DOP2. For example, each of the third and fourth active patterns AP3 and AP4 has a structure that vertically protrudes from the substrate 100 and penetrates the second gate electrode 320.

A semiconductor device according to some embodiments includes vertical transistors in which carriers move in the third direction D3. For example, when a voltage is applied to the second gate electrode 320 and the transistor is "on", carriers move from the lower epitaxial patterns SPO1 and SPO2 to the upper epitaxial patterns DOP1 and DOP2 through the channel patterns CHP1 and CHP2. In the semiconductor device according to some embodiments, the second gate electrode 320 may completely surround the sidewalls SW1 to SW4 of the channel patterns CHP1 and CHP2. A transistor according to embodiments of the present disclosure is a three-dimensional field effect transistor, such as a VFET, that has a gate all around structure. Since the gate surrounds the channel, a semiconductor device according to some embodiments has excellent electrical characteristics.

A spacer 340 that covers the second gate electrodes 320 and the third and fourth active patterns AP3 and AP4 is disposed on the element isolation layer ST. The spacer 340 includes a silicon nitride layer or a silicon oxynitride layer. The spacer 340 includes a lower spacer 340LS, an upper spacer 340US, and a second gate spacer 340GS between the lower and upper spacers 340LS and 340US.

The lower spacer 340LS directly covers the upper surface of the element isolation layer ST. The second gate electrodes 320 are spaced apart from the element isolation layer ST in the third direction D3 by the lower spacer 340LS. The second gate spacer 340GS covers the upper surface and the outer wall of each of the second gate electrodes 320. The upper spacer 340 covers the first and second upper epitaxial patterns DOP1 and DOP2. However, the upper spacer 340US do not cover the upper surfaces of the first and second upper epitaxial patterns DOP1 and DOP2, and expose the upper surfaces of the first and second upper epitaxial patterns DOP1 and DOP2.

A first lower interlayer insulating layer 190BP is disposed on the spacer 340. The upper surface of the first lower interlayer insulating layer 190BP is substantially coplanar with the upper surfaces of the first and second upper epitaxial patterns DOP1 and DOP2. A first upper interlayer insulating layer 190UP, the first etch stop layer 195, the second interlayer insulating layer 191, the second etch stop layer 196, and the third interlayer insulating layer 192 are sequentially stacked on the first lower interlayer insulating layer 190BP. The first lower interlayer insulating layer 190BP and the first upper interlayer insulating layer 190UP are included in the first interlayer insulating layer 190. The first upper interlayer insulating layer 190UP covers the upper surfaces of the first and second upper epitaxial patterns DOP1 and DOP2.

At least one first vertical source/drain contact 370 is disposed that penetrates the first upper interlayer insulating layer 190UP and connects to the first and second upper epitaxial patterns DOP1 and DOP2. At least one second vertical source/drain contact 470 is disposed that sequentially penetrates the first interlayer insulating layer 190, the lower spacer 340LS, and the element isolation layer ST and that connects to the first and second lower epitaxial patterns SPO1 and SPO2. A vertical gate contact 380 is disposed that sequentially penetrates the first upper interlayer insulating layer 190UP, the first lower interlayer insulating layer 190BP, and the second gate spacer 340GS and that connects to the second gate electrode 320.

The first etch stop layer 195, the second interlayer insulating layer 191, and the second etch stop layer 196 are disposed between the first upper interlayer insulating layer 190UP and the third interlayer insulating layer 192.

The source/drain via plug 180 and the gate via plug 185 are disposed in the first etch stop layer 195 and the second interlayer insulating layer 191. The wiring line 207 is provided in the third interlayer insulating layer 192 and the second etch stop layer 196. Although the figures show that the source/drain via plug 180, the gate via plug 185, and the wiring line 207 are a single layer, this is for simplicity of description and embodiments of the present disclosure are not necessarily limited thereto.

The first vertical source/drain contact 370 includes a first vertical contact molybdenum pattern 372A and a first vertical contact tungsten pattern 372B. The second vertical source/drain contact 470 includes a second vertical contact molybdenum pattern 472A and a second vertical contact tungsten pattern 472B. The vertical gate contact 380 includes a third vertical contact molybdenum pattern 382A and a third vertical contact tungsten pattern 382B.

The figures show that the first vertical source/drain contact 370, the second vertical source/drain contact 470, and the vertical gate contact 380 do not include the contact barrier pattern, but embodiments are not necessarily limited thereto. For example, in some embodiments, the first vertical source/drain contact 370, the second vertical source/drain contact 470, and the vertical gate contact 380 include the contact barrier patterns 171 and 176 as shown in FIGS. 1 to 5B. In some embodiments, the first vertical source/drain contact 370, the second vertical source/drain contact 470, and the vertical gate contact 380 include the contact barrier pattern 171 as shown in FIG. 17 or 23.

However, in some embodiments, the source/drain via plug 180 and the gate via plug 185 have the same shapes as those of the source/drain via plug 180 and the gate via plug 185 described with reference to FIGS. 33 to 38.

FIGS. 56 to 60 illustrate intermediate steps of a method of fabricating a semiconductor device according to some embodiments.

Figure 56:
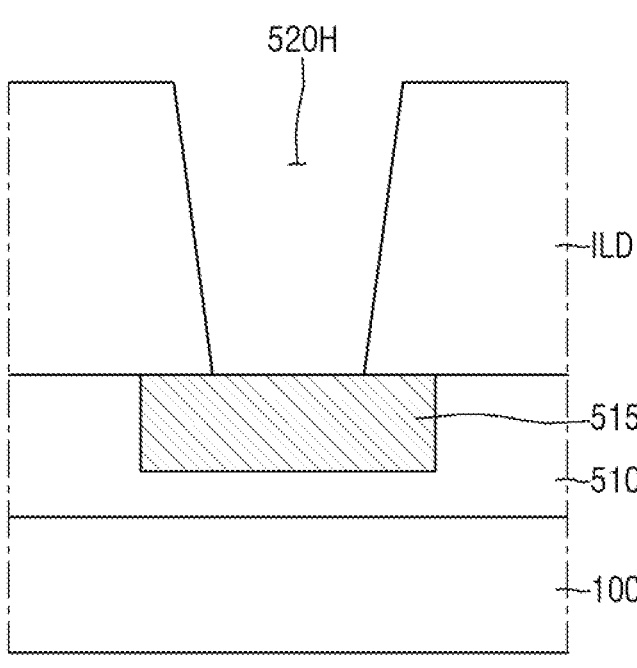
FIGS. 56 to 60 illustrate intermediate steps of a method for fabricating a semiconductor device according to some embodiments.

Referring to FIG. 56, in an embodiment, a lower conductive pattern 515 is formed on the substrate 100.

The lower conductive pattern 515 is formed in a lower structure 510. For example, the lower structure 510 includes a semiconductor pattern formed of a semiconductor material. For another example, the lower structure 510 includes an insulating layer formed of an insulating material.

For example, the lower conductive pattern 515 is a source/drain pattern doped with impurities. For another example, the lower conductive pattern 515 is a gate electrode. For another example, the lower conductive pattern 515 is a contact plug. For another example, the lower conductive pattern 515 is a wiring line formed in a back end of line (BEOL) process. However, the above-described examples of the lower conductive pattern 515 are exemplary, and embodiments of the present disclosure are not necessarily limited thereto.

An interlayer insulating layer ILD is formed on the lower conductive pattern 515. The interlayer insulating layer ILD includes a plug hole 520H. The plug hole 520H exposes at least a part of the lower conductive pattern 515.

Figure 57:
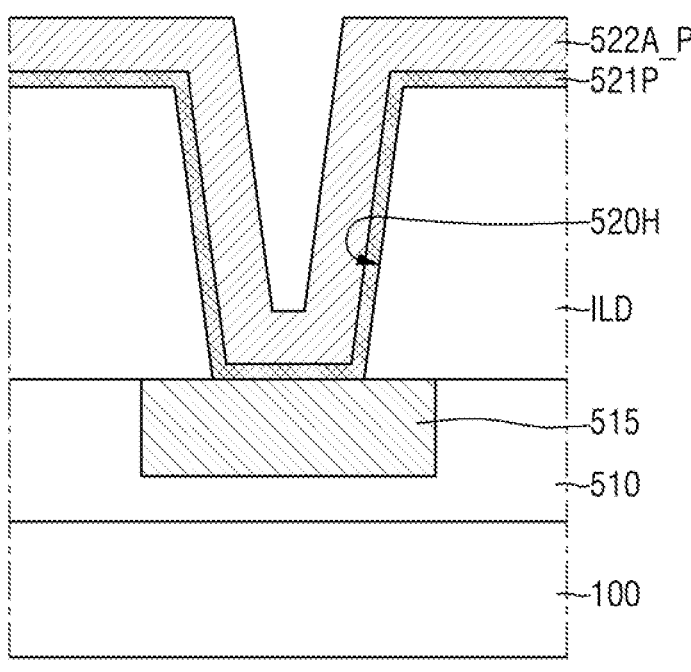
Figure 58:
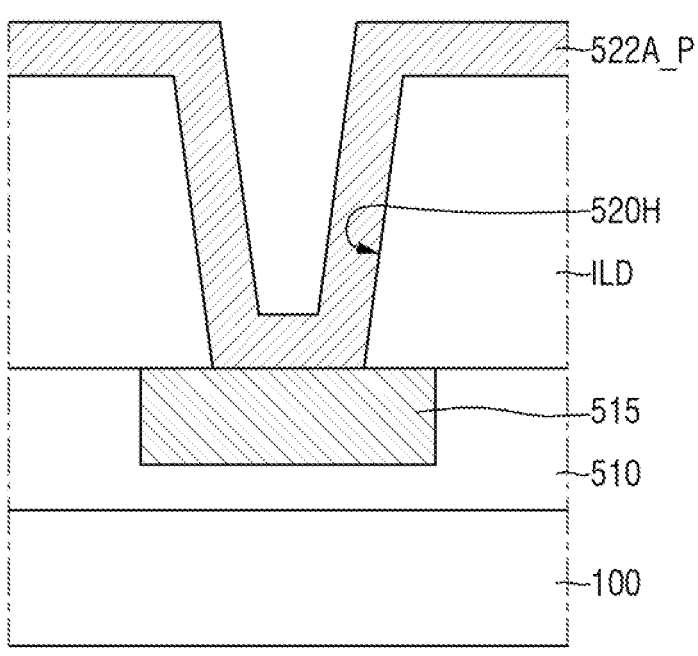

Referring to FIGS. 57 and 58, in some embodiments, a free molybdenum layer 522A_P is formed along the sidewall and bottom surface of the plug hole 520H. The free molybdenum layer 522A_P extends along the upper surface of the interlayer insulating layer ILD.

The free molybdenum layer 522A_P includes molybdenum. The free molybdenum layer 522A_P is formed using, for example, a chemical vapor deposition (CVD) method, but embodiments are not necessarily limited thereto. The chemical vapor deposition method may include a selective chemical vapor deposition method.

In FIG. 57, in an embodiment, before the free molybdenum layer 522A_P is formed, a free barrier layer 521P is formed along the sidewall and the bottom surface of the plug hole 520H. The free barrier layer 521P extends along the upper surface of the interlayer insulating layer ILD. The free molybdenum layer 522A_P is formed on the free barrier layer 521P.

In FIG. 58, in an embodiment, the free molybdenum layer 522A_P is formed without the free barrier layer 521P. The free molybdenum layer 522A_P is in contact with the interlayer insulating layer ILD.

The following fabricating method will be described with reference to FIG. 57.

Figure 59:
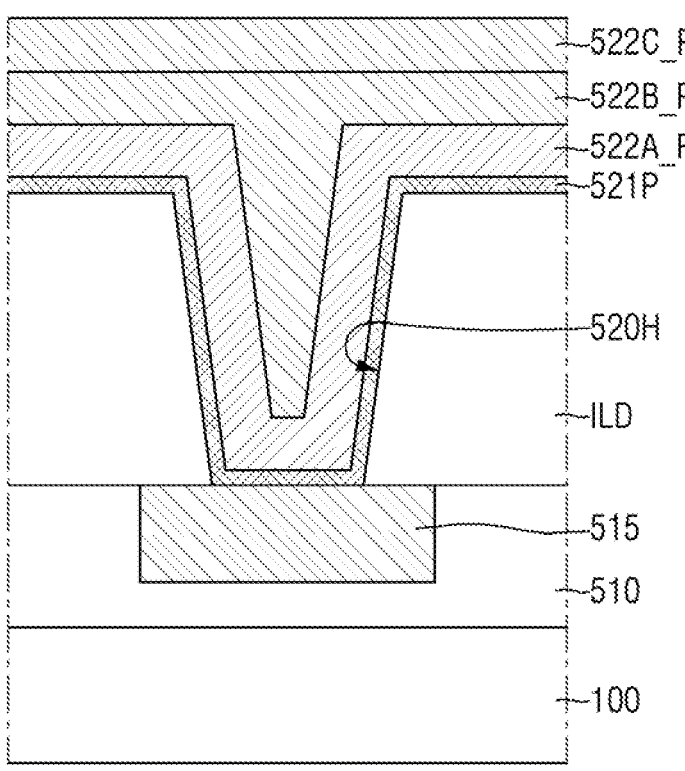

Referring to FIG. 59, in an embodiment, a first free tungsten layer 522B_P is formed on the free molybdenum layer 522A_P using a first deposition method.

The first free tungsten layer 522B_P fills the plug hole 520H that remains after the free molybdenum layer 522A_P is formed.

The first free tungsten layer 522B_P includes tungsten. The first deposition method is one of, for example, an atomic layer deposition (ALD) method or a chemical vapor deposition method. In a method for fabricating a semiconductor device according to some embodiments, the first deposition method is a atomic layer deposition method.

A second free tungsten layer 522C_P is formed on the first free tungsten layer 522B_P. The second free tungsten layer 522C_P is formed using a second deposition method that differs from the first deposition method. The second deposition method is one of, for example, a physical vapor deposition (PVD) method or a chemical vapor deposition method. In a method for fabricating a semiconductor device according to some embodiments, the second deposition method is a physical vapor deposition method.

Figure 60:
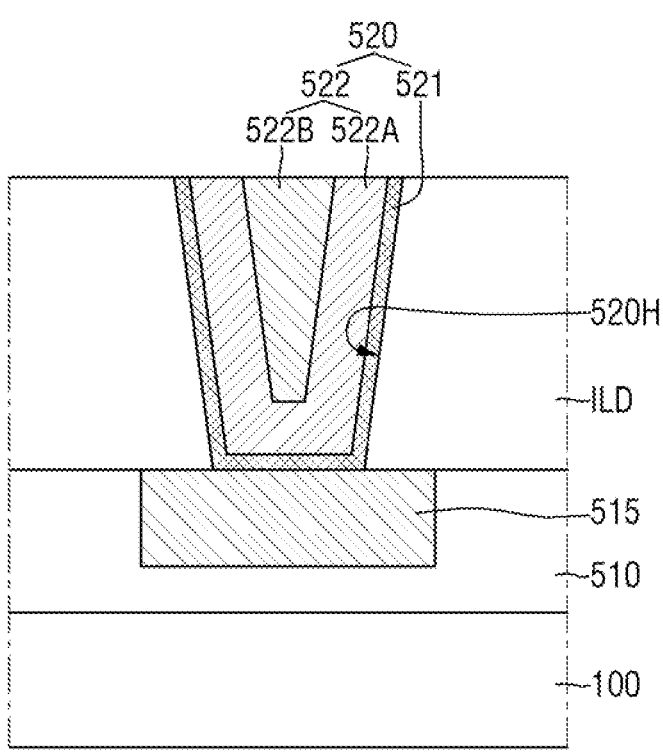

Referring to FIG. 60, in an embodiment, the second free tungsten layer 522C_P, the first free tungsten layer 522B_P, the free molybdenum layer 522A_P, and the free barrier layer 521P on the upper surface of the interlayer insulating layer ILD are removed to form a plug pattern 520 in the plug hole 520H. The plug pattern 520 is connected to the lower conductive pattern 515.

For example, the second free tungsten layer 522C_P, the first free tungsten layer 522B_P, the free molybdenum layer 522A_P, and the free barrier layer 521P on the upper surface of the interlayer insulating layer ILD are removed using a chemical mechanical polishing (CMP) process.

The plug pattern 520 includes a plug barrier pattern 521 and a plug metal pattern 522. The plug metal pattern 522 includes a plug molybdenum pattern 522A and a plug tungsten pattern 522B.

Using an above-described method of fabricating the plug pattern 520, the source/drain contact 170 (see FIG. 2), the gate contact 175 (see FIG. 3), the source/drain via plug 180 (see FIG. 33), and the gate via plug 185 (see FIG. 34) described above can be fabricated.

FIGS. 61 to 64 illustrate intermediate steps of a method of fabricating a semiconductor device according to some embodiments.

Figure 61:
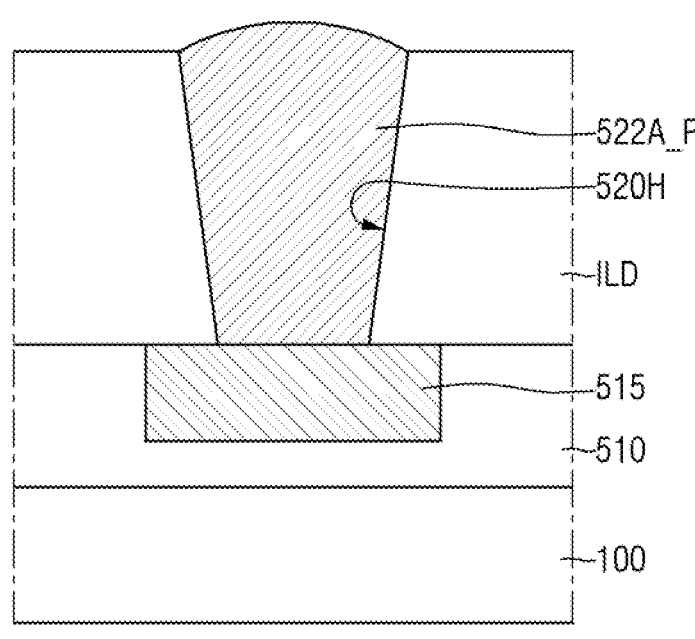
FIGS. 61 to 64 illustrate intermediate steps of a method for fabricating a semiconductor device according to some embodiments.
Figure 62:
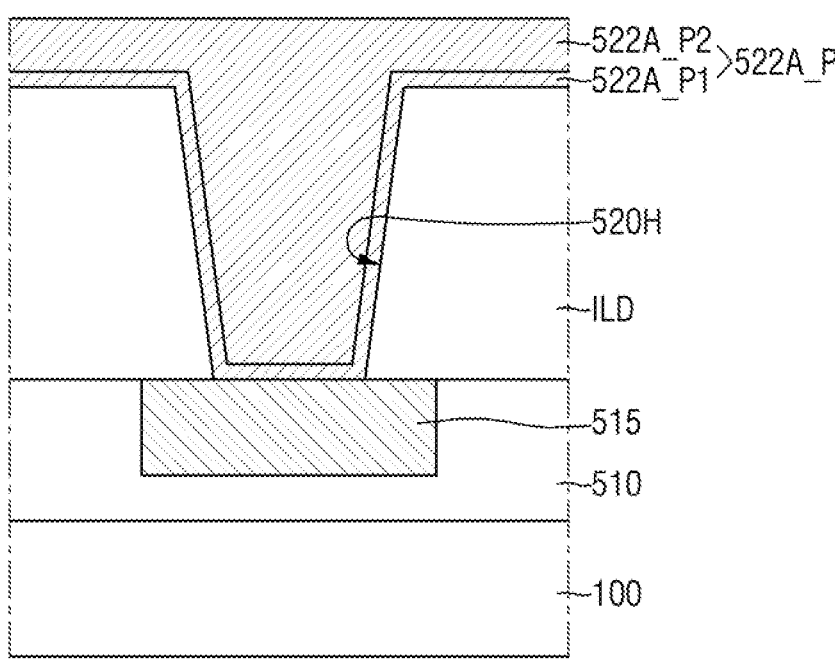

Referring to FIGS. 61 and 62, in some embodiments, the free molybdenum layer 522A_P is formed in the plug hole 520H.

The free molybdenum layer 522A_P fills the entire plug hole 520H. The free molybdenum layer 522A_P is in contact with the interlayer insulating layer ILD.

In FIG. 61, in an embodiment, the free molybdenum layer 522A_P is formed using a selective chemical vapor deposition method. FIG. 61 shows the upper surface of the free molybdenum layer 522A_P as being a convex curved surface, but embodiments are not necessarily limited thereto.

In FIG. 62, in an embodiment, forming the free molybdenum layer 522A_P includes forming a first free molybdenum layer 522A_P1 and forming a second free molybdenum layer 522A_P2.

The first free molybdenum layer 522A_P1 is formed along the sidewall and the bottom surface of the plug hole 520H. The first free molybdenum layer 522A_P1 can be formed along the upper surface of the interlayer insulating layer ILD. The first free molybdenum layer 522A_P1 is formed using, for example, an atomic layer deposition method, but embodiments are not necessarily limited thereto.

The second free molybdenum layer 522A_P2 is formed on the first free molybdenum layer 522A_P1. The second free molybdenum layer 522A_P2 fills the entire plug hole 520H. The second free molybdenum layer 522A_P2 can be formed using, for example, a chemical vapor deposition method, but embodiments are not necessarily limited thereto. A method of forming the second free molybdenum layer 522A_P2 differs from a method of forming the first free molybdenum layer 522A_P1.

The following fabricating method will be described with reference to FIG. 61.

Figure 63:
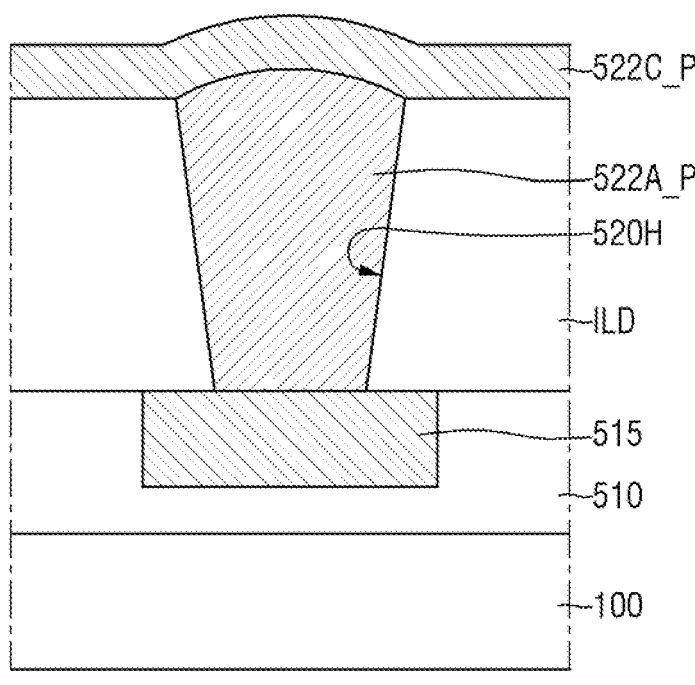

Referring to FIG. 63, in an embodiment, the second free tungsten layer 522C_P is formed along the upper surface of the free molybdenum layer 522A_P and the upper surface of the interlayer insulating layer ILD.

The second free tungsten layer 522C_P can be formed using, for example, one of a physical vapor deposition method, a chemical vapor deposition method, or an atomic layer deposition method. In a method of fabricating a semiconductor device according to some embodiments, the second free tungsten layer 522C_P is formed using a physical vapor deposition method.

Figure 64:
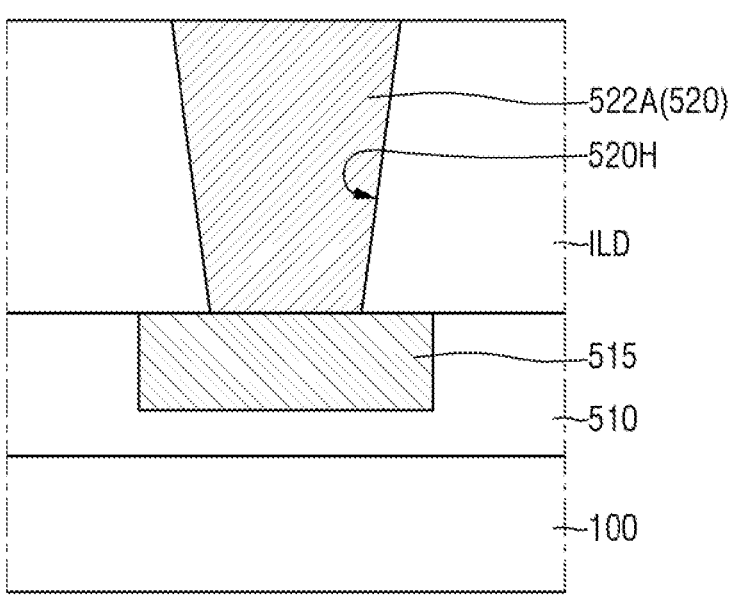

Referring to FIG. 64, in an embodiment, the second free tungsten layer 522C_P and a part of the free molybdenum layer 522A_P are removed to form the plug pattern 520 in the plug hole 520H.

The second free tungsten layer 522C_P and a part of the free molybdenum layer 522A_P are removed using, for example, a chemical mechanical polishing (CMP) process. The plug pattern 520 is the plug molybdenum pattern 522A.

Although FIG. 64 shows that the upper surface of the plug molybdenum pattern 522A is flat, embodiments of the present disclosure are not necessarily limited thereto. For example, in an embodiment, the upper surface of the plug molybdenum pattern 522A is a convex curved surface. For another example, the upper surface of the plug molybdenum pattern 522A is a concave curved surface. For another example, the upper surface of the plug molybdenum pattern 522A has a shape as shown in FIG. 26A or FIG. 40.

In concluding the detailed description, those skilled in the art will appreciate that many variations and modifications can be made to embodiments without substantially departing from the principles of the present inventive concept. Therefore, disclosed embodiments of the invention are used in a generic and descriptive sense only and not for purposes of limitation.

What is claimed is:

1. A semiconductor device, comprising:
a lower conductive pattern disposed on a substrate;
an upper conductive pattern disposed on the lower conductive pattern; and
a first plug pattern disposed between the lower conductive pattern and the upper conductive pattern and that is connected to the lower conductive pattern and the upper conductive pattern,
wherein the first plug pattern includes a first barrier pattern that defines a first plug recess and a first plug metal pattern that fills the first plug recess,
the first plug metal pattern includes a first molybdenum pattern and a first tungsten pattern disposed on the first molybdenum pattern,
the upper conductive pattern is a second plug pattern,
the second plug pattern comprises a second molybdenum pattern and a second tungsten pattern disposed on the second molybdenum pattern, and
a ratio of a height of the second tungsten pattern to a height of the second plug pattern is greater than or equal to a ratio of a height of the first tungsten pattern to a height of the first plug pattern.

2. The semiconductor device of claim 1, further comprising a gate electrode disposed on the substrate,
wherein the lower conductive pattern is a source/drain pattern disposed on a side surface of the gate electrode, and a lowermost portion of the first plug pattern is lower than an upper surface of the gate electrode.

3. The semiconductor device of claim 2, wherein a lowermost portion of the first tungsten pattern is higher than the upper surface of the gate electrode.

4. The semiconductor device of claim 1, wherein a height from a lowermost portion of the first tungsten pattern to an upper surface of the first plug pattern is less than or equal to ⅔ of a height of the first plug pattern.

5. The semiconductor device of claim 1, further comprising a gate electrode disposed on the substrate and a source/drain pattern disposed on a side surface of the gate electrode, wherein the upper conductive pattern is a wiring line, and a lowermost portion of the first plug pattern is higher than an upper surface of the source/drain pattern.

6. The semiconductor device of claim 1, wherein a height of the first tungsten pattern is greater than or equal to ½ of a height of the first plug pattern.

7. The semiconductor device of claim 1, wherein an upper surface of the first plug pattern is defined by the first barrier pattern and the first plug metal pattern.

8. The semiconductor device of claim 7, wherein the upper surface of the first plug pattern is defined by the first barrier pattern, the first molybdenum pattern, and the first tungsten pattern.

9. The semiconductor device of claim 7, wherein the upper surface of the first plug pattern is defined by the first barrier pattern and the first tungsten pattern.

10. The semiconductor device of claim 1, wherein the first plug metal pattern covers an upper surface of the first barrier pattern.

11. A semiconductor device, comprising:

a gate structure that includes a gate electrode and a gate capping pattern disposed on an active pattern, wherein the gate capping pattern is disposed on the gate electrode;

a source/drain pattern disposed on at least one side of the gate structure; and a source/drain contact connected to the source/drain pattern and disposed on the source/drain pattern and that has a first height, wherein the source/drain contact includes a first molybdenum pattern and a first tungsten pattern on the first molybdenum pattern, and a second height from a lowermost portion of the first molybdenum pattern to a lowermost portion of the first tungsten pattern is greater than or equal to ⅓ of the first height.

12. The semiconductor device of claim 11, wherein the source/drain contact further includes a barrier pattern that defines a plug recess, and the first molybdenum pattern and the first tungsten pattern fill the plug recess.

13. The semiconductor device of claim 11, wherein the source/drain contact further includes a barrier pattern disposed between the first molybdenum pattern and the first tungsten pattern.

14. The semiconductor device of claim 11, further comprising a gate contact disposed in the gate capping pattern and connected to the gate electrode, wherein the gate contact includes a second molybdenum pattern and a second tungsten pattern disposed on the second molybdenum pattern.

15. A semiconductor device, comprising:

an active pattern that includes a lower pattern and a sheet pattern disposed on the lower pattern;

a gate structure that includes a gate electrode and a gate capping pattern disposed on the active pattern, wherein the gate electrode surrounds the sheet pattern and the gate capping pattern is disposed on the gate electrode;

a source/drain pattern disposed on at least one side of the gate structure;

a source/drain contact connected to the source/drain pattern and disposed on the source/drain pattern; and a gate contact that penetrates the gate capping pattern and is connected to the gate electrode, wherein the source/drain contact includes a first molybdenum pattern and a first tungsten pattern disposed on the first molybdenum pattern, a lowermost portion of the first tungsten pattern is higher than an upper surface of the gate electrode, wherein the gate contact includes a second molybdenum pattern and a second tungsten pattern disposed on the second molybdenum pattern, and wherein a height from a lowermost portion of the second molybdenum pattern to a lowermost portion of the second tungsten pattern is greater than or equal to ⅓ of a height of the gate contact.

16. The semiconductor device of claim 15, wherein the gate contact includes a barrier pattern that defines a plug recess and a plug metal pattern that fills the plug recess, and the plug metal pattern is one of a second molybdenum pattern or a second tungsten pattern.

* * * * *